US009882352B2

(12) United States Patent
Hamaguchi et al.

(10) Patent No.: US 9,882,352 B2
(45) Date of Patent: Jan. 30, 2018

(54) LIGHT EMITTING ELEMENT

(71) Applicant: Sony Corporation, Tokyo (JP)

(72) Inventors: Tatsushi Hamaguchi, Kanagawa (JP);
Noriyuki Futagawa, Kanagawa (JP);
Shoichiro Izumi, Kanagawa (JP);
Masaru Kuramoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/303,344

(22) PCT Filed: Apr. 17, 2015

(86) PCT No.: PCT/JP2015/061808
§ 371 (c)(1),
(2) Date: Oct. 11, 2016

(87) PCT Pub. No.: WO2015/194246
PCT Pub. Date: Dec. 23, 2015

(65) Prior Publication Data
US 2017/0033533 A1    Feb. 2, 2017

(30) Foreign Application Priority Data

Jun. 20, 2014    (JP) ................................ 2014-127218

(51) Int. Cl.
*H01S 5/183*    (2006.01)
*H01S 5/10*    (2006.01)
(Continued)

(52) U.S. Cl.
CPC ............ *H01S 5/183* (2013.01); *H01S 5/1092* (2013.01); *H01S 5/18361* (2013.01);
(Continued)

(58) Field of Classification Search
CPC ...... H01S 5/183; H01S 5/4087; H01S 5/1092; H01S 5/18361; H01S 5/423; H01S 5/0207; H01S 5/18369; G02B 27/48
See application file for complete search history.

(56) References Cited

U.S. PATENT DOCUMENTS 7,141,441 B2 * 11/2006 Koyama ............. H01S 5/18391
438/22
2008/0170595 A1    7/2008 Mun et al.
(Continued)

FOREIGN PATENT DOCUMENTS

JP    2000-294873 A    10/2000
JP    2001-119099 A    4/2001
(Continued)

OTHER PUBLICATIONS

International Search Report (with English translation) mailed Jul. 14, 2015 in international application No. PCT/JP2015/061808 (5 pages).
(Continued)

*Primary Examiner* — Dung Nguyen
(74) *Attorney, Agent, or Firm* — K&L Gates LLP

(57) ABSTRACT

A light emitting element includes at least a first light reflecting layer 41 formed on a surface of a substrate 11, a laminated structural body 20 made of a first compound semiconductor layer 21, an active layer 23 and a second compound semiconductor layer 22 formed on the first light reflecting layer 41, and a second electrode 32 and a second light reflecting layer 42 formed on the second compound semiconductor layer 22, the laminated structural body 20 is configured from a plurality of laminated structural body units 20A, a light emitting element unit 10A is configured from each of the laminated structural body units 20A, and a
(Continued)

resonator length in the light emitting element unit 10A is different in every light emitting element unit.

14 Claims, 29 Drawing Sheets

(51) Int. Cl.
*H01S 5/40* (2006.01)
*G02B 27/48* (2006.01)
*H01S 5/323* (2006.01)
*H01S 5/02* (2006.01)
*H01S 5/42* (2006.01)

(52) U.S. Cl.
CPC ............ *H01S 5/4087* (2013.01); *G02B 27/48* (2013.01); *H01S 5/0207* (2013.01); *H01S 5/18369* (2013.01); *H01S 5/32341* (2013.01); *H01S 5/423* (2013.01); *H01S 2304/04* (2013.01)

(56) References Cited

U.S. PATENT DOCUMENTS

| | | | |
|---|---|---|---|
| 2011/0103420 A1 | 5/2011 | Koda et al. | |
| 2013/0157397 A1* | 6/2013 | Shouji | H01S 5/423 |
| | | | 438/29 |

FOREIGN PATENT DOCUMENTS

| | | |
|---|---|---|
| JP | 2001-521291 A | 11/2001 |
| JP | 2008-177569 A | 7/2008 |
| JP | 2011-096856 A | 5/2011 |
| JP | 2012-222001 A | 11/2012 |
| JP | 2014-154787 A | 8/2014 |

OTHER PUBLICATIONS

Written Opinion mailed Jul. 14, 2015 in international application No. PCT/JP2015/061808 (6 pages).

Higuchi et al., Room-Temperature CW Lasing of a GaN-Based Vertical-Cavity Surface-Emitting Laser by Current Injection, Applied Physics Express, Dec. 5, 2008 (3 pages).

* cited by examiner

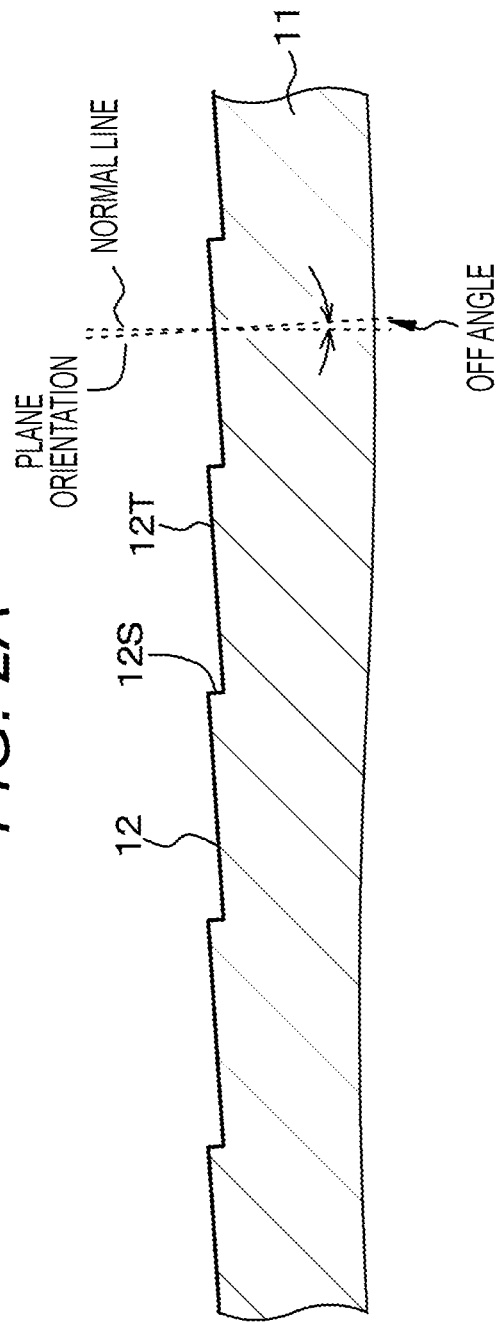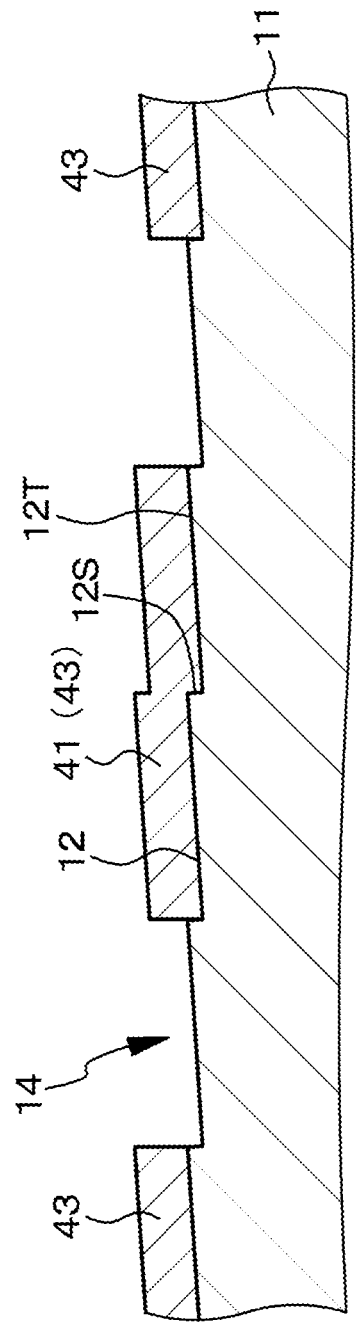

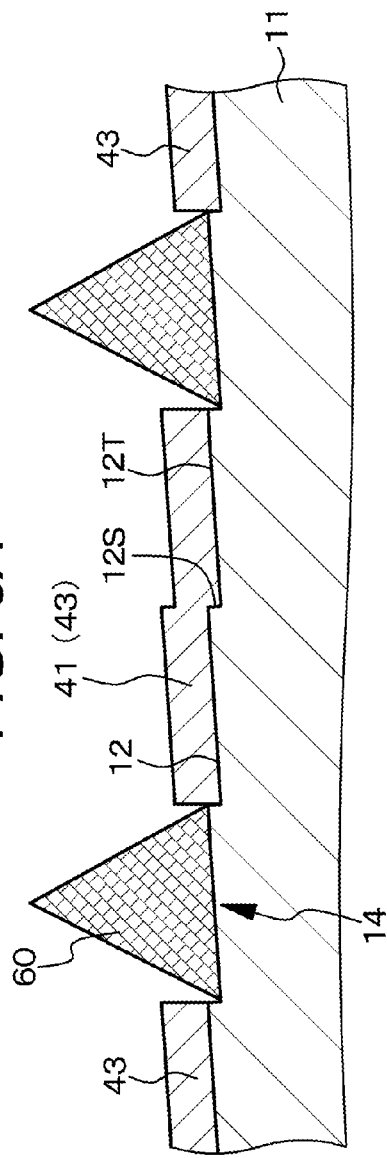
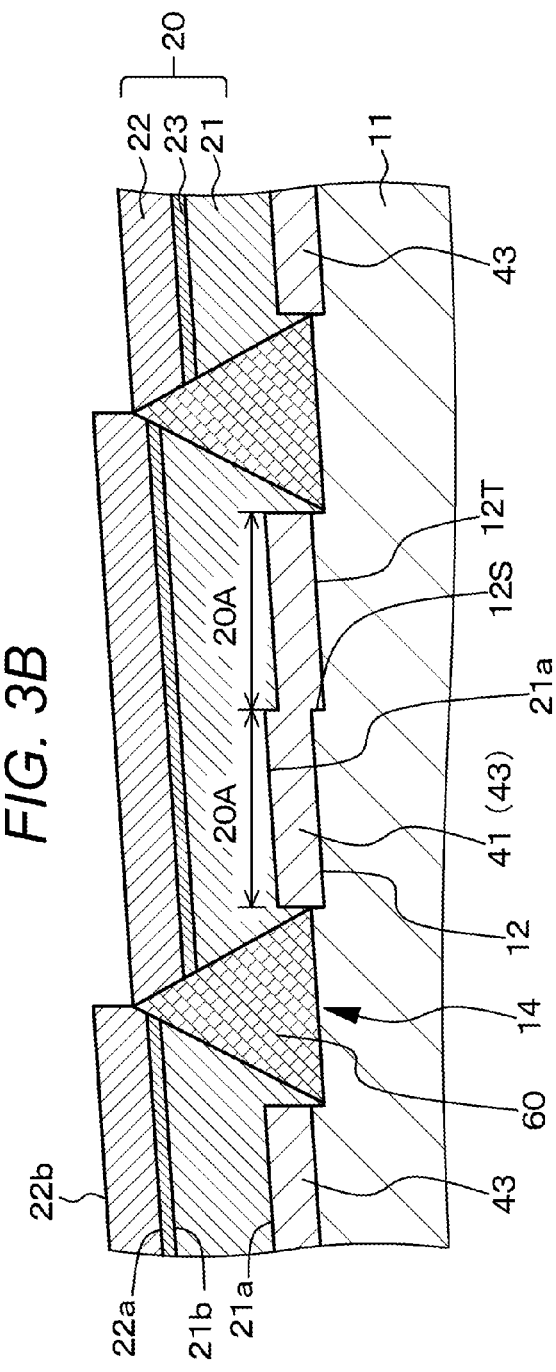

LIGHT EMITTING ELEMENT

CROSS-REFERENCE TO RELATED APPLICATIONS

The present application claims the benefit of International Application No. PCT/JP2015/061808, filed Apr. 17, 2015, which claims priority to Japanese Application No. 2014-127218, filed Jun. 20, 2014, the disclosures of which are incorporated herein by reference.

TECHNICAL FIELD

The present invention relates to a light emitting element (to be specific, a vertical resonator laser or a surface emitting laser element called VCSEL).

BACKGROUND ART

In a surface emitting laser element, typically, laser oscillation occurs by causing light to resonate between two light reflecting layers (distributed bragg reflector layers (DBR layers)). Then, conventionally, the surface emitting laser element is configured from an InGaAsP-based compound semiconductor material, and output light is red light to infrared light, and is used for optical communication or as a light source of a laser printer. However, in recent years, a surface emitting laser element using a nitride-based compound semiconductor has been announced (for example, see Applied Phys Express 2008 121102), and study of image display devices using the surface emitting laser element has been diligently in progress.

CITATION LIST

Non-Patent Document

Non-Patent Document 1: Applied Phys Express 2008 121102

SUMMARY OF THE INVENTION

Problems to be Solved by the Invention

By the way, in the surface emitting laser element, to obtain a net gain with a short resonator length and a small active layer volume, reflectance of a reflecting mirror is sometimes set to about 99%, or set to be higher than 99%. As a result, a spectral width of laser light easily becomes narrower than that of an edge emitting semiconductor laser element. Then, in such laser light with a narrow spectral width, coherence of light becomes high, and there is a problem of occurrence of an interference pattern (speckle noise) caused by unevenness of a screen in a case of using the laser light as a light source of an image display device.

Therefore, an objective of the present disclosure is to provide a light emitting element having a configuration and a structure in which speckle noise is less likely to occur.

Solutions to Problems

A light emitting element according to a first aspect or a second aspect of the present disclosure for achieving the above-described objective is a light emitting element including at least:

a first light reflecting layer formed on a surface of a substrate, a laminated structural body made of a first compound semiconductor layer, an active layer, and a second compound semiconductor layer formed on the first light reflecting layer, and a second electrode and a second light reflecting layer formed on the second compound semiconductor layer.

Then, in the light emitting element according to the first aspect of the present disclosure, the laminated structural body is configured from a plurality of laminated structural body units, a light emitting element unit is configured from each of the laminated structural body units, and a resonator length in the light emitting element unit is different in every light emitting element unit (that is, the thickness of the laminated structural body unit is different in every light emitting element unit).

Further, in the light emitting element according to the second aspect of the present disclosure, the resonator length is smoothly changed in the light emitting element (that is, the thickness of the laminated structural body is smoothly changed).

Effects of the Invention

In the light emitting element according to the first aspect or the second aspect of the present disclosure, the light emitting element has a plurality of the resonator lengths. Therefore, as a result of occurrence of resonance in a plurality of vertical modes, one vertical mode with a widened width can be apparently obtained, that is, the spectral width of emitted light can be widened, and occurrence of the speckle noise can be suppressed. Note that the effects described in the present specification are merely examples and are not limited, and additional effects may be exhibited.

BRIEF DESCRIPTION OF DRAWINGS

FIGS. 2A and 2B are schematic partial end views of a substrate and the like for describing a method of manufacturing the light emitting element of the first embodiment.

FIGS. 3A and 3B are schematic partial end views of the substrate and the like for describing the method of manufacturing the light emitting element of the first embodiment, following FIG. 2B.

MODE FOR CARRYING OUT THE INVENTION

Figure 1:
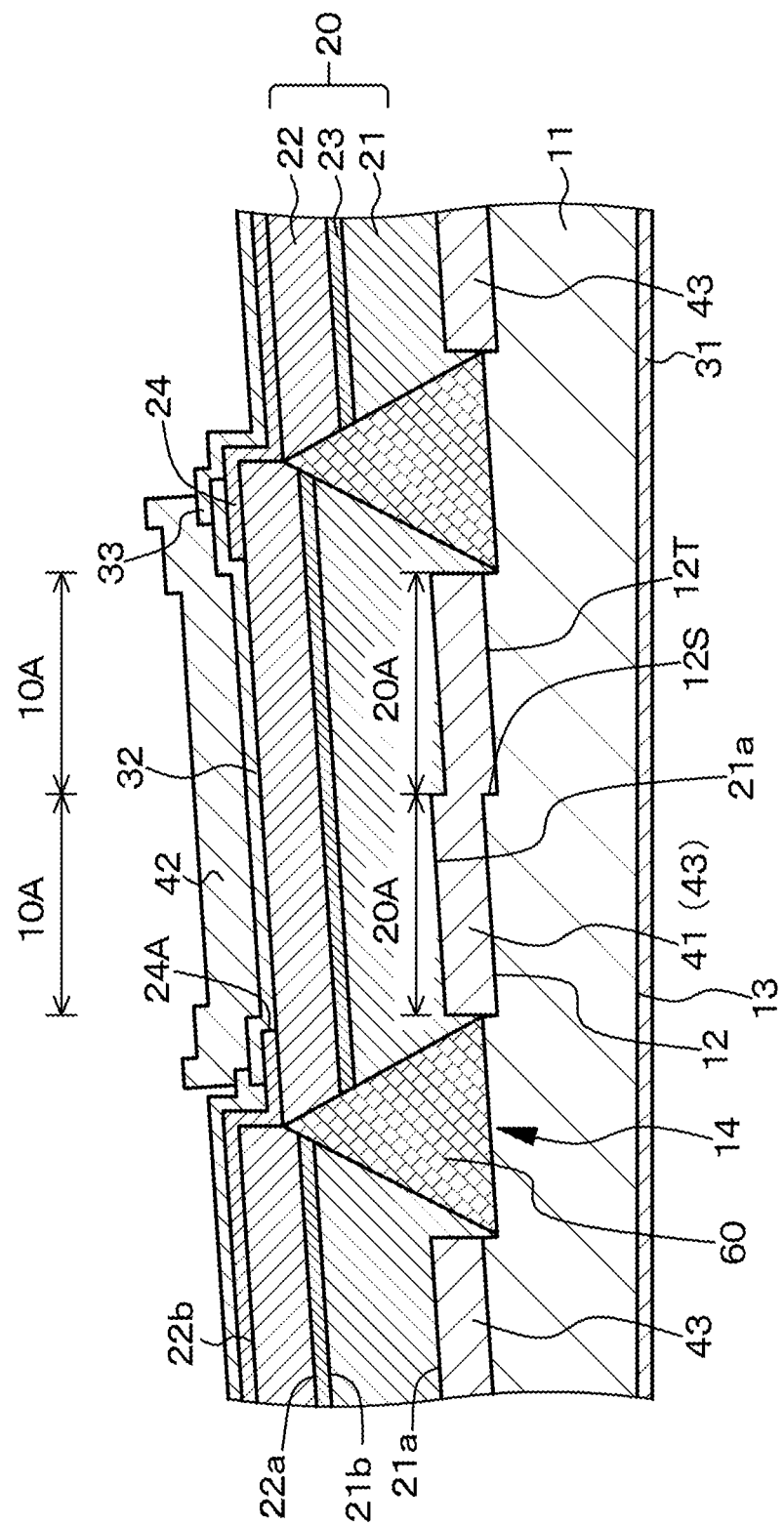
FIG. 1 is a schematic partial sectional view of a light emitting element of a first embodiment.
Figure 4:
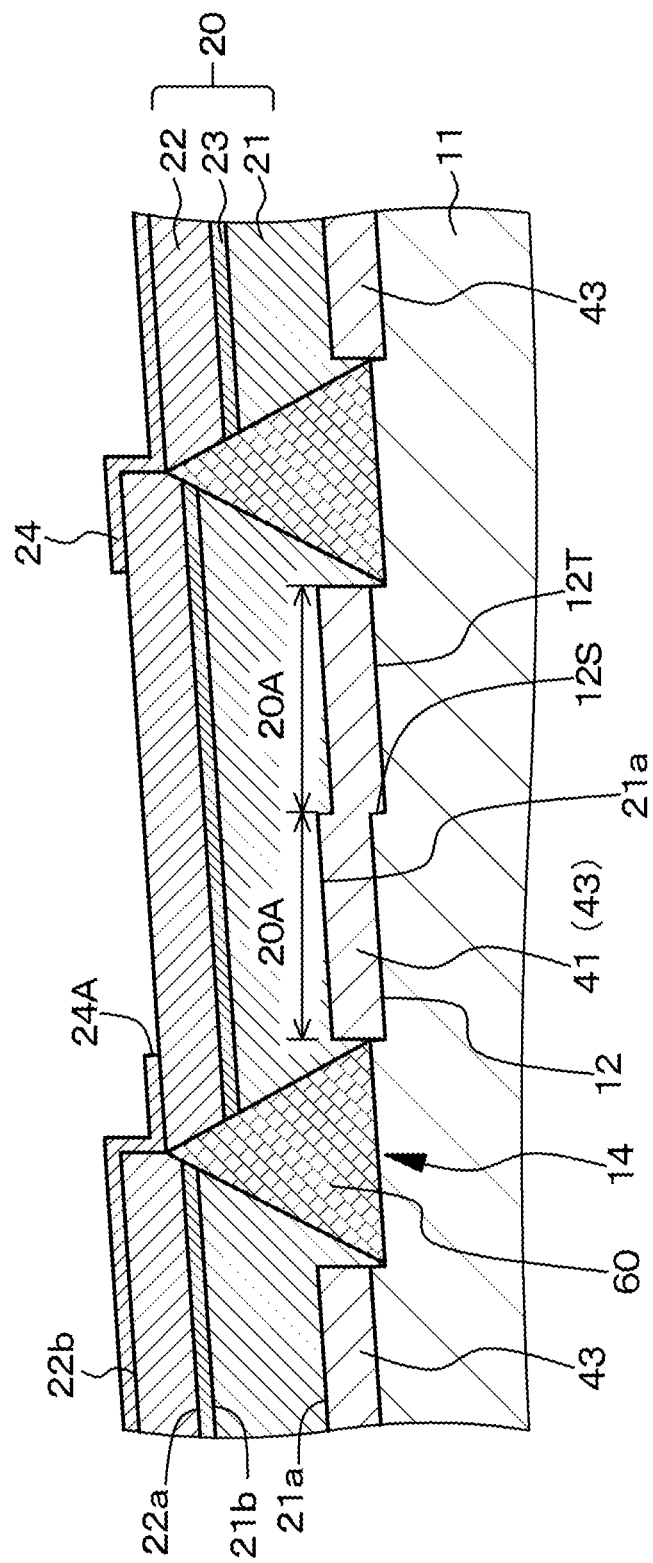
FIG. 4 is a schematic partial end view of the substrate and the like for describing the method of manufacturing the light emitting element of the first embodiment, following FIG. 3B.
Figure 5:
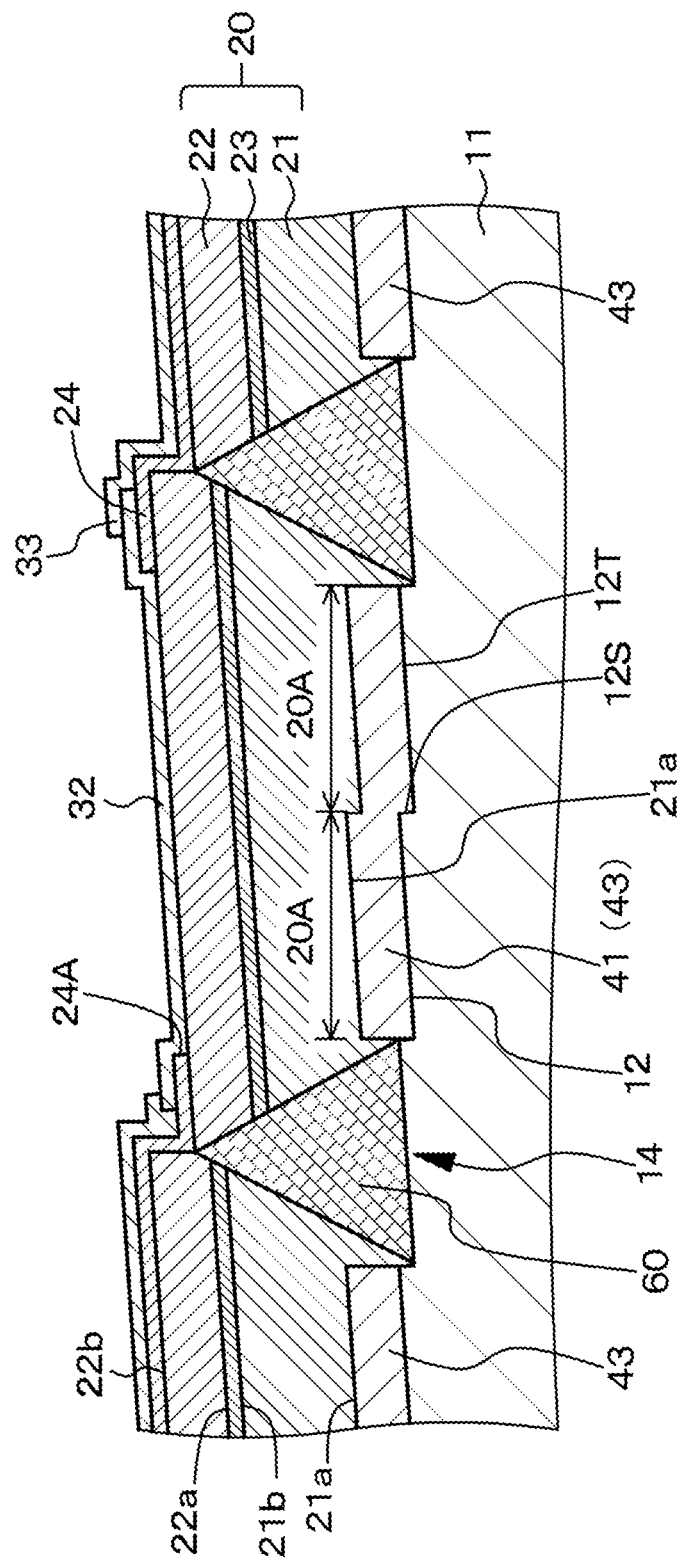
FIG. 5 is a schematic partial end view of the substrate and the like for describing the method of manufacturing the light emitting element of the first embodiment, following FIG. 4.

Hereinafter, the present disclosure will be described on the basis of embodiments. However, the present disclosure is not limited by the embodiments, and various numerical values and materials in the embodiments are examples. Note that the description will be given in the following order.
1. Overall description of light emitting elements according to first and second aspects of the present disclosure
2. First Embodiment (a light emitting element according to the first aspect of the present disclosure, and according to a combination of a first configuration and a third configuration of the present disclosure)
3. Second Embodiment (a modification of the first embodiment, and a light emitting element according to a combination of the first configuration and a fourth configuration of the present disclosure)
4. Third Embodiment (a modification of the first embodiment, and a light emitting element according to a combination of a second configuration and the third configuration of the present disclosure)
5. Fourth Embodiment (a modification of the first embodiment, and a light emitting element according to a combination of the second configuration and the fourth configuration of the present disclosure)
6. Fifth Embodiment (a light emitting element according to the second aspect of the present disclosure)
7. Sixth Embodiment (a modification of the light emitting elements of the first to fifth embodiments)
8. Seventh Embodiment (a modification of the light emitting elements of the first to sixth embodiments, and according to fifth configuration/sixth configuration of the present disclosure)
9. Eighth Embodiment (a modification of the light emitting elements of the first to seventh embodiments)
10. Ninth Embodiment (a modification of the light emitting element of the eighth embodiment)
11. Tenth Embodiment (another modification of the light emitting element of the eighth embodiment)
12. Eleventh Embodiment (still another modification of the light emitting element of the eighth embodiment)
13. Others Overall Description of Light Emitting Elements According to First and Second Aspects of the Present Disclosure In light emitting elements according to first and second aspects of the present disclosure, a plane of a first compound semiconductor layer, the plane facing an active layer, may be called a second plane of the first compound semiconductor layer, and a plane of the first compound semiconductor layer, the plane facing the second plane of the first compound semiconductor layer, may be called a first plane of the first compound semiconductor layer. A plane of a second compound semiconductor layer, the plane facing the active layer, may be called a first plane of the second compound semiconductor layer, and a plane of the second compound semiconductor layer, the plane facing the first plane of the second compound semiconductor layer, may be called a second plane of the second compound semiconductor layer.

The light emitting element according to the first aspect of the present disclosure including the above favorable forms can be configured such that a surface of a substrate has a step-like shape, and one laminated structural body unit is formed above a portion (also called "terrace") of the substrate, the portion being equivalent of one tread. Note that the light emitting element according to the first aspect of the present disclosure having such a configuration is called "light emitting element according to a first configuration of the present disclosure", for convenience. Then, in the light emitting element according to the first configuration of the present disclosure, a total value of portions (also called "steps") of the substrate, the portion being equivalent to a rise, is desirably 40 nm or less, and favorably, from 0.2 to 10 nm, both inclusive. In the one laminated structural body unit, a value of the portion (step) of the substrate, the portion being equivalent to a rise, is desirably from 0.2 to 1 nm, both inclusive. In the laminated structural body units, the values of the portions (steps), the portion being equivalent to a rise, may be the same or may be different. To make the surface of the substrate have the step-like shape, the surface of the substrate may just be dry etched, or may be wet etched. Alternatively, in some cases, at the time of manufacturing the substrate, the surface of the substrate is formed into the step-like shape in processing the surface of the substrate. The portions (terraces) of the substrate, the portions being equivalent to a plurality of the treads, are favorably formed in the substantially the same direction. Similar description applies below. A top face (the second plane) of the first compound semiconductor layer may be flattened by applying chemical/mechanical polishing processing (CMP processing) to the top face (the second plane) of the first compound semiconductor layer after the first compound semiconductor layer is formed on the substrate with the surface formed in the step-like shape.

Alternatively, the light emitting element according to the first aspect of the present disclosure including the above favorable forms can be configured such that a top face of the first compound semiconductor layer has a step-like shape, and one laminated structural body unit is configured from a portion of the laminated structural body including the top face of the first compound semiconductor layer, the top face being equivalent to one tread. Note that the light emitting element according to the first aspect of the present disclosure having such a configuration is called "light emitting element according to a second configuration of the present disclosure", for convenience. Then, in the light emitting element according to the second configuration of the present disclosure, a total value of portions of the first compound semiconductor layer, the portion being equivalent to a rise, is desirably 40 nm or less, and more favorably, from 0.2 to 10 nm, both inclusive. A value of the portion of the first compound semiconductor layer, the portion being equivalent to a rise, is desirably from 0.2 to 1 nm, both inclusive, in the one laminated structural body unit. In the laminated structural body units, the values of the portions (steps), the portion being equivalent to a rise, may be the same or may be different. To make the top face of the first compound semiconductor layer have the step-like shape, after the first compound semiconductor layer is formed, the first compound semiconductor layer is dry etched or wet etched, so that the thickness of the first compound semiconductor layer is changed into the step-like shape, and the active layer and the second compound semiconductor layer may just be formed on the first compound semiconductor layer.

In the light emitting element according to the first aspect of the present disclosure including the above various favorable forms and configurations, a second electrode and a second light reflecting layer can be configured to be common in light emitting element units. Note that the light emitting element according to the first aspect of the present disclosure having such a configuration is called "light emitting element according to a third configuration of the present disclosure", for convenience. In the light emitting element according to the third configuration of the present disclosure, a first light reflecting layer is common in the light emitting element units. That is, in the light emitting element according to the third configuration of the present disclosure, the second electrode and the second light reflecting layer are not mutually separated among the light emitting element units. Alternatively, the second electrode and the second light reflecting layer can be configured to be independently provided in each of the light emitting element units. Note that the light emitting element according to the first aspect of the present disclosure having such a configuration is called "light emitting element according to a fourth configuration of the present disclosure", for convenience. In the light emitting element according to the fourth configuration of the present disclosure, the first light reflecting layer can be common in the light emitting element units, or may be independently provided in each of the light emitting element units. That is, in the light emitting element according to the fourth configuration of the present disclosure, the second electrode and the second light reflecting layer are mutually separated among the light emitting element units. Meanwhile, the first light reflecting layers may be mutually separated or may not be separated among the light emitting element units. In the light emitting element according to the fourth configuration of the present disclosure, the light emitting element units that output a plurality of types of desired wavelengths (or have desired characteristics) are caused to emit light. Here, in a case of employing the configuration in which the light emitting element units that output a plurality of types of desired wavelengths (or have desired characteristics) are caused to emit light, a main wire extending from a drive circuit for causing the light emitting element units to emit light, and branch wires extending from the main wire to the second electrodes (or pad electrodes connected to the second electrodes, described below) of the light emitting element units are formed, and the branch wires extending to the light emitting element units other than the light emitting element unit that outputs a desired wavelength (or has a desired characteristic) may just be removed by cutting or the like. Alternatively, the main wire extending from the drive circuit for causing the light emitting element units to emit light is formed, and the second electrode (or the pad electrode connected to the second electrode, described below) of the light emitting element unit that outputs the desired wavelength (or has the desired characteristic) and the main wire may just be electrically connected by wire bonding or the like.

In the light emitting element according to the second aspect of the present disclosure, a difference between a maximum value and a minimum value of a resonator length is desirably 40 nm or less, or favorably, from 0.2 to 10 nm, both inclusive. In the light emitting element according to the second aspect of the present disclosure, to cause the resonator length to be smoothly changed in the light emitting element (that is, to cause the thickness of the laminated structural body to be smoothly changed), the surface of the substrate is dry etched or wet etched, or the chemical/mechanical polishing processing (CMP processing) is applied to the surface of the substrate, so that a smooth surface having an off angle with respect to a crystal plane of the substrate is formed, and the first light reflecting layer and the laminated structural body may just be formed on the surface. Alternatively, after the first compound semiconductor layer is formed on the first light reflecting layer formed on the surface of the substrate, the first compound semiconductor layer is dry etched or wet etched, or the chemical/mechanical polishing processing (CMP processing) is applied, so that the thickness of the first compound semiconductor layer is smoothly changed, and the active layer and the second compound semiconductor layer may just be formed on the first compound semiconductor layer. In the light emitting element according to the first aspect of the present disclosure, in a case where the value of the portion (step) of the substrate, the portion being equivalent to a rise, is less than 0.2 nm, in one laminated structural body unit, the light emitting element according to the first aspect of the present disclosure is included in the light emitting element according to the second aspect of the present disclosure. In this case, a state in which the resonator length is smoothly changed in the light emitting element (that is, the thickness of the laminated structural body is smoothly changed) can be obtained without etching the first compound semiconductor layer.

In the light emitting elements according to the first and second aspects of the present disclosure including the various favorable forms and configurations described above, the thicknesses of the active layer and the second compound semiconductor layer can be configured to be constant.

Further, in the light emitting elements according to the first and second aspects of the present disclosure including the various favorable forms and configurations described above, the first light reflecting layer can be configured to function as a selective growth mask layer.

Further, in the light emitting elements according to the first and second aspects of the present disclosure including the various favorable forms and configurations described above, a top face of the first light reflecting layer can be configured to have a shape following the surface of the substrate as a whole.

Further, in the light emitting elements according to the first and second aspects of the present disclosure including the various favorable forms and configurations described above, the laminated structural body can be configured to be made of a GaN-based compound semiconductor.

Further, in the light emitting elements according to the first and second aspects of the present disclosure including the various favorable forms and configurations described above, a wavelength of emitted light can be configured to be from 360 to 600 nm, both inclusive.

Further, in the light emitting elements according to the first and second aspects of the present disclosure including the various favorable forms and configurations described above, a spectral width of output light can be configured to be further widened as the light emitting element is caused to perform a modulation operation.

In a light emitting element according to a combination of the first and third configurations of the present disclosure, an off angle of plane orientation of the crystal plane of the substrate surface is not limited. However, the off angle favorably exceeds 0.01 degrees. Further, in a light emitting element according to a combination of the first and fourth configurations of the present disclosure, a light emitting element according to a combination of the second and third configurations of the present disclosure, a light emitting element according to a combination of the second and fourth configurations of the present disclosure, or in a light emitting element according to the second aspect of the present disclosure, the off angle of the plane orientation of the crystal plane of the substrate surface is not limited. However, the off angle is favorably 0.01 degrees or less. The off angle of the plane orientation of the crystal plane of the substrate surface refers to an angle made by the plane orientation of the crystal plane of the substrate surface and a normal line of the surface of the substrate in broad view.

In the light emitting elements according to the first and second aspects of the present disclosure including the various favorable forms and configurations described above (hereinafter, these light emitting elements are simply and collectively called "light emitting element and the like of the present disclosure"), as the resonator length (a distance between a plane of the first light reflecting layer, the plane facing the laminated structural body, and a plane of the second light reflecting layer, the plane facing the laminated structural body), 1 to 30 times of a wavelength of the light output by the light emitting element can be exemplified.

In the light emitting element and the like of the present disclosure, a lowermost layer of the first light reflecting layer (selective growth mask layer) can be configured such that a thermal expansion mitigating film is formed on the substrate (the light emitting element and the like of the present disclosure having such a configuration is called "light emitting element according to a fifth configuration of the present disclosure", for convenience). Further, a linear thermal expansion coefficient CTE of the lowermost layer of the first light reflecting layer (selective growth mask layer), the lowermost layer being in contact with the substrate, can be configured to satisfy:

$$1 \times 10^{-6}/K \leq CTE \leq 1 \times 10^{-5}/K,$$

and favorably, $$1 \times 10^{-6}/K < CTE \leq 1 \times 10^{-5}/K$$

(the light emitting element and the like of the present disclosure having such a configuration is called "light emitting element according to a sixth configuration of the present disclosure", for convenience). In the light emitting element according to the fifth or sixth configuration of the present disclosure, occurrence of a problem that the first light reflecting layer (selective growth mask layer) comes off the substrate due to a difference between a linear thermal expansion coefficient of the substrate and the linear thermal expansion coefficient of the first light reflecting layer (selective growth mask layer) can be avoided, and a light emitting element having high reliability can be provided. The lowermost layer of the first light reflecting layer (selective growth mask layer) does not have a function as a light reflecting layer.

In the light emitting element according to the fifth configuration of the present disclosure, the thermal expansion mitigating film can be configured to be made of at least one type of material selected from a group consisting of silicon nitride ($SiN_X$), aluminum oxide (AlO), niobium oxide ($NbO_X$), tantalum oxide ($TaO_X$), titanium oxide ($TiO_X$), magnesium oxide ($MgO_X$), zirconium oxide ($ZrO_X$), and aluminum nitride ($AlN_X$). Note that a value of the subscript "X" attached to the chemical formula of each of the substances or a value of a subscript or "Z" described below includes not only a value based on the stoichiometry in each substance, but also a value falling outside the value based on the stoichiometry. Similar description applies below. Then, the light emitting element according to the fifth configuration of the present disclosure including such a favorable form desirably satisfies:

$$t_1 = \lambda_0/(4n_1),$$

and favorably $$t_1 = \lambda_0/(2n_1),$$

where the thickness of the thermal expansion mitigating film is $t_1$, a peak emission wavelength of the light emitting element is $\lambda_0$, and a refractive index of the thermal expansion mitigating film is $n_1$. Note that a value of the thickness $t_1$ of the thermal expansion mitigating film can be essentially arbitrary, and can be $1 \times 10^{-7}$ m or less, for example.

In the light emitting element according to the sixth configuration of the present disclosure, the lowermost layer of the first light reflecting layer (selective growth mask layer) can be configured to be made of at least one type of material selected from a group consisting of silicon nitride ($SiN_X$), aluminum oxide ($AlO_X$), niobium oxide ($NbO_X$), tantalum oxide ($TaO_X$), titanium oxide ($TiO_X$), magnesium oxide ($MgO_X$), zirconium oxide ($ZrO_X$), and aluminum nitride ($AlN_X$). Then, the light emitting element according to the sixth configuration of the present disclosure including such a favorable form desirably satisfies:

$$t_1=\lambda_0/(4n_1),$$

and favorably, $$t_1=\lambda_0/(2n_1)$$

where the thickness of the lowermost layer of the first light reflecting layer (selective growth mask layer) is $t_1$, the peak emission wavelength of the light emitting element is $\lambda_0$, and a refractive index of the lowermost layer of the first light reflecting layer (selective growth mask layer) is $n_1$. Note that a value of the thickness $t_1$ of the lowermost layer of the first light reflecting layer (selective growth mask layer) can be essentially arbitrary, and can be $1\times10^{-7}$ m or less, for example.

In a method of manufacturing the light emitting element of the present disclosure including the various favorable forms and configurations described above, the substrate may remain, or the substrate may be removed using the first light reflecting layer (selective growth mask layer) as an etching stopper layer or a polishing stopper layer, after sequentially forming the active layer, the second compound semiconductor layer, the second electrode, and the second light reflecting layer on the first compound semiconductor layer. To be specific, the active layer, the second compound semiconductor layer, the second electrode, and the second light reflecting layer are sequentially formed on the first compound semiconductor layer, then after the second light reflecting layer is fixed to a support substrate, the substrate is removed using the first light reflecting layer (selective growth mask layer) as an etching stopper layer or a polishing stopper layer, and the first compound semiconductor layer (the first plane of the first compound semiconductor layer) and the first light reflecting layer (selective growth mask layer) may just be exposed. Further, a first electrode may just be formed on the first compound semiconductor layer (the first plane of the first compound semiconductor layer).

The removal of the substrate can be configured to be performed on the basis of a chemical/mechanical polishing method (CMP method). Note that, first, apart of the substrate is removed or the thickness of the substrate is made thin, by a wet etching method using an alkali aqueous solution such as an aqueous sodium hydroxide solution or an aqueous potassium hydroxide solution, an ammonia solution+a hydrogen peroxide solution, a sulphuric acid solution+a hydrogen peroxide solution, a hydrochloric acid solution+a hydrogen peroxide solution, a phosphoric acid solution+a hydrogen peroxide solution, or the like, a dry etching method, a lift-off method using laser, a mechanical polishing method, or a combination thereof. Then, the chemical/mechanical polishing method is executed, so that the first compound semiconductor layer (the first plane of the first compound semiconductor layer) and the first light reflecting layer (selective growth mask layer) may just be exposed.

Further, in the light emitting element and the like of the present disclosure including various favorable forms and configurations described above, a planar shape of the first light reflecting layer (selective growth mask layer) can be configured to be various polygons including a regular hexagon, a circle, an oval, a grid shape (square), an island-like shape, or a stripe shape. A selective growth mask layer may be further provided, in addition to the first light reflecting layer.

$$t_2=\lambda_0/(4n_2),$$

is favorably satisfied, where the thickness of the uppermost layer (the layer being in contact with the first compound semiconductor layer) of the first light reflecting layer is $t_2$, and a refractive index of the uppermost layer of the first light reflecting layer is $n_2$, and further, $$t_2=\lambda_0/(2n_2),$$

is satisfied, so that the uppermost layer of the first light reflecting layer becomes an absence layer for the light with the wavelength $\lambda_0$. The uppermost layer of the first light reflecting layer (the layer being in contact with the first compound semiconductor layer) can be configured from a silicon nitride film.

In the light emitting element and the like of the present disclosure including the various favorable forms and configurations described above, the light generated in the active layer can be configured to be output to an outside through the second light reflecting layer (hereinafter, the light emitting element is called "second light reflecting layer output-type light emitting element", for convenience), or can be configured to be output to an outside through the first light reflecting layer (hereinafter, the light emitting element is called "first light reflecting layer output-type light emitting element", for convenience). In the first light reflecting layer output-type light emitting element, in some cases, the substrate may be removed, as described above.

Then, the first light reflecting layer output-type light emitting element desirably satisfies:

$$S_1>S_2$$

where an area of a portion of the first light reflecting layer, the portion being in contact with the first plane of the first compound semiconductor layer (a portion of the first light reflecting layer, the portion facing the second light reflecting layer) is $S_1$, and an area of a portion of the second light reflecting layer, the portion facing the second plane of the second compound semiconductor layer (a portion of the second light reflecting layer, the portion facing the first light reflecting layer) is $S_2$, and the second light reflecting layer output-type light emitting element desirably satisfies:

$$S_1<S_2.$$

However, the configurations are not limited thereto.

In a case of removing the substrate in the first light reflecting layer output-type light emitting element, the second light reflecting layer can be configured to be fixed to the support substrate. In the case of removing the substrate in the first light reflecting layer output-type light emitting element, examples of an arrangement state of the first light reflecting layer and the first electrode on the first plane of the first compound semiconductor layer include a state in which the first light reflecting layer and the first electrode are in contact with each other, a state in which the first light reflecting layer and the first electrode are separated, and in some cases, a state in which the first electrode is formed up to above an edge portion of the first light reflecting layer, and a state in which the first light reflecting layer is formed up to above an edge portion of the first electrode. Here, in a case of the state in which the first light reflecting layer is formed up to above an edge portion of the first electrode, the first electrode needs to have an opening portion having a certain size so as not to absorb light in a basic mode of laser oscillation as much as possible. The size of the opening portion is changed depending on a wavelength in the basic mode or a light trapping structure in a lateral direction (in an in-plane direction of the first compound semiconductor layer), and is thus not limited. However, the size is roughly favorably in the order of several times the peak emission wavelength (peak oscillation wavelength) $\lambda_0$. Alternatively, the first light reflecting layer and the first electrode are separated, that is, have an offset, and a clearance can be configured to be within 1 mm.

Further, in the light emitting element and the like of the present disclosure including various favorable forms and configurations described above, the first electrode can be configured to be made of a metal or an alloy, and the second electrode can be configured to be made of a transparent conductive material. When the second electrode is configured from the transparent conductive material, a current can be spread in the lateral direction (in the in-plane direction of the second compound semiconductor layer), and the current can be efficiently supplied to an element region (to be described next).

The "element region" refers to a region into which a constricted current is injected, a region in which the light is trapped due to a difference in the refractive index or the like, a region in which the laser oscillation is caused, in a region sandwiched by the first light reflecting layer and the second light reflecting layer, or a region that actually contributes to the laser oscillation, in the region sandwiched by the first light reflecting layer and the second light reflecting layer.

As described above, the light emitting element can be configured to be made of the surface emitting laser element (vertical resonator laser, VCSEL) that outputs light from the top face of the first compound semiconductor layer through the first light reflecting layer, or can be configured to be made of the surface emitting laser element that outputs light from the top face of the second compound semiconductor layer through the second light reflecting layer.

In the light emitting element and the like of the present disclosure including various favorable forms and configurations described above, the laminated structural body made of the first compound semiconductor layer, the active layer, and the second compound semiconductor layer can be, to be specific, configured to be made of the GaN-based compound semiconductor, as described above. Here, examples of the GaN-based compound semiconductor include, to be specific, GaN, AlGaN, InGaN, and AlInGaN. Further, these compound semiconductors may contain, as desired, a boron (B) atom, a thallium (Tl) atom, an arsenic (As) atom, a phosphorus (P) atom, or an antimony (Sb) atom. The active layer desirably has a quantum well structure. To be specific, the active layer may have a single quantum well structure (QW structure), or may have a multilayer quantum well structure (MQW structure). The active layer having a quantum well structure has a structure in which at least one layer of well layer and one layer of barrier layer are laminated. As a combination of (a compound semiconductor that configures the well layer and a compound semiconductor that configures the barrier layer), $(In_yGa_{(1-y)}N, GaN)$, $(In_yGa_{(1-y)}N, In_zGa_{(1-z)}N)$ [Note that y>z], and $(In_yGa_{(1-y)}N, AlGaN)$ can be exemplified. The first compound semiconductor layer can be configured from a first conductivity-type (for example, n-type) compound semiconductor, and the second compound semiconductor layer can be configured from a second conductivity-type (for example, p-type) compound semiconductor, which is different form the first conductivity type. The first compound semiconductor layer and the second compound semiconductor layer are also called first cladding layer and second cladding layer. It is favorable to form a current constricting structure between the second electrode and the second compound semiconductor layer. The first compound semiconductor layer and the second compound semiconductor layer may be single structure layers, may be multistructure layers, or may be super lattice structure layers. Further, the first and second compound semiconductor layers can be layers including a composition gradient layer or a concentration gradient layer.

To obtain the current constricting structure, a current constricting layer made of an insulating material (for example, $SiO_X$, $SiN_X$, or $AlO_X$) may be formed between the second electrode and the second compound semiconductor layer, or a mesa structure may be formed by etching the second compound semiconductor layer by an RIE method or the like. Further, the current constricting region may be formed by partially oxidizing a layer of a part of the laminated second compound semiconductor layer in the lateral direction. Further, a region with reduced conductivity may be formed by ion-implanting impurities to the second compound semiconductor layer, or the aforementioned methods may be appropriately combined. Note that the second electrode needs to be electrically connected with a portion of the second compound semiconductor layer, in which the current flows due to the current constriction.

It is known that a characteristic of a substrate is changed depending on a growth face, such as polarity/non-polarity/semi-polarity. However, any principal plane of the substrate can be used for formation of the compound semiconductor layer. Further, for the principal plane of the substrate, a plane obtained such that the plane orientation of the crystal plane is made off in a specific direction (including a case where the off angle is 0 degrees), which is so-called A plane, B plane, C plane, R plane, M plane, N plane, or S plane, is used depending on the crystal structure (for example, a cubic structure or a hexagonal crystal structure). Examples of a method of forming various types of compound semiconductor layers that configure the light emitting element include an organic metal chemical vapor phase growth method (MOCVD method or MOVPE method), a molecular beam epitaxy method (MBE method), and a hydride-vapor phase growth method in which halogen contributes to transport or a reaction. Note that, by growing the first compound semiconductor layer in the lateral direction from the substrate on which the first light reflecting layer (selective growth mask layer) is formed on the basis of a method of epitaxially growing a layer, such as an epitaxial lateral overgrowth (ELO) method, the first compound semiconductor layer can be formed on the first light reflecting layer (selective growth mask layer). As the substrate, to be specific, a GaN substrate or a sapphire substrate can be used.

Here, examples of an organic gallium source in the MOCVD method include trimethylgallium (TMG) and triethylgallium (TEG), and examples of a nitrogen source gas include an ammonia gas and hydrazine. In formation of the GaN-based compound semiconductor layer in an n-type conductivity type, for example, silicon (Si) may just be added as an n-type impurity (n-type dopant). In formation of the GaN-based compound semiconductor layer in a p-type conductivity type, for example, magnesium (Mg) may just be added as a p-type impurity (p-type dopant). In a case where aluminum (Al) or indium (In) is contained as a configuration atom of the GaN-based compound semiconductor layer, trimethylaluminum (TMA) may just be used as an Al source and trimethylindium (TMI) may just be used as an In source. Further, a monosilane gas ($SiH_4$ gas) may just be used as an Si source, and biscyclopentadienyl magnesium, methylcyclopentadienyl magnesium, or biscyclopentadienyl magnesium ($Cp_2Mg$) may just be used as an Mg source. Note that examples of the n-type impurity (n-type dopant) can include Ge, Se, Sn, C, Te, S, O, Pd, and Po, in addition to Si, and examples of the p-type impurity (p-type dopant) can include Zn, Cd, Be, Ca, Ba, C, Hg, and Sr, in addition to Mg.

The support substrate may just be configured from various substrates such as a GaN substrate, a sapphire substrate, a GaAs substrate, an SiC substrate, an alumina substrate, a ZnS substrate, a ZnO substrate, an LiMgO substrate, an LiGaO$_2$ substrate, an MgAl$_2$O$_4$ substrate, and an InP substrate. Alternatively, the support substrate can be configured from an insulating substrate made of AlN and the like, a semiconductor substrate made of Si, SiC, Ge, and the like, a metal-made substrate, or an alloy-made substrate. It is favorable to use a substrate having conductivity, or the metal-made substrate or the alloy-made substrate in terms of mechanical characteristics, elastic deformation, plastic deformation, heat dissipation, and the like. As the thickness of the support substrate, for example, 0.05 to 0.5 mm can be exemplified. As a method of fixing the second light reflecting layer to the support substrate, known method such as a solder bonding method, a normal temperature bonding method, a bonding method using adhesive tape, or a bonding method using wax bonding can be used. However, it is desirable to employ the solder bonding method or the normal temperature bonding method in terms of securing of conductivity. For example, in a case of using a silicon semiconductor substrate that is a conductive substrate as the support substrate, it is desirable to employ a method that enables bonding at a low temperature such as 400° C. or less to suppress bending due to a difference in the thermal expansion coefficient. In a case of using the GaN substrate as the support substrate, the bonding temperature may be 400° C. or more.

The first electrode desirably includes a single layer configuration or a multilayer configuration containing at least one type of metal (including alloy) selected from a group consisting of, for example, gold (Au), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn), and indium (In), and to be specific, Ti/Au, Ti/Al, Ti/Al/Au, Ti/Pt/Au, Ni/Au, Ni/Au/Pt, Ni/Pt, Pd/Pt, and Ag/Pd can be exemplified. Note that the former layer of "/" in the multilayer configuration is positioned closer to the active layer side. Similar description applies below. The first electrode can be formed, for example, by a PVD method such as a vacuum deposition method or a sputtering method.

As the transparent conductive material that configures the second electrode, indium tin oxide (ITO, including Sn-doped In$_2$O$_3$, crystalline ITO, and amorphous ITO), indium zinc oxide (IZO), F-doped In$_2$O$_3$ (IFO), tin oxide (SnO$_2$), Sb-doped SnO$_2$ (ATO), F-doped SnO$_2$ (FTO), zinc oxide (ZnO, including Al-doped ZnO and B-doped ZnO) can be exemplified. Further, as the second electrode, a transparent conductive film using gallium oxide, titanium oxide, niobium oxide, nickel oxide, or the like as a base layer can be exemplified. Note that the material that configures the second electrode depends on an arrangement state of the second light reflecting layer and the second electrode. However, the material is not limited to the transparent conductive material, and metal such as palladium (Pd), platinum (Pt), nickel (Ni), gold (Au), cobalt (Co), or rhodium (Rh) can be used. The second electrode may just be configured from at least one type of these materials. The second electrode can be formed, for example, a PVD method such as a vacuum deposition method or a sputtering method.

A pad electrode may be provided on the first electrode or the second electrode to be electrically connected with an external electrode or an external circuit outside. The pad electrode desirably has a single layer configuration or a multilayer configuration containing at least one type of metal selected from a group consisting of titanium (Ti), aluminum (Al), platinum (Pt), gold (Au), nickel (Ni), and palladium (Pd). Alternatively, the pad electrode can have a multilayer configuration such as a Ti/Pt/Au multilayer configuration, a Ti/Au multilayer configuration, a Ti/Pd/Au multilayer configuration, a Ti/Pd/Au multilayer configuration, a Ti/Ni/Au multilayer configuration, or a Ti/Ni/Au/Cr/Au multilayer configuration. In a case of configuring the first electrode from an Ag layer or an Ag/Pd layer, it is favorable to form a cover metal layer made of Ni/TiW/Pd/TiW/Ni on a surface of the first electrode, and to form the pad electrode made of the Ti/Ni/Au multilayer configuration or the Ti/Ni/Au/Cr/Au multilayer configuration, for example.

The light reflecting layer (distributed Bragg reflecting mirror layer, distributed Bragg reflector layer, or DBR layer) is configured from, for example, a semiconductor multilayer film or a dielectric multilayer film. Examples of dielectric materials include oxide of Si, Mg, Al, Hf, Nb, Zr, Sc, Ta, Ga, Zn, Y, B, and Ti, nitride (for example, SiN$_X$, AlN$_X$, AlGaN, GaN$_X$, or BN$_X$), and fluoride. To be specific, SiO$_X$, TiO$_X$, NbO$_X$, ZrO$_X$, TaO$_X$, ZnO$_X$, AlO$_X$, HfO$_X$, SiN$_X$, and AlN$_X$ can be exemplified. Then, the light reflecting layers can be obtained by alternately laminating two types or more dielectric films made of dielectric materials having different refractive indexes among the dielectric materials. For example, the multilayer films such as SiO$_X$/SiN$_Y$, SiO$_X$/NbO$_Y$, SiO$_X$/ZrO$_Y$, and SiO$_X$/AlN$_Y$ are favorable. To obtain desired optical reflectance, the materials that configure the respective dielectric films, the film thickness, the number of laminated layers, and the like may just be appropriately selected. The thickness of the dielectric films can be appropriately adjusted with the material to be used, and is determined according to the peak emission wavelength $\lambda_0$, and the refractive index n at the emission wavelength $\lambda_0$ of the material to be used. To be specific, the thickness is favorably odd number times the $\lambda_0/(4n)$. For example, in a case of configuring the light reflecting layer from SiO$_X$/NbO$_Y$ in the light emitting element with the peak emission wavelength $\lambda_0$ of 410 nm, the thickness of about 40 to 70 nm can be exemplified. As the number of laminated layers, two or more, and favorably, about 5 to 20 can be exemplified. As the thickness of the entire light reflecting layer, about 0.6 to 1.7 μm can be exemplified.

Further, the first light reflecting layer desirably includes a dielectric film containing at least a nitrogen (N) atom, and further, the dielectric film containing an N atom desirably serves as an uppermost layer of the dielectric multilayer film. Further, the first light reflecting layer is desirably coated with a dielectric material layer containing at least a nitrogen (N) atom. Further, by applying nitriding treatment to the surface of the first light reflecting layer, the surface of the first light reflecting layer desirably becomes a layer containing at least a nitrogen (N) atom (hereinafter, the surface is called "surface layer", for convenience). The thickness of the dielectric film containing at least an N atom or the dielectric material layer, and the surface layer is desirably odd number times the $\lambda_0/(4n)$. To be specific, examples of the material that configures the dielectric film containing at least an N atom or the dielectric material layer include SiN$_X$ and SiO$_X$N$_Z$. As described above, when the compound semiconductor layer that coats the first light reflecting layer is formed by forming the dielectric film containing at least an N atom or the dielectric material layer, and the surface layer, a gap between a crystal axis of the compound semiconductor layer that coats the first light reflecting layer and a crystal axis of the substrate can be reduced, and quality of the laminated structural body serving as a resonator can be enhanced.

The light reflecting layer can be formed on the basis of a known method, and to be specific, examples of the method include PVD methods such as a vacuum deposition method, a sputtering method, a reactive sputtering method, an ECR plasma sputtering method, a magnetron sputtering method, an ion beam-assisted deposition method, an ion plating method, and a laser ablation method; various CVD methods; application methods such as a spray method, a spin coat method, a dip method; a method of combining two types or more methods described above; and a method of combining the method described above and any one type or more of entire or partial pre-treatment, irradiation with an inert gas (Ar, He, Xe, or the like) or plasma, irradiation with an oxygen gas, an ozone gas, and plasma, oxidization treatment (thermal treatment), and exposure treatment.

Further, a side surface and an exposed surface of the laminated structural body may be coated with an insulating film. Formation of the insulating film can be performed on the basis of known methods. The refractive index of the material that configures the insulating film is favorably smaller than the refractive index of the material that configures the laminated structural body. As the material that configures the insulating film, an $SiO_X$-based material containing $SiO_2$, an $SiN_X$-based material, an $SiO_XN_Z$-based material, $TaO_X$, $ZrO_X$, $AlN_X$, $AlO_X$, and $GaO_X$ can be exemplified. Further, an organic material such as a polyimide resin can be exemplified. Examples of a method of forming the insulating film include PVD methods such as a vacuum deposition method and a sputtering method, and a CVD method, or the insulating film can be formed on the basis of an application method.

From the light emitting element of the present disclosure, an image display device, a projector device, a backlight device, and an illumination device can be configured, for example. In the image display device or the projector device, the light emitting element of the present disclosure can be used as a red light emitting element, a green light emitting element, and a blue light emitting element, and for example, the light emitting element using an AlGaInP-based compound semiconductor can be used as the red light emitting element.

First Embodiment

A first embodiment relates to a light emitting element according to the first aspect of the present disclosure, and to be specific, relates to a light emitting element according to a combination of the first and third configurations of the present disclosure. A schematic partial sectional view of the light emitting element of the first embodiment is illustrated in FIG. 1.

The light emitting element of the first embodiment, or of any of second to eleventh embodiments is, to be specific, a surface emitting laser element (vertical resonator laser, VCSEL), and is a light emitting element including at least:

a first light reflecting layer 41 formed on a surface 12 of a substrate;

a laminated structural body 20 made of a first compound semiconductor layer 21, an active layer 23, and a second compound semiconductor layer 22 formed on the first light reflecting layer 41; and a second electrode 32 and a second light reflecting layer 42 formed on the second compound semiconductor layer 22.

In the light emitting element of the first embodiment, or of any of the second to eleventh embodiments, thicknesses of the active layer 23 and the second compound semiconductor layer 22 are constant. The first light reflecting layer 41 functions as a selective growth mask layer 43. A top face of the first light reflecting layer 41 has a shape following the surface of the substrate, to be specific, the surface 12 of a GaN substrate 11, as a whole. The laminated structural body 20 is made of a GaN-based compound semiconductor. A wavelength of emitted light is from 360 to 600 nm, both inclusive. Plane orientation of a crystal plane of the surface 12 of the GaN substrate 11 is [0001]. That is, the first light reflecting layer 41 and the laminated structural body 20 are formed on a (0001) plane (C plane) of the GaN substrate 11. A planar shape of the selective growth mask layer 43 is a regular hexagon. The regular hexagon is arranged or arrayed such that the compound semiconductor layer epitaxially grows in a lateral direction in a [11-20] direction or a direction crystallographically equivalent to the [11-20] direction.

In the light emitting element of the first embodiment, an off angle of the plane orientation of the crystal plane of the surface 12 of the GaN substrate 11 exceeds 0.01 degrees. That is, the off angle that is an angle made by the plane orientation [0001] of the crystal plane of the GaN substrate surface and a normal line of the surface 12 of the GaN substrate 11 in broad view exceeds 0.01 degrees.

The laminated structural body 20 is made of the first compound semiconductor layer 21, the active layer 23, and the second compound semiconductor layer 22, and is, to be specific, made such that:

the first compound semiconductor layer 21 made of the GaN-based compound semiconductor, and including a first plane 21a, and a second plane 21b facing the first plane 21a;

the active layer (light emitting layer) 23 made of the GaN-based compound semiconductor, and being in contact with the second plane 21b of the first compound semiconductor layer 21; and the second compound semiconductor layer 22 made of the GaN-based compound semiconductor, including a first plane 22a, and a second plane 22b facing the first plane 22a, and having the first plane 22a be in contact with the active layer 23 are laminated. Then, the second electrode 32 and the second light reflecting layer 42 made of a multilayer film are formed on the second plane 22b of the second compound semiconductor layer 22, and a first electrode 31 is formed on the other face (back surface 13) of the GaN substrate 11, the other face opposing to the surface 12 of the GaN substrate 11, on which the laminated structural body 20 is formed. The first light reflecting layer 41 made of a multilayer film is formed on the surface 12 of the GaN substrate 11, and is formed in contact with the first plane 21a of the first compound semiconductor layer 21.

To be specific, the first compound semiconductor layer 21 is made of an n-type GaN layer, the active layer 23 is made of a fivefold multiquantum well structure in which an $In_{0.04}Ga_{0.96}N$ layer (barrier layer) and an $In_{0.16}Ga_{0.84}N$ layer (well layer) are laminated, and the second compound semiconductor layer 22 has a two-layer configuration of a p-type AlGaN electron barrier layer and a p-type GaN layer. Note that the electron barrier layer is positioned at an active layer side. The first electrode 31 is made of Ti/Pt/Au, the second electrode 32 is made of a transparent conductive material, to be specific, ITO, a pad electrode 33 is made of Ti/Pd/Au or Ti/Pt/Au, and the first light reflecting layer 41 and the second light reflecting layer 42 are made of a laminated structure of an $SiN_X$ layer and an $SiO_Y$ layer (the total number of laminated layers of dielectric films: 20 layers). The thickness of each layer is $\lambda_0/(4n)$.

In the light emitting element of the first embodiment, or of any of the second to eleventh embodiments, a current constricting layer 24 made of an insulating material such as SiO$_X$, SiN$_X$, or AlO$_X$ is formed between the second electrode 32 and the second compound semiconductor layer 22. An opening 24A is formed in the current constricting layer 24, and the second compound semiconductor layer 22 is exposed to a bottom portion of the opening 24A. The second electrode 32 is formed on the second plane 22b of the second compound semiconductor layer 22 to on the current constricting layer 24, and the second light reflecting layer 42 is formed on the second electrode 32. Further, the pad electrode 33 for being electrically connected with an external electrode or an external circuit is connected to an edge portion of the second electrode 32. In the light emitting element of the first embodiment, or of any of the second to eleventh embodiments, a planar shape of an element region is a regular hexagon, and planar shapes of the first light reflecting layer 41, the second light reflecting layer 42, and the opening 24A provided in current constricting layer 24 are circles. Although the first light reflecting layer 41 and the second light reflecting layer 42 have multilayer structures, they are illustrated in one layer for simplification of the drawing. Formation of the current constricting layer 24 is not essential.

Here, in the first embodiment, the light emitting element is a second light reflecting layer output-type light emitting element, which outputs light from the second plane 22b of the second compound semiconductor layer 22 through the second light reflecting layer 42. The GaN substrate 11 remains.

Then, in the light emitting element of the first embodiment, the laminated structural body 20 is configured from a plurality of laminated structural body units 20A, a light emitting element unit 10A is configured from each of the laminated structural body units 20A, and a resonator length in the light emitting element unit 10A is different in every light emitting element unit 10A. That is, the thickness of the laminated structural body unit 20A is different in every light emitting element unit 10A.

Here, in the light emitting element of the first embodiment, the surface 12 of the GaN substrate 11 has a step-like shape, and one laminated structural body unit 20A is formed above a portion (terrace 12T) of the GaN substrate 11, the portion being equivalent to one tread. Further, in the light emitting element of the first embodiment, a total value of portions (steps 12S) of the GaN substrate 11, the portion being equivalent to a rise, is 40 nm or less, and favorably, from 0.2 to 10 nm, both inclusive. In one laminated structural body unit 20A, a value of the portion (step 12S) of the GaN substrate 11, the portion being equivalent to a rise, is from 0.2 to 1 nm, both inclusive. To be specific, an average value of lengths of the portions (terraces 12T) of the GaN substrate 11, the portion being equivalent to one tread, is 70 nm, and an average value of heights of the portions (steps 12S) of the GaN substrate 11, the portion being equivalent to one rise, is 0.5 nm. In various embodiments, the drawings are illustrated such that the number of the portions (steps 12S) of the GaN substrate 11, the portion being equivalent to a rise, is "1". Further, as described below, the drawings are illustrated such that the number of portions 21S of the first compound semiconductor layer 21, the portion being equivalent to a rise, is "1". However, the numbers of the portions are not limited to these embodiments.

Further, in the light emitting element of the first embodiment, the second electrode 32 and the second light reflecting layer 42 are common in the light emitting element units 10A, and the first light reflecting layer 41 is also common in the light emitting element units 10A. That is, among the light emitting element units, the first light reflecting layer 41, the second electrode, and the second light reflecting layer are not mutually separated.

Hereinafter, a method of manufacturing the light emitting element of the first embodiment will be described with reference to FIGS. 2A, 2B, 3A, 3B, 4, and 5, which are schematic partial end views of the substrate and the like.

[Process-100]

First, the GaN substrate 11 in which the surface 12 of the substrate (to be specific, the GaN substrate 11) has the step-like shape is prepared (see FIG. 2A). To make the surface 12 of the GaN substrate 11 be the step-like shape, the surface 12 of the GaN substrate 11 may just be dry etched or wet etched. Alternatively, in some cases, the surface 12 of the GaN substrate 11 is formed into the step-like shape, in processing the surface 12 of the GaN substrate 11 at the time of manufacturing the GaN substrate 11.

[Process-110]

Figure 28:
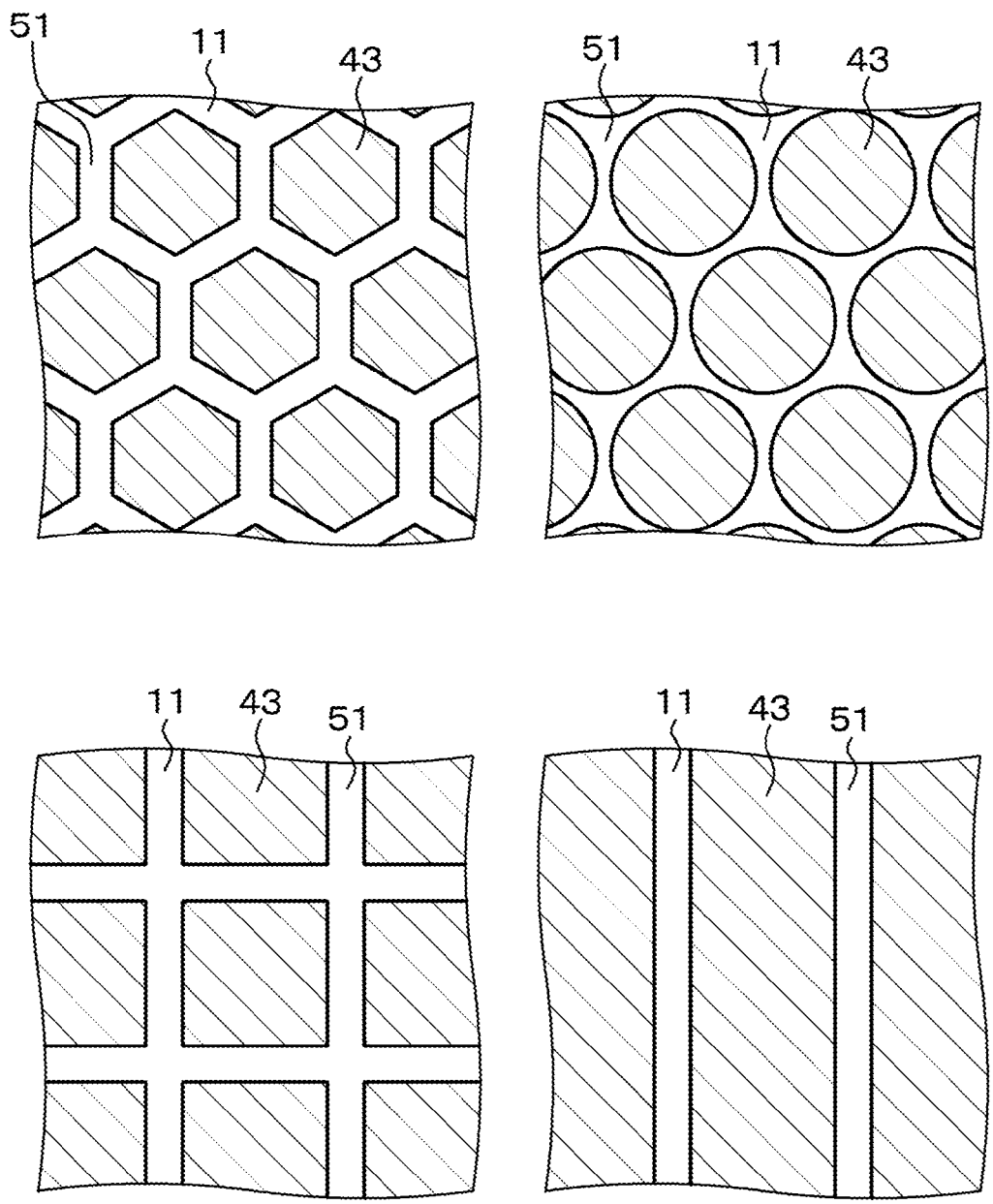
FIG. 28 is a schematic plan view of a selective growth mask layer.

Next, the first light reflecting layer 41 (also functions as the selective growth mask layer 43) made of a multilayer film is formed on the GaN substrate 11 on the basis of a known method (see FIG. 2B). As illustrated in the schematic plan view in FIG. 28, the shape of the selective growth mask layer 43 is a regular hexagon. Note that, the shape of the selective growth mask layer 43 is not limited thereto, and for example, can be a circle, a grid shape, or a stripe shape. To clearly display the selective growth mask layer 43 in FIG. 28, the selective growth mask layer 43 is shaded. The GaN substrate 11 is exposed between the selective growth mask layer 43 and the selective growth mask layer 43, and a seed crystal layer 60 grows from a region (crystal growth start region 14) where the GaN substrate 11 is exposed.

[Process-120]

Following that, the seed crystal layer 60 is formed on the crystal growth start region 14 using an MOCVD device using a TMG gas and an SiH$_4$ gas on the basis of an MOCVD method. Although depending on a film forming condition in the MOCVD method, the section shape of the seed crystal layer 60 in a virtual vertical plane containing two normal lines that pass through a central point of two adjacent selective growth mask layers 43 (hereinafter, the virtual vertical plane is simply called "virtual vertical plane") is an isosceles triangle (base angle: 58 degrees). Accordingly, the state illustrated in FIG. 3A can be obtained.

[Process-130]

Then, the film forming condition in the MOCVD method is changed, and the first compound semiconductor layer 21 is formed from the seed crystal layer 60 on the basis of lateral direction epitaxial growth. The top face of the first light reflecting layer 41 has a shape following the surface 12 of the GaN substrate 11 as a whole. Therefore, in an initial stage of the lateral direction epitaxial growth, the first compound semiconductor layer 21 is deposited on the surface of the selective growth mask layer 43 (first light reflecting layer 41) in a state of following the surface of the selective growth mask layer 43 (first light reflecting layer 41). Therefore, a level difference is caused in the top face of the first compound semiconductor layer 21. However, when the thickness of the first compound semiconductor layer 21 becomes a certain thickness, the level difference is mitigated, and the surface of the first compound semiconductor layer 21 roughly becomes flat. Then, finally, the second plane 21b of the first compound semiconductor layer 21 becomes flat, and the flat second plane 21b of the first compound semiconductor layer 21 becomes parallel to the surface 12 (C plane) of the GaN substrate 11.

[Process-140]

Then, the film forming condition in the MOCVD method is changed, and the active layer 23 and the second compound semiconductor layer 22 are formed on the first compound semiconductor layer 21, and the second electrode 32 and the second light reflecting layer 42 are further sequentially formed. To be specific, after the active layer 23 is formed on the first compound semiconductor layer 21, using a TMG gas and a TMI gas on the basis of an epitaxial growth method, an electron barrier layer is formed using a TMG gas, a TMA gas, and a $Cp_2Mg$ gas, and a p-type GaN layer is formed using a TMG gas and a $Cp_2Mg$ gas, so that the second compound semiconductor layer 22 is obtained. Through the above processes, a laminated structural body 20 can be obtained. That is, the laminated structural body 20 made such that, on the GaN substrate 11 including the selective growth mask layer 43, the first compound semiconductor layer 21 made of the GaN-based compound semiconductor, and including the first plane 21a, and the second plane 21b facing the first plane 21a, the active layer 23 made of the GaN-based compound semiconductor, and being in contact with the second plane 21b of the first compound semiconductor layer 21, and the second compound semiconductor layer 22 made of the GaN-based compound semiconductor, including the first plane 22a, and the second plane 22b facing the first plane 22a, and having the first plane 22a be in contact with the active layer 23, are laminated is epitaxially grown. Accordingly, the structure illustrated in FIG. 3B can be obtained. Next, a current constricting layer 24 made of an insulating material having the thickness of 0.2 µm, and having an opening 24A, is formed in the second plane 22b of the second compound semiconductor layer 22 on the basis of a known method. Accordingly, the structure illustrated in FIG. 4 can be obtained. The flat second plane 22b of the second compound semiconductor layer 22 also becomes parallel to the surface 12 (C plane) of the GaN substrate 11.

Following that, the second electrode 32 and the second light reflecting layer 42 made of a multilayer film are formed on the second plane 22b of the second compound semiconductor layer 22. To be specific, for example, the second electrode 32 made of ITO with the thickness of 50 nm is formed on the second plane 22b of the second compound semiconductor layer 22 to on the current constricting layer 24 on the basis of a lift-off method, and the pad electrode 33 is further formed on the second electrode 32 to on the current constricting layer 24 on the basis of a known method. Accordingly, the structure illustrated in FIG. 5 can be obtained. Following that, the second light reflecting layer 42 is formed on the second electrode 32 to on the pad electrode 33 on the basis of a known method. Meanwhile, a first electrode 31 is formed on the other face (back surface 13) of the GaN substrate 11 on the basis of a known method. Accordingly, the structure illustrated in FIG. 1 can be obtained.

[Process-150]

Following that, the light emitting element is isolated by performing so-called element isolation, and a side surface and an exposed surface of the laminated structural body are coated with an insulating film made of $SiO_X$, for example. Then, terminals and the like for connecting the first electrode 31 and the pad electrode 33 to an external circuit and the like are formed on the basis of a known method, and are packaged or sealed, so that the light emitting element of the first embodiment is completed.

Figure 6:
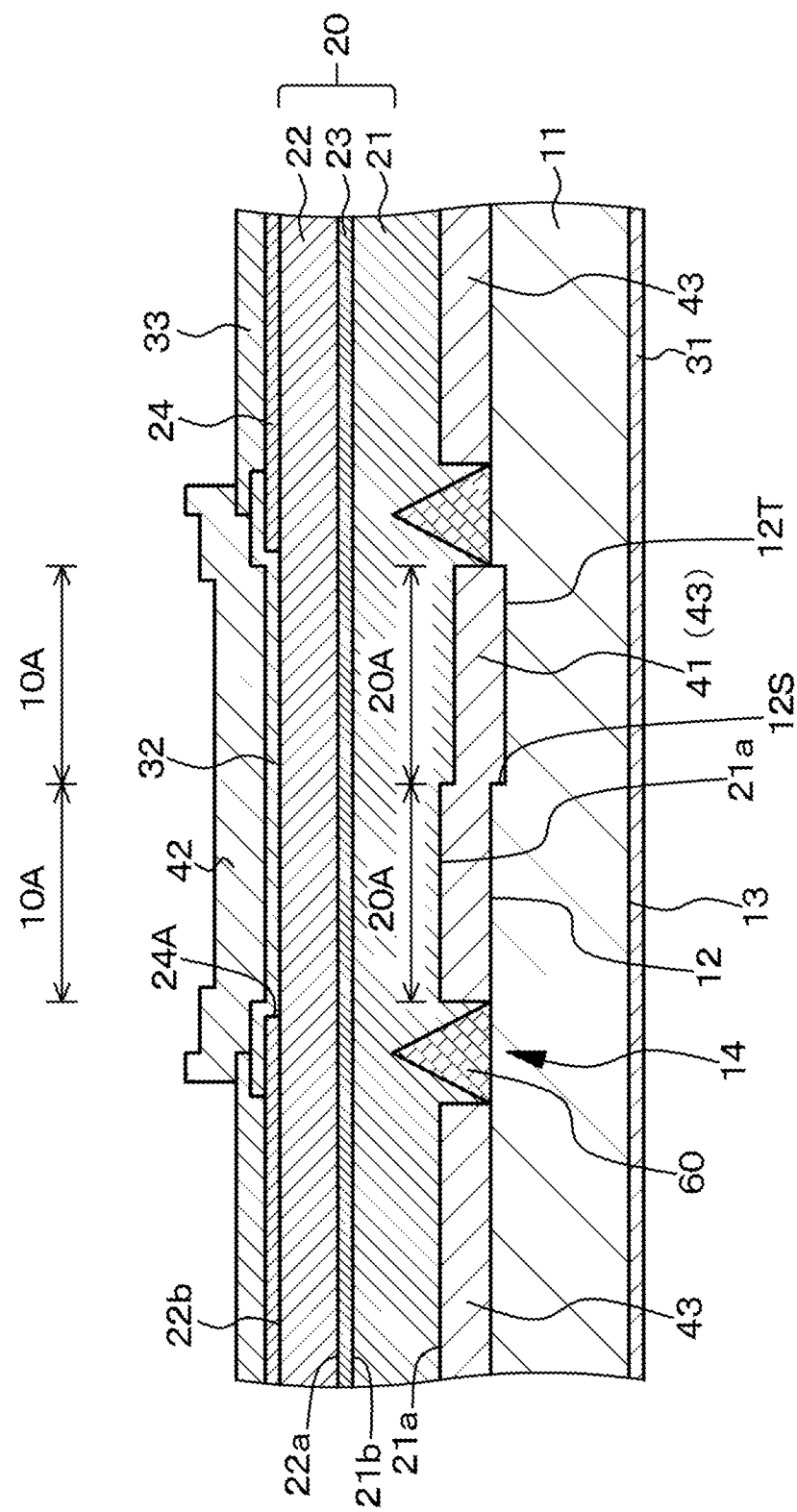
FIG. 6 is a schematic partial sectional view of a modification of the light emitting element of the first embodiment.

Note that, in the light emitting element and its manufacturing method of the first embodiment described above, the GaN substrate 11 in which the surface 12 of the GaN substrate 11 has the step-like shape is prepared, and the plane orientation of the crystal plane of the surface 12 of the GaN substrate 11 has the off angle with respect to the normal line of the surface of the GaN substrate in broad view. However, the embodiment is not limited to such an example, and as illustrated in the schematic partial sectional view in FIG. 6, by dry-etching or wet-etching the surface 12 of the GaN substrate 11, the level difference in the step-like shape may be formed in the surface 12 of the GaN substrate 11. In the example illustrated in FIG. 6, the off angle is 0 degrees.

By the way, when a light emitting element unit having a resonator length L and a light emitting element unit having a resonator length (L+ΔL) exist in one light emitting element, resonance in two vertical modes in which emission wavelengths are shifted by (2·n·ΔL/m) occurs. Here, "n" is a refractive index of the entire laminated structural body, and "m" is a positive integer. A gap amount between the vertical modes is larger than spectral widths in the vertical modes, two independent vertical modes occur. Meanwhile, when the gap amount between the vertical modes is smaller than the spectral widths in the vertical modes, the two vertical modes are connected, and apparently, one vertical mode in which the width is widened by (2·n·ΔL/m) is obtained. As a result, the apparent spectral width is increased, and coherence of light is decreased with the increase of the apparent spectral width, and speckle noise can be decreased. Therefore, by appropriately selecting ΔL, the coherence can be controlled.

Here, ΔL is defined by the total value of the portions (steps 12S) of the GaN substrate 11, the portion being equivalent to a rise, and a value of the portion (step 12S) of the GaN substrate 11, the portion being equivalent to a rise in one laminated structural body unit 20A. Therefore, by determining these values as described above, the speckle noise can be decreased.

In the light emitting element of the first embodiment, an increase amount of a full width half maximum (FWHM) that indicates widening of the spectral width of laser light output from the light emitting element becomes 0.19 nm as a result of simulation, where the number of the portions (steps 12S) of the GaN substrate 11, the portion being equivalent to a rise, is two, an average value of the lengths of the portions (terraces 12T) of the GaN substrate 11, the portion being equivalent to one tread, is 3 µm, a total value of the portions (steps 12S) of the GaN substrate 11, the portion being equivalent to a rise, is 1.57 nm, a value (average value) of the portions (steps 12S) of the GaN substrate 11, the portion being equivalent to a rise, in one laminated structural body unit 20A, is 0.78 nm. Further, a value of the full width half maximum (FWHM) calculated from a value of finesse F expressed by the following formula becomes 0.20 nm. Therefore, net full width half maximum (FWHM) of the light emitting element becomes 0.39 nm. Note that $R_1$ and $R_2$ are optical reflectance of the first light reflecting layer (0.90 is assumed as a value of the optical reflectance) and optical reflectance of the second light reflecting layer (0.95 is assumed as a value of the optical reflectance), respectively. Further, $$L=3.75\ \mu m$$

$$n=2.4$$

$$\lambda=450\ nm$$

$$m=40$$

are used, and 8.2 nm is used as vertical mode spacing (FSR). To obtain the finesse F, the same values are used below.

$$F=\pi(R_1 \times R_2)^{1/4}/\{1-(R_1 \times R_2)^{1/2}\}$$

$$=FSR/\text{FWHM}$$

Meanwhile, the increase amount of the full width half maximum (FWHM) indicating the spectral width of laser light emitted from a light emitting element of a first comparative example, of when the total value of the portions (steps 12S) of the GaN substrate 11, the portion being equivalent to a rise, is 0 nm, and the value of the portion (step 12S) of the GaN substrate 11, the portion being equivalent to a rise, in one laminated structural body unit 20A, is 0 nm, becomes 0 nm as a result of simulation. Further, the value of the full width half maximum (FWHM) calculated from the value of the finesse F becomes 0.20 nm. As described above, in the light emitting element of the first embodiment, it has been found that the spectral width of the laser light output from the light emitting element is widened.

As described above, the light emitting element of the first embodiment has a plurality of resonator lengths. Therefore, the spectral width of the output light can be widened as a result of occurrence of the resonance in a plurality of vertical modes, and occurrence of the speckle noise can be suppressed. Further, the GaN substrate is used, and thus transition less easily occurs in the compound semiconductor layer, and a problem that heat resistance of the light emitting element becomes large can be avoided, and high reliability can be provided to the light emitting element. An n-side electrode can be provided to a side different from a p-side electrode, with respect to the GaN substrate.

Note that the light emitting element of the first embodiment, or of any of the second to eleventh embodiments described below can be configured such that the spectral width of the output light is further widened as the light emitting element is caused to perform a modulation operation. That is, the light emitting element is caused to perform the modulation operation, so that chirp is caused in the light emitting element, and widening of the wavelength of the output light is caused. As a result, the spectral width of the output light is further widened.

Second Embodiment

Figure 7:
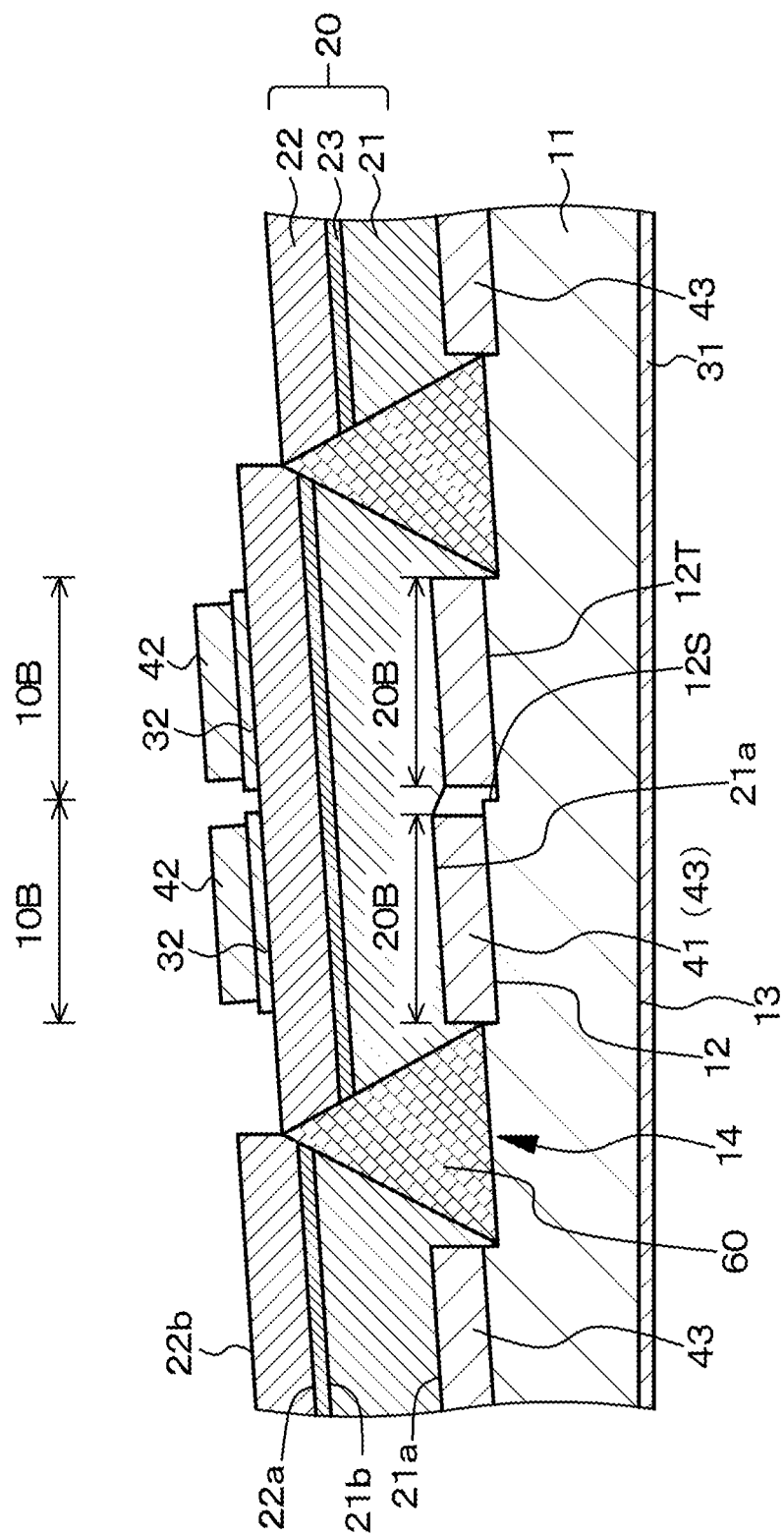
FIG. 7 is a schematic partial sectional view of a light emitting element of a second embodiment.
Figure 8:
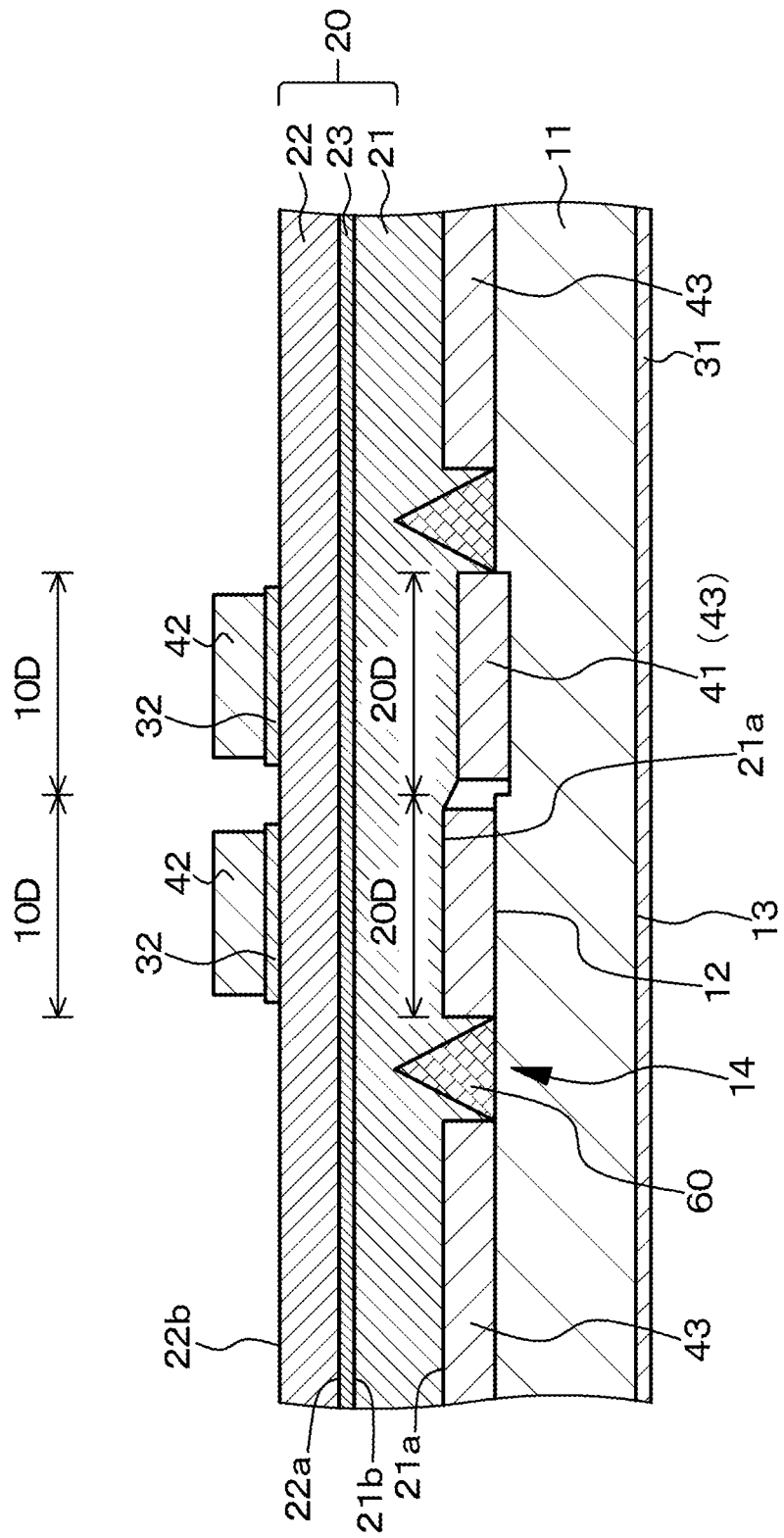
FIG. 8 is a schematic partial sectional view of a modification of the light emitting element of the second embodiment.
Figure 10:
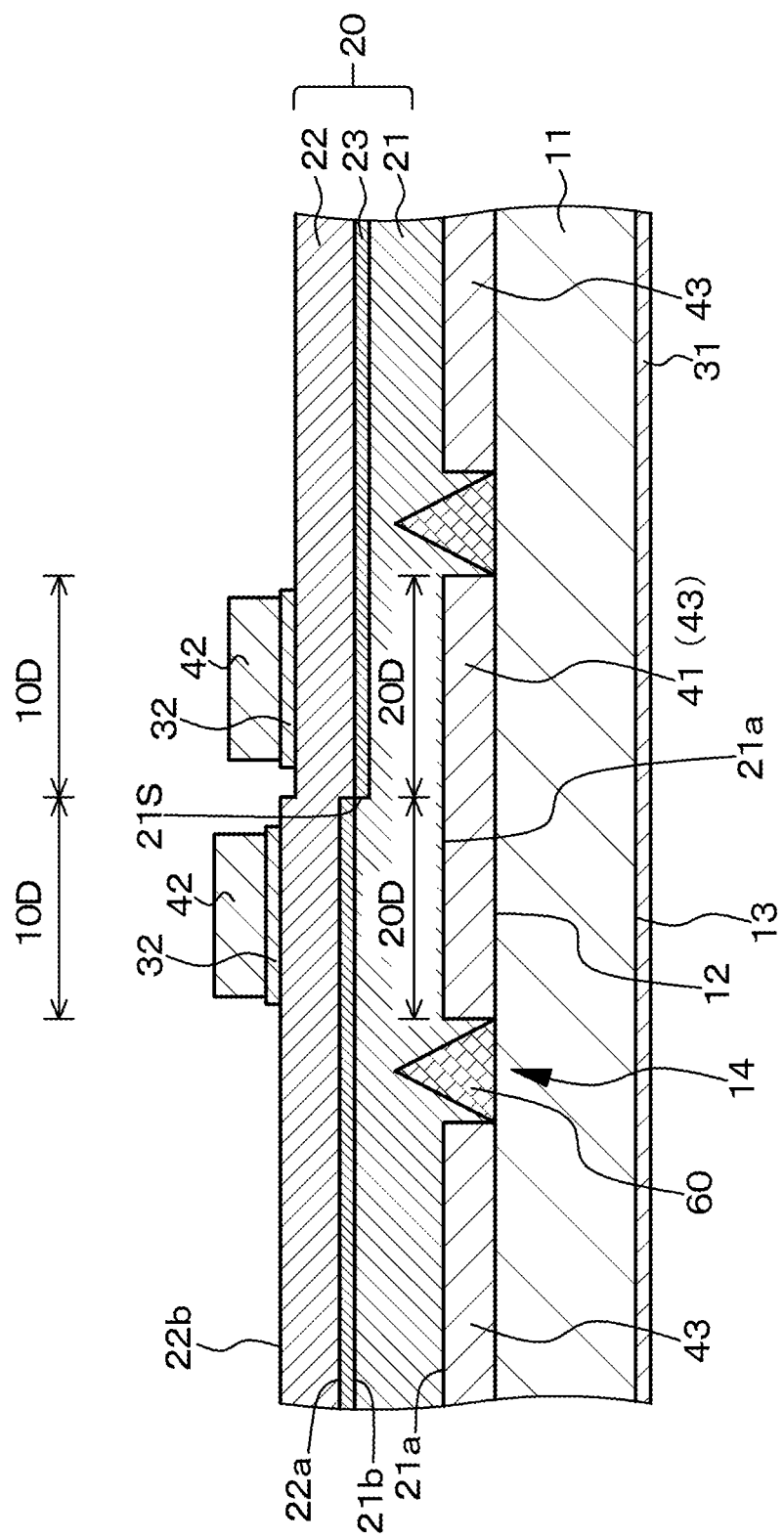
FIG. 10 is a schematic partial sectional view of a light emitting element of a fourth embodiment.

A second embodiment is a modification of the first embodiment, and relates to a light emitting element according to a combination of the first and fourth configurations of the present disclosure. As illustrated in a schematic partial sectional view in FIG. 7, in the light emitting element of the second embodiment, a second electrode 32 and a second light reflecting layer 42 are independently provided in each of light emitting element units 10B. A first light reflecting layer 41 can be common in the light emitting element units 10B, or may be independently provided in each of the light emitting element units 10B. In the illustrated example, the first light reflecting layer 41 is independently provided in each of the light emitting element units 10B. The reference number 20B illustrates a laminated structural body unit. Further, in FIGS. 7, 8, and 10, illustration of a current constricting layer 24 and a pad electrode 33 is omitted for simplification of the drawings.

An off angle of plane orientation of a crystal plane of a surface 12 of a GaN substrate 11 is 0.01 degrees or less. Here, consider a case in which the off angle is 0.0025 degrees. An average value of lengths of portions (terraces 12T) of the GaN substrate 11, the portion being equivalent to one tread, is 6 μm, and an average value of heights of portions (steps 12S) of the GaN substrate 11, the portion being equivalent to one rise, is 0.26 nm. In a case where there are six terraces, that is, six rises, in the light emitting element, a difference between a maximum value and a longest value of a resonator is 1.57 nm. As a result of simulation performed in such conditions, an increase amount of full width half maximum (FWHM) of laser light output from the light emitting element of the second embodiment becomes 0.19 nm. Further, a value of the full width half maximum (FWHM) calculated from a value of finesse F becomes 0.20 nm. Therefore, net full width half maximum (FWHM) of the light emitting element is 0.39 nm. Meanwhile, as a result of simulation performed in a light emitting element of a second comparative example in which the height of the portion (step 12S) of the GaN substrate 11, the portion being equivalent to one rise, is 0 nm, the increase amount of the full width half maximum (FWHM) of the laser light output from the light emitting element of the second comparative example becomes 0 nm. Further, the value of the full width half maximum (FWHM) calculated from the value of finesse F becomes 0.20 nm. As described above, in the light emitting element of the second embodiment, it has been found that a spectral width of the laser light output from the light emitting element is widened.

In manufacturing the light emitting element of the second embodiment or of the fourth embodiment described below, one first light reflecting layer 41 (also functions as a selective growth mask layer 43) is formed on the portion (terrace 12T) of the GaN substrate 11, the portion being equivalent to one tread, on the basis of a known method, in a process similar to [Process-110] of the first embodiment. The GaN substrate 11 is exposed between the first light reflecting layer 41 (selective growth mask layer 43) and the first light reflecting layer 41 (selective growth mask layer 43), and a first compound semiconductor layer 21 grows from a region where the GaN substrate 11 is exposed (a crystal growth start region 14).

The configuration and structure of the light emitting element of the second embodiment can be similar to the configuration and structure of the light emitting element of the first embodiment, except the above points, and the light emitting element of the second embodiment can be manufactured on the basis of a similar manufacturing method to the light emitting element of the first embodiment and thus detailed description is omitted.

Note that, in the light emitting element of the second embodiment, or of the fourth embodiment described below, light emitting element units 10B and 10D that output a plurality of types of desired wavelengths (or have desired characteristics) can be configured to emit light. To be specific, in the light emitting element of the second embodiment, or of the fourth embodiment described below, a main wire (not illustrated) extending from a drive circuit (not illustrated) for causing the light emitting element units 10B and 10D to emit light, and branch wires (not illustrated) extending from the main wire to pad electrodes 33 of the light emitting element units 10B and 10D are formed. Then, the light emitting element units 10B and 10D are caused to emit light, and wavelengths of output light are measured or characteristic evaluation is performed, and the branch wires extending to the light emitting element units 10B and 10D except the light emitting element units 10B and 10D that output the desired wavelengths (or have the desired characteristics) may just be removed by cutting. Alternatively, the main wire extending from the drive circuit for causing the light emitting element units 10B and 10D to emit light is formed, and the pad electrodes 33 of the light emitting element units 10B and 10D that output the desired wavelengths (or have the desired characteristics) and the main wire may just be electrically connected by wire bonding or the like.

Alternatively, the light emitting element of the second embodiment, or of the fourth embodiment described below can be configured to cause the light emitting element unit 10B or 10D that outputs a single desired wavelength (or has a desired characteristic) to emit light by appropriately selecting the light emitting element unit 10B or 10D. Alternatively, the light emitting element can be configured such that two or more independent vertical modes occur in the light emitting element, that is, the light emitting element can be configured to include the light emitting element units with which the light emitting element outputs clearly different wavelengths. In this case, although a decrease in the speckle noise cannot be achieved, improvement of manufacturing yield of the light emitting element that outputs the desired wavelength (or has the desired characteristic), and improvement of selectivity of the wavelength of the light output from the light emitting element can be achieved, compared with a light emitting element that is not configured from a plurality of light emitting element units.

In the light emitting element and its manufacturing method of the second embodiment described above, the GaN substrate 11 in which the surface 12 of the GaN substrate 11 has a step-like shape is prepared, and the plane orientation of the crystal plane of the surface 12 of the GaN substrate 11 has the off angle with respect to a normal line of the surface of the GaN substrate in broad view. However, the embodiment is not limited to such an example, and as illustrated in the schematic partial sectional view in FIG. 8, by dry-etching or wet-etching the surface 12 of the GaN substrate 11, a level difference in the step-like shape may be formed in the surface 12 of the GaN substrate 11. In the example illustrated in FIG. 8, the off angle is 0 degrees.

Third Embodiment

Figure 9:
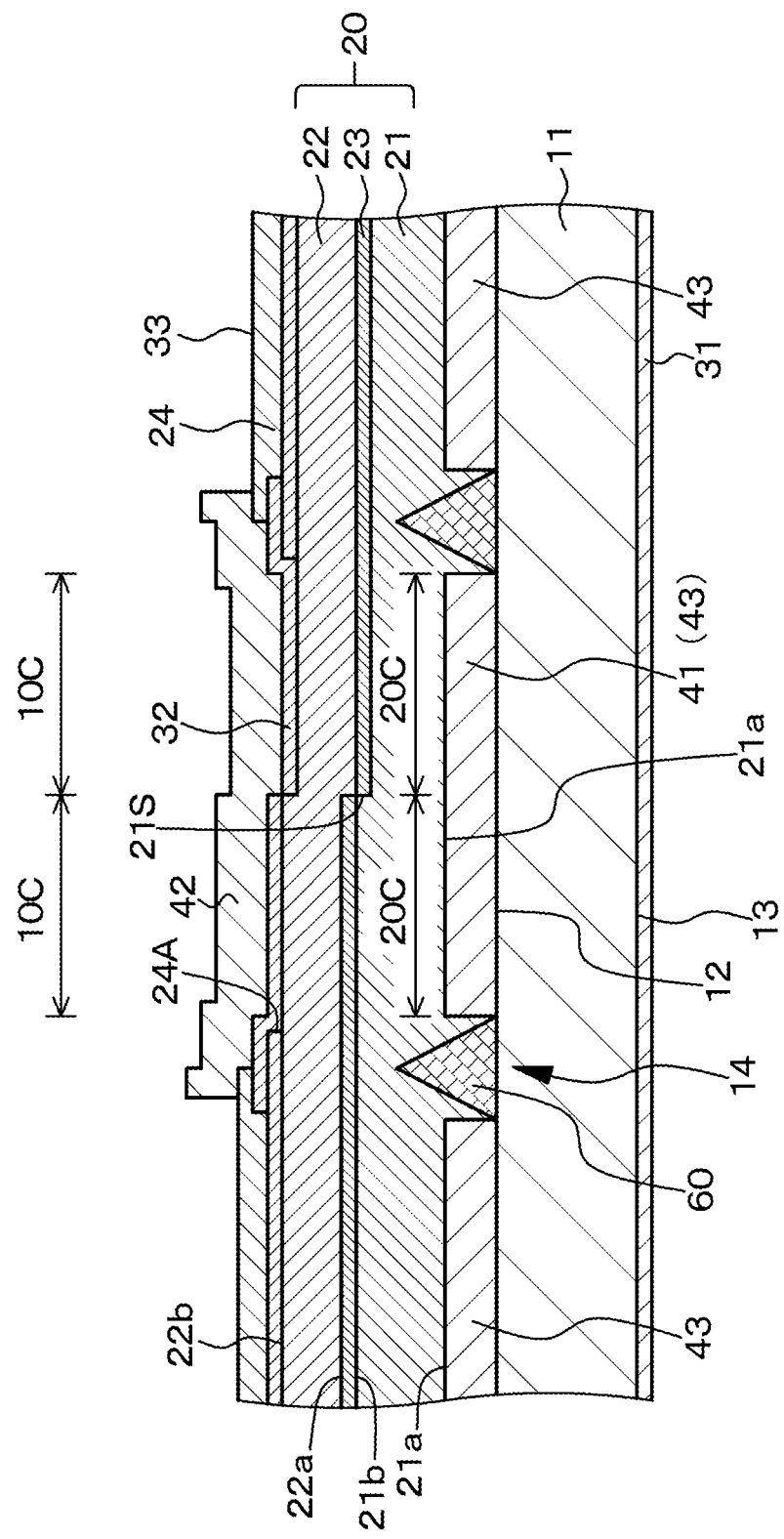
FIG. 9 is a schematic partial sectional view of a light emitting element of a third embodiment.

A third embodiment is also a modification of the first embodiment, and relates to a light emitting element according to a combination of the second and third configurations of the present disclosure. As illustrated in a schematic partial sectional view in FIG. 9, in a light emitting element of the third embodiment, a top face (second plane 21b) of a first compound semiconductor layer 21 has a step-like shape, and one laminated structural body unit 20C that configures one light emitting element unit 10C is configured from a portion of a laminated structural body 20 including the top face (second plane 21b) of the first compound semiconductor layer 21, the top face being equivalent to one tread.

An off angle of plane orientation of a crystal plane of a surface 12 of a GaN substrate 11 is 0.01 degrees or less. Then, a total value of portions 21S of the first compound semiconductor layer 21, the portion 21S being equivalent to a rise, is 40 nm or less, and favorably, from 0.2 to 10 nm, both inclusive, and a value of the portion 21S of the first compound semiconductor layer 21, the portion 21S being equivalent to a rise, in one laminated structural body unit 20C, is from 0.2 to 1 nm, both inclusive.

In the light emitting element of the third embodiment, the surface 12 of the GaN substrate 11 is roughly flat in a region of the GaN substrate 11, in which one light emitting element is to be formed. Then, in a process similar to [Process-130] of the first embodiment, after the first compound semiconductor layer 21 is formed from a seed crystal layer 60 on the basis of lateral direction epitaxial growth, the first compound semiconductor layer 21 is dry etched or wet etched, so that the thickness of the first compound semiconductor layer 21 is changed to have the step-like shape.

The configuration and structure of the light emitting element of the third embodiment can be similar to the configuration and structure of the light emitting element of the first embodiment, except the above points, and the light emitting element of the third embodiment can be manufactured on the basis of a similar manufacturing method to the light emitting element of the first embodiment and thus detailed description is omitted.

Fourth Embodiment

A fourth embodiment is a modification of the second and third embodiments, and relates to a light emitting element according to a combination of the second and fourth configurations of the present disclosure. As illustrated in a schematic partial sectional view in FIG. 10, in the light emitting element of the fourth embodiment, a second electrode 32 and a second light reflecting layer 42 are independently provided in each of light emitting element units 10D. A first light reflecting layer 41 can be common in the light emitting element units 10D, or may be independently provided in each of the light emitting element units 10D. In the illustrated example, the first light reflecting layer 41 is independently provided in each of the light emitting element units 10D. An off angle of plane orientation of a crystal plane of a surface 12 of a GaN substrate 11 is 0.01 degrees or less, similarly to the third embodiment. The reference number 20D indicates a laminated structural body unit.

The configuration and structure of the light emitting element of the fourth embodiment can be similar to the configuration and structure of the light emitting element of the third embodiment, except the above points, and the light emitting element of the fourth embodiment can be manufactured on the basis of a similar manufacturing method to the light emitting element of the third embodiment and thus detailed description is omitted.

Fifth Embodiment

A fifth embodiment relates to a light emitting element according to the second aspect of the present disclosure. As illustrated in a schematic partial sectional view in FIG. 11, in a light emitting element of the fifth embodiment, a resonator length is smoothly changed in the light emitting element. That is, the thickness of a laminated structural body 20 is smoothly changed.

Then, in the light emitting element of the fifth embodiment, a difference between a maximum value and a minimum value of the resonator length is 40 nm or less, and favorably from 0.2 to 10 nm, both inclusive, In the fifth embodiment, to smoothly change the resonator length in the light emitting element (that is, to smoothly change the thickness of the laminated structural body 20), a surface of a GaN substrate 11 is dry etched or wet etched, so that a smooth surface 12' having an off angle with respect to a crystal plane of the GaN substrate 11 is formed, and a first light reflecting layer 41 and the laminated structural body 20 are formed on the surface 12'. In the light emitting element of the fifth embodiment, the off angle of plane orientation of the crystal plane of the surface 12' of the GaN substrate 11 is 0.01 degrees or less. Then, by executing processes similar to [Process-110] to [Process-]150 of the first embodiment, the light emitting element of the fifth embodiment can be obtained. Note that, when a value of a portion (step) of a GaN substrate, the portion being equivalent to a rise, in one laminated structural body unit, is less than 0.2 nm, the laminated structural body is formed without etching a first compound semiconductor layer 21, so that the resonator length can be smoothly changed in the light emitting element (that is, the thickness of the laminated structural body can be smoothly changed).

The configuration and structure of the light emitting element of the fifth embodiment can be similar to the configuration and structure of the light emitting element of the first embodiment, except the above points, and the light emitting element of the fifth embodiment can be manufactured on the basis of a similar manufacturing method to the light emitting element of the first embodiment and thus detailed description is omitted. Note that, although illustration is omitted, the smooth surface 12' having the off angle with respect to the crystal plane of the GaN substrate 11 is formed and the first light reflecting layer 41 is formed on the surface 12', then the first compound semiconductor layer 21 is formed, and a top face (second plane 21b) of the first compound semiconductor layer 21 is dry etched or wet etched, or chemical/mechanical polishing processing (CMP processing) is applied to the top face, so that the resonator length can be smoothly changed in the light emitting element.

Figure 11:
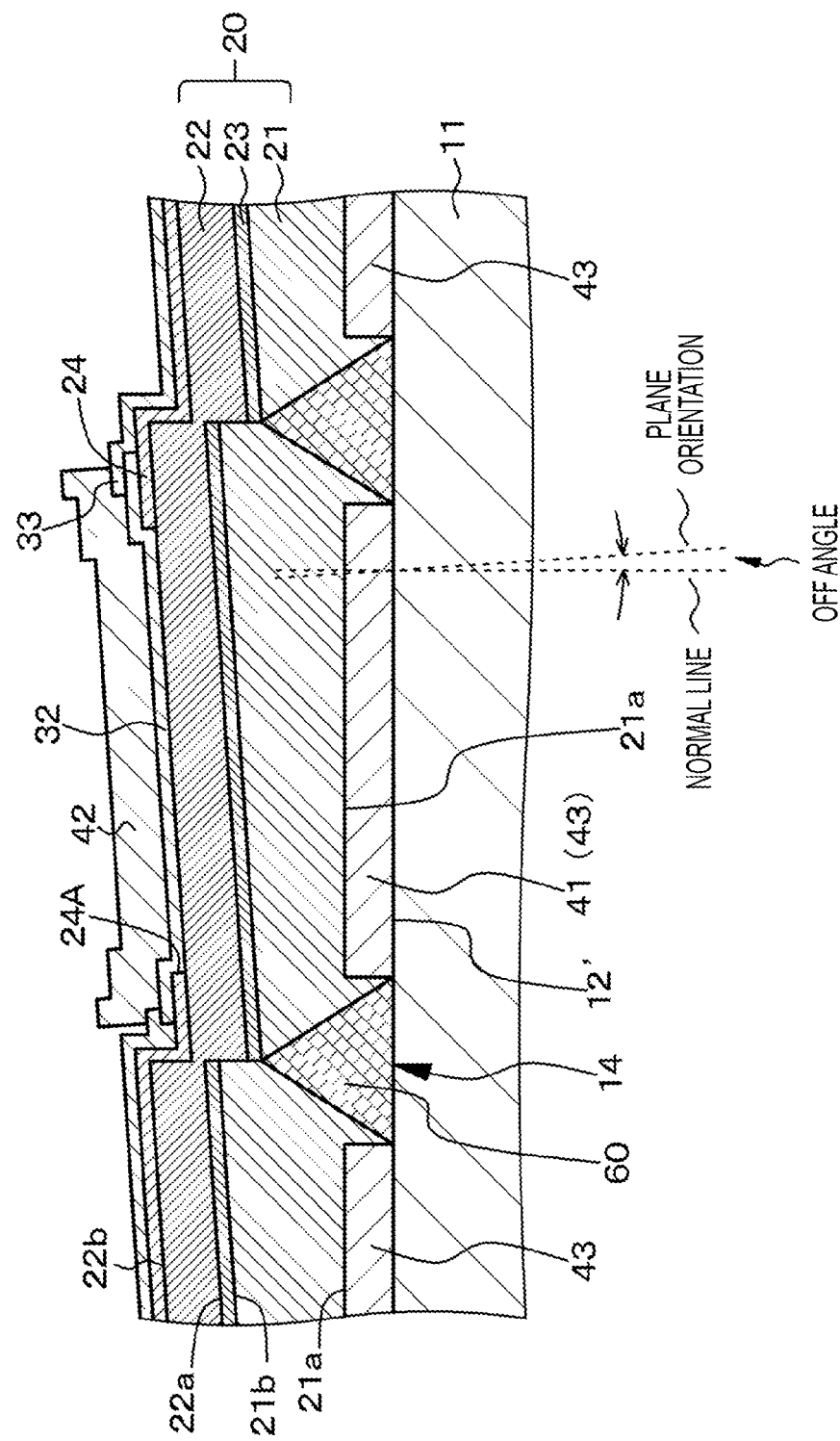
FIG. 11 is a schematic partial sectional view of a light emitting element of a fifth embodiment.

By the way, as illustrated in FIG. 11, even if the first light reflecting layer 41 and a second light reflecting layer 42 are slightly not parallel, in a photon reflected at the first and second light reflecting layers 41 and 42, and reciprocated between the first and second light reflecting layers 41 and 42, a collision point on the first light reflecting layer 41 and a collision point on the second light reflecting layer 42 are slightly moved. By the way, a distance between the first and second light reflecting layers 41 and 42 is about a wavelength of light output from the light emitting element, or more. Then, when a gap of a collision position of every one reciprocation is sufficiently smaller than the distance between the first and second light reflecting layers 41 and 42, the photon can be substantially considered to collide with the same positions of the light reflecting layers 41 and 42, and can contribute to laser oscillation. Further, if the gap of the collision position of every one reciprocation is not sufficiently smaller than the distance between the first and second light reflecting layers 41 and 42, the photon passes through an active layer 23 (that is, a gain region) many times while slightly changing the collision position, and thus can contribute to the laser oscillation. That is, when the first and second light reflecting layers 41 and 42 are not slightly parallel, the photon reciprocated between the first and second light reflecting layers 41 and 42 slightly moves the collision position in every collision with the light reflecting layers 41 and 42. A moving amount thereof is extremely smaller than the magnitude of a photo field, and it can be said that the photon can pass through the same region, and a photon field necessary for laser oscillation can be formed. Further, an emission portion has high carrier density and thus a refractive index becomes high, and a tendency of trapping light is caused. This has an effect to suppress the gap of the collision position of the photon. Note that light trapping may be performed in an intended manner and the gap of the collision position of the photon may be suppressed.

Sixth Embodiment

A sixth embodiment is a modification of the first to fifth embodiments. As illustrated in a schematic partial sectional view in FIG. 12, in a light emitting element of the sixth embodiment, that is a modification example of the light emitting element of the first embodiment, to be specific, light generated in an active layer 23 is output from a top face of a first compound semiconductor layer 21 to an outside through a first light reflecting layer 41. That is, the light emitting element of the sixth embodiment, which is made of a surface emitting laser element (vertical resonator laser, VCSEL) is a first light reflecting layer output-type light emitting element. Then, in the light emitting element of the sixth embodiment, a second light reflecting layer 42 is fixed to a support substrate 26 configured from a silicon semiconductor substrate through a bonding layer 25 made of a gold (Au) layer or a solder layer containing tin (Sn) on the basis of a solder bonding method.

In the sixth embodiment, after the active layer 23, a second compound semiconductor layer 22, a second electrode 32, and the second light reflecting layer 42 are sequentially formed on the first compound semiconductor layer 21, a GaN substrate 11 is removed using the first light reflecting layer 41 as a stopper layer. To be specific, after the active layer 23, the second compound semiconductor layer 22, the second electrode 32, and the second light reflecting layer 42 are sequentially formed on the first compound semiconductor layer 21, and then the second light reflecting layer 42 is fixed to the support substrate 26, the GaN substrate 11 is removed using the first light reflecting layer 41 as a stopper layer, and a first plane of the first compound semiconductor layer 21 and the first light reflecting layer 41 are exposed. Then, a first electrode 31 is formed on the first plane side of the first compound semiconductor layer 21.

In the light emitting element of the sixth embodiment, the first light reflecting layer 41 and the first electrode 31 are separated, that is, have an offset, and a clearance is within 1 mm, to be specific, for example, 0.05 mm on average.

Hereinafter, a method of manufacturing the light emitting element of the sixth embodiment will be described.

[Process-600]

First, by executing processes similar to [Process-100] to [Process-140] of the first embodiment, a structure illustrated in FIG. 1 is obtained. Note that, the first electrode 31 is not formed.

[Process-610]

Following that, the second light reflecting layer 42 is fixed to the support substrate 26 through the bonding layer 25.

[Process-620]

Next, the GaN substrate 11 is removed, and the first plane 21a of the first compound semiconductor layer 21 and the first light reflecting layer 41 are exposed. To be specific, first, the thickness of the GaN substrate 11 is made thin on the basis of a mechanical polishing method, then, a residual portion of the GaN substrate 11 is removed on the basis of a CMP method. Accordingly, the first plane 21a of the first compound semiconductor layer 21, the first light reflecting layer 41, and a selective growth mask layer 43 are exposed. Note that, in FIGS. 12 and 13, the state in which the first plane 21a of the first compound semiconductor layer 21 is exposed is not illustrated.

[Process-630]

Following that, the first electrode 31 is formed on the first plane side of the first compound semiconductor layer 21 on the basis of a known method. Accordingly, the light emitting element of the sixth embodiment having the structure illustrated in FIG. 12 can be obtained.

[Process-640]

Following that, the light emitting element is isolated by performing so-called element isolation, and a side surface and an exposed surface of a laminated structural body is coated with an insulating film made of $SiO_X$, for example. Then, a terminal and the like for connecting the first electrode 31 and a pad electrode 33 to an external circuit and the like is formed on the basis of a known method, and are packaged or sealed, so that the light emitting element of the sixth embodiment is completed.

In the method of manufacturing the light emitting element of the sixth embodiment, the GaN substrate is removed in a state where the first light reflecting layer and the selective growth mask layer are formed. Therefore, the first light reflecting layer and the selective growth mask layer function as a sort of stopper at the time of removal of the GaN substrate. As a result, occurrence of variation in removal of the GaN substrate can be suppressed. As a result, stability of characteristics of the obtained light emitting element can be achieved.

Figure 12:
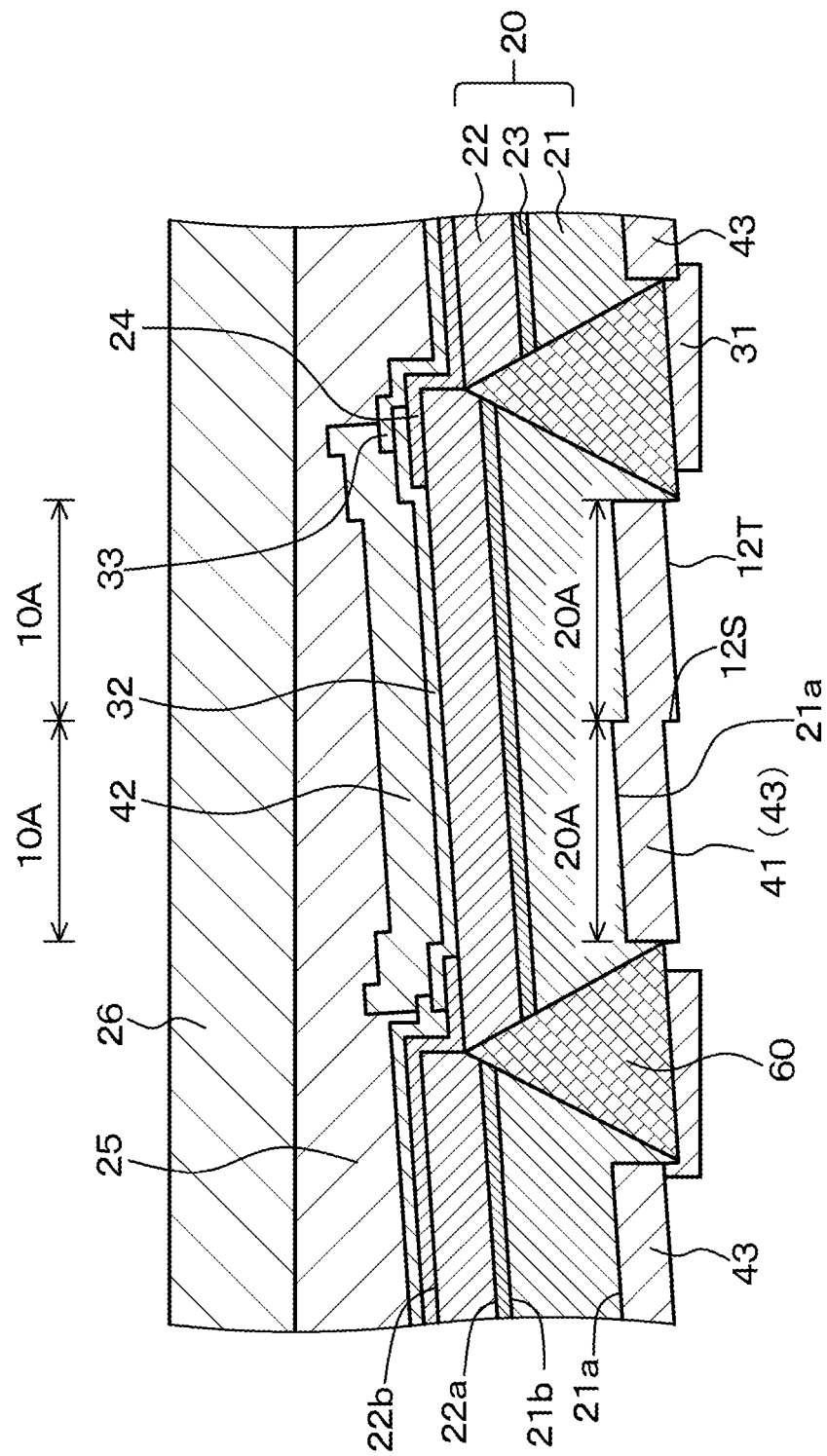
FIG. 12 is a schematic partial sectional view of a light emitting element of a sixth embodiment.
Figure 13:
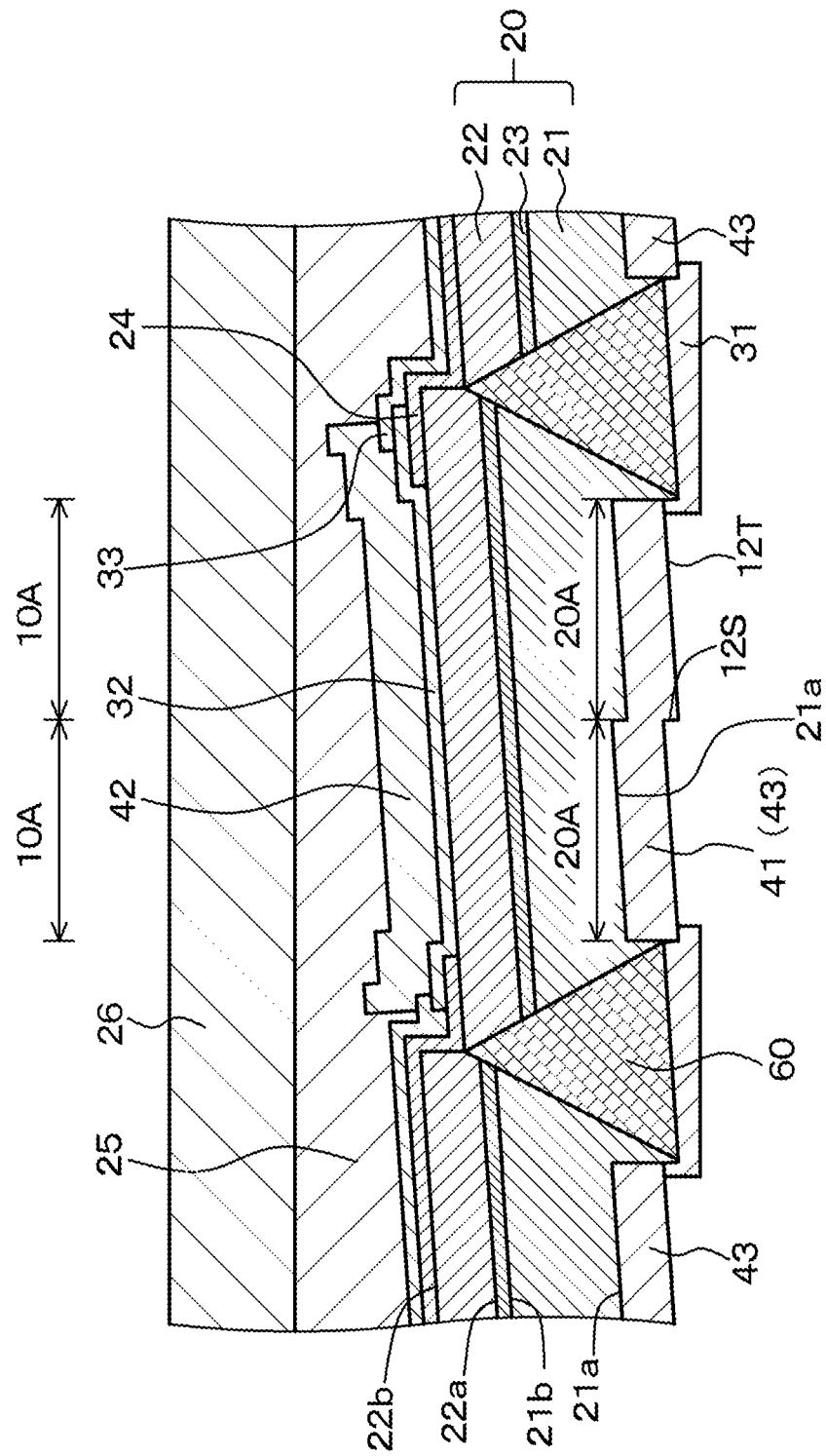
FIG. 13 is a schematic partial sectional view of a modification of the light emitting element of the sixth embodiment.

In the example of the light emitting element illustrated in FIG. 12, an end portion of the first electrode 31 is separated from the first light reflecting layer 41. Meanwhile, in the example of the light emitting element illustrated in FIG. 13, the end portion of the first electrode 31 extends up to an outer edge of the first light reflecting layer 41. Alternatively, the first electrode may be formed such that the end portion of the first electrode comes in contact with the first light reflecting layer.

It goes without saying that the configuration and structure of the light emitting element of the sixth embodiment described above can be applied to the light emitting elements described in the second to fifth embodiments.

Seventh Embodiment

Figure 14:
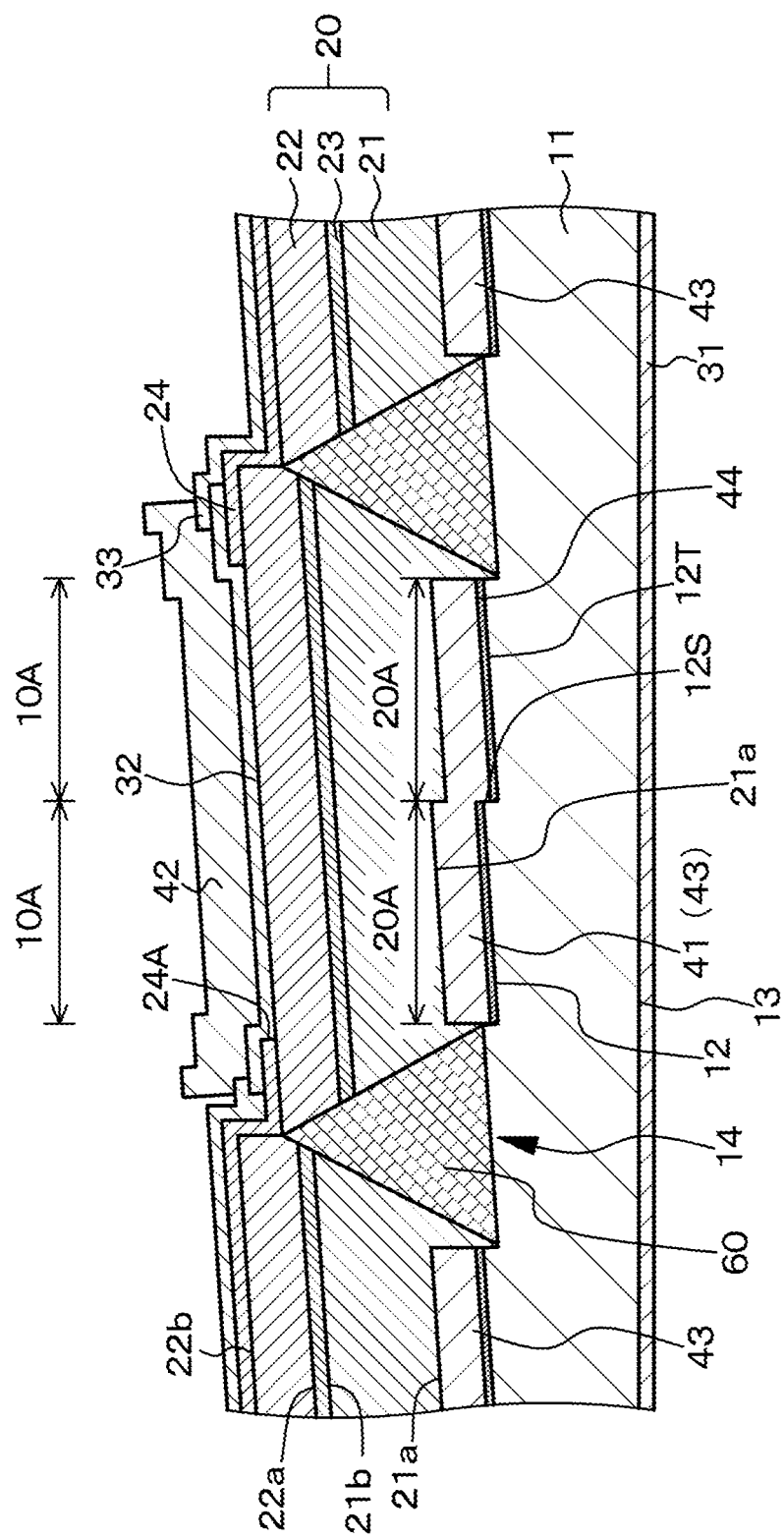
FIG. 14 is a schematic partial sectional view of a light emitting element of a seventh embodiment.

A seventh embodiment is a modification of the first to sixth embodiments, and relates to a light emitting element according to the fifth and sixth configurations of the present disclosure. As illustrated in a schematic partial sectional view in FIG. 14, in the light emitting element of the seventh embodiment described as a modification example of the light emitting element of the first embodiment, a thermal expansion mitigating film 44 is formed on a GaN substrate 11 as a lowermost layer of a selective growth mask layer 43 (the light emitting element according to the fifth configuration of the present disclosure), and a linear thermal expansion coefficient CTE of a lowermost layer (corresponding to the thermal expansion mitigating film 44) of a first light reflecting layer 41, the lowermost layer being in contact with the GaN substrate 11, satisfies:

$$1\times10^{-6}/K \leq CTE \leq 1\times10^{-5}/K,$$

favorably, $$1\times10^{-6}/K < CTE \leq 1\times10^{-5}/K$$

(the light emitting element according to the sixth embodiment of the present disclosure).

To be specific, the thermal expansion mitigating film 44 (the lowermost layer of the first light reflecting layer 41 and the selective growth mask layer 43) is made of, for example, silicon nitride ($SiN_X$) that satisfies:

$$t_1 = \lambda_0/(2n_1).$$

Note that the thermal expansion mitigating film 44 (the lowermost layer of the first light reflecting layer 41 and the selective growth mask layer 43) having such a film thickness is transparent for light with a wavelength $\lambda_0$, and does not function as a light reflecting layer. Values of CTEs of the silicon nitride ($SiN_X$) and the GaN substrate 11 are shown in Table 1. The values of the CTEs are values at 25° C.

[Table 1]
GaN substrate: $5.59\times10^{-6}$/K
Silicon nitride ($SiN_X$): 2.6 to $3.5\times10^{-6}$/K In manufacturing the light emitting element of the seventh embodiment, the selective growth mask layer 43 is formed on the GaN substrate 11 in a process similar to [Process-110] of the first embodiment. To be specific, the thermal expansion mitigating film 44 that configures the lowermost layer of the selective growth mask layer 43 is formed on the GaN substrate 11, and the residual portion (may also function as the first light reflecting layer 41) of the selective growth mask layer 43 made of a multilayer film is further formed on the thermal expansion mitigating film 44. Then, the selective growth mask layer 43 is patterned.

The configuration and structure of the light emitting element of the seventh embodiment can be similar to the configurations and structures of the light emitting elements of the first to sixth embodiments, except the above points, and the light emitting element of the seventh embodiment can be manufactured on the basis of a similar manufacturing method to the light emitting elements of the first to sixth embodiments and thus detailed description is omitted.

When a light emitting element having the lowermost layer of the selective growth mask layer 43 configured from $SiO_X$ (the CTE: 0.51 to $0.58\times10^{-6}$/K) without forming the thermal expansion mitigating film 44, and having a configuration and structure similar to the seventh embodiment, except the above selective growth mask layer 43, has been manufactured, the selective growth mask layer 43 has come off the GaN substrate 11 during film formation of a laminated structural body in some cases, although depending on manufacturing conditions. On the other hand, in the seventh embodiment, the selective growth mask layer 43 has not come off the GaN substrate 11 during film formation of the laminated structural body.

As described above, in the light emitting element and its manufacturing method of the seventh embodiment, the thermal expansion mitigating film is formed, or alternatively, the values of the CTEs are defined. Therefore, occurrence of the problem that the selective growth mask layer comes off the GaN substrate due to a difference between a linear thermal expansion coefficient of the GaN substrate and a linear thermal expansion coefficient of the selective growth mask layer can be avoided, and the light emitting element having high reliability can be provided.

Eighth Embodiment

Figure 29:
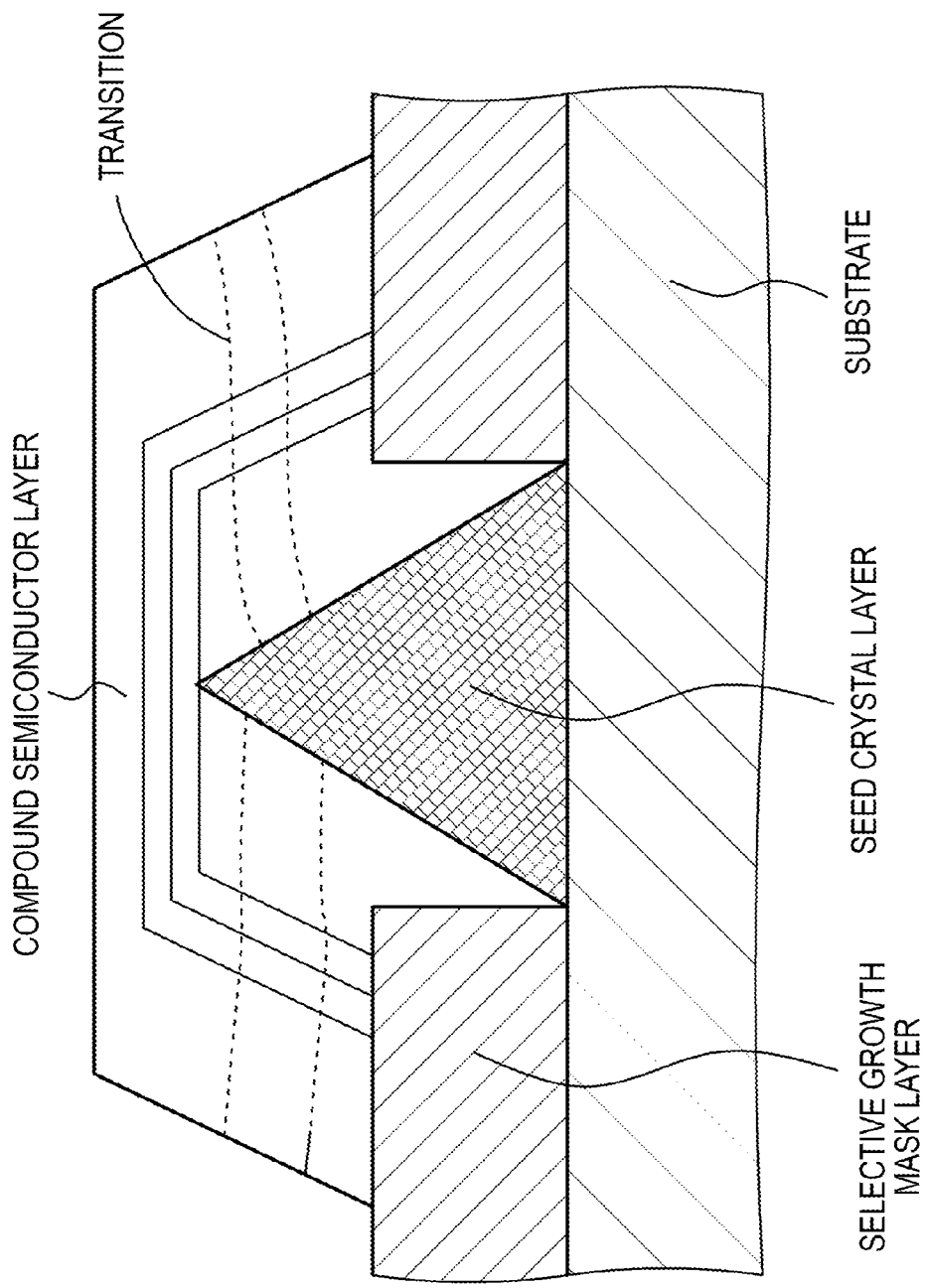
FIG. 29 is a schematic partial end view of a light emitting element for describing problems in a conventional technology.

In a case where a seed crystal layer is thick, when a compound semiconductor layer is grown from the seed crystal layer on the basis of lateral direction epitaxial growth, transition from the seed crystal layer extends up to a depth portion in a horizontal direction, of the compound semiconductor layer on a selective growth mask layer, although depending on a growth condition (see FIG. 29). As a result, characteristics of the light emitting element may be negatively affected. It can be considered to make the seed crystal layer thin by making a portion of a substrate narrow, the portion being positioned between the selective growth mask layer and the selective growth mask layer. However, in this case, formation of the selective growth mask layers with the narrow portion of the substrate positioned therebetween is difficult, and formation of the seed crystal layer is also difficult.

Figure 15:
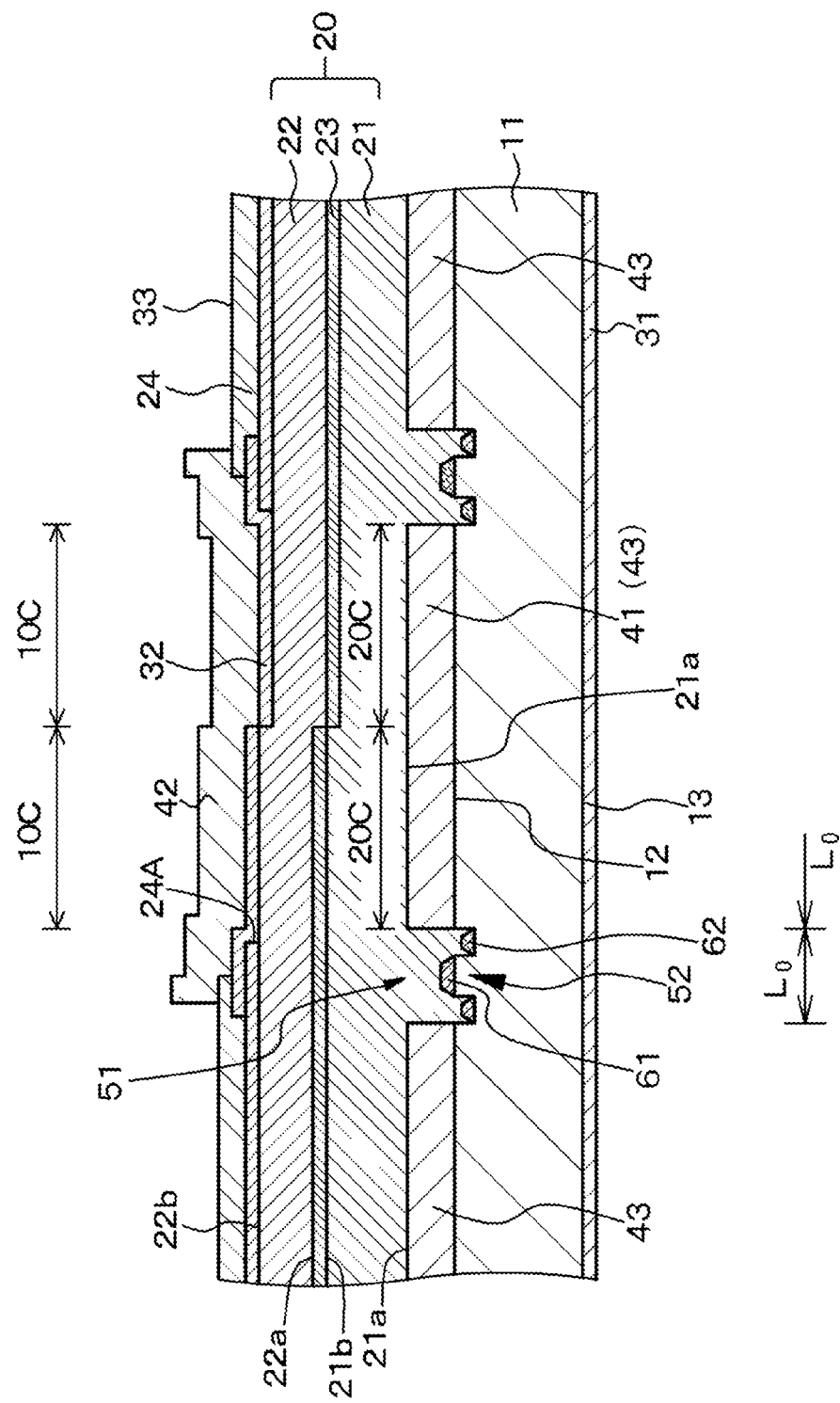
FIG. 15 is a schematic partial sectional view of a light emitting element of an eighth embodiment.
Figure 16:
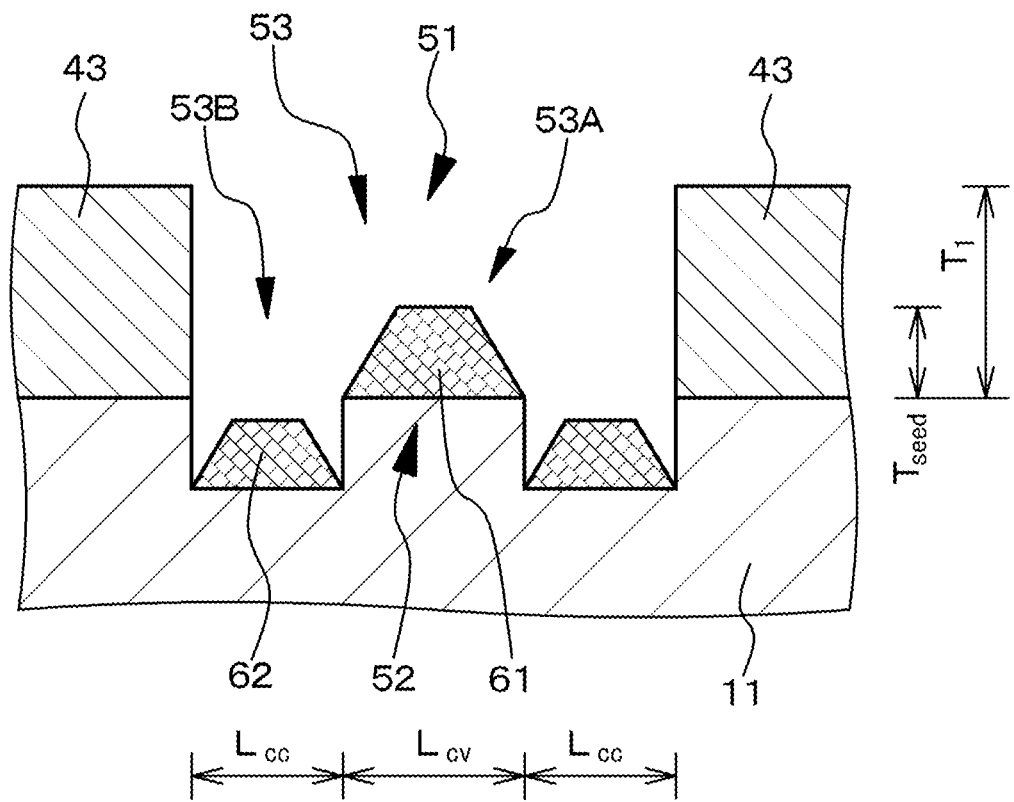
FIG. 16 is a schematic enlarged partial end view of a selective growth mask layer opening area and the like in the light emitting element of the eighth embodiment.

The eighth embodiment is a modification of the first to seventh embodiments. A schematic partial sectional view of a light emitting element of the eighth embodiment described as a modification example of the light emitting element of the third embodiment is illustrated in FIG. 15, and a schematic enlarged partial end view of a selective growth mask layer opening area and the like in the light emitting element of the eighth embodiment is illustrated in FIG. 16. In the light emitting element of the eighth embodiment, a seed crystal layer growing area 52 configured from a part of an exposed surface of a GaN substrate 11 is provided in a bottom portion of a selective growth mask layer opening area 51 positioned between a selective growth mask layer 43 and a selective growth mask layer 43, a seed crystal layer 61 is formed on the seed crystal layer growing area 52, a first compound semiconductor layer 21 is formed from the seed crystal layer 61 on the basis of lateral direction epitaxial growth, and the thickness of the seed crystal layer 61 is thinner than the thickness of the selective growth mask layer 43. Note that the thickness of the seed crystal layer 61 refers to a distance from an interface between the selective growth mask layer 43 and the GaN substrate 11 to a top face (or a peak) of the seed crystal layer 61, using the interface as a reference. Further, the thickness of the selective growth mask layer 43 refers to a distance from the interface to a top face of the selective growth mask layer 43. Similar description applies below.

A method of manufacturing the light emitting element of the eighth embodiment includes at least the processes of forming a plurality of the selective growth mask layers 43, which is provided on the GaN substrate 11 separately from one another, and one of which functions as a first light reflecting layer 41, and forming the seed crystal layer growing area 52 on a part of a surface of a portion of the GaN substrate 11, the portion being exposed to the bottom portion of the selective growth mask layer opening area 51 positioned between the selective growth mask layer 43 and the selective growth mask layer 43, then forming the seed crystal layer 61 on the seed crystal layer growing area 52, the seed crystal layer 61 being thinner than the selective growth mask layer 43, then forming the first compound semiconductor layer 21 from the seed crystal layer 61 on the basis of the lateral direction epitaxial growth, and further sequentially forming an active layer 23, a second compound semiconductor layer 22, a second electrode 31, and a second light reflecting layer 42 on the first compound semiconductor layer 21.

A section shape of the seed crystal layer 61 when cut in a virtual vertical plane can be an isosceles triangle, an isosceles trapezoid or a square. In the illustrated example, the section shape is the isosceles trapezoid.

In the light emitting element and its manufacturing method of the eighth embodiment, the seed crystal layer growing area 52 is provided, the seed crystal layer 61 is formed on the seed crystal layer growing area 52, and the thickness of the seed crystal layer 61 is thinner than that of the selective growth mask layer 43. Therefore, when the first compound semiconductor layer 21 is grown from the seed crystal layer 61 on the basis of the lateral direction epitaxial growth, extension of the transition from the seed crystal layer 61 to the first compound semiconductor layer 21 to the selective growth mask layer 43 can be reliably suppressed, and the characteristics of the light emitting element are not affected. Further, the seed crystal layer 61 can be reliably formed on the seed crystal layer growing area 52 that is a portion of the substrate, the portion being positioned between the selective growth mask layer 43 and the selective growth mask layer 43.

Note that $$0.1 \leq T_{seed}/T_1 < 1$$

is satisfied where the thickness of the seed crystal layer 61 is $T_{seed}$ and the thickness of the selective growth mask layer 43 is $T_1$. To be specific, $$T_{seed}/T_1 = 0.67$$

is satisfied. However, the embodiment is not limited to this value.

In the light emitting element of the eighth embodiment, an uneven portion 53 is formed in the exposed surface of the GaN substrate 11, the exposed surface being positioned in the bottom portion of the selective growth mask layer opening area 51 positioned between the selective growth mask layer 43 and the selective growth mask layer 43, and the seed crystal layer growing area 52 is configured from a protruding portion 53A. That is, the protruding portion 53A corresponds to the part of the exposed surface of the GaN substrate 11. Then, a section shape of the exposed surface of the GaN substrate 11 positioned in the bottom portion of the selective growth mask layer opening area 51 when the light emitting element is cut in a virtual vertical plane is a shape in which a recessed portion 53B, the protruding portion 53A, and a recessed portion 53B are arranged side by side in the order. Further, the seed crystal layer growing area 52 is configured from a top face of the protruding portion 53A, and $$0.2 \leq L_{cv}/(L_{cv}+L_{cc}) \leq 0.9$$

is satisfied, where the length of the protruding portion 53A in the virtual vertical plane is $L_{cv}$ and the total length of the recessed portions 53B is $L_{cc}$. To be specific, $$L_{cv}/(L_{cv}+L_{cc})=0.7$$

is satisfied. The number of the protruding portions 53A formed in the exposed surface portion of the GaN substrate, the exposed surface portion being positioned in the bottom portion of the selective growth mask layer opening area 51, may be two or more. Examples of the section shape of the recessed portion 53B when the recessed portion 53B is cut in the virtual vertical plane include, a square, a triangle, a trapezoid (an upper side serves as a bottom surface of the recessed portion), shapes with round corner portions of the aforementioned shapes, and a fine uneven shape. As the depth of the recessed portion 53B, 0.1 μm or more, and favorably 0.5 μm or more can be exemplified.

Further, in the light emitting element of the eighth embodiment, a section shape of the seed crystal layer 61 (to be specific, a section shape of the seed crystal layer 61 in the virtual vertical plane) is an isosceles trapezoid [an inclined angle of a leg portion (inclined surface): 58 degrees]. Note that a crystal plane of the leg portion (inclined surface) of the isosceles trapezoid is a {11-22} plane. Further, in the light emitting element of the eighth embodiment, $$D_1/D_0 \leq 0.2$$

is satisfied, where the length of the selective growth mask layer opening area 51 when the light emitting element is cut in the virtual vertical plane is $L_0$, transition density in a region of a first compound semiconductor layer 21 positioned above the selective growth mask layer opening area 51 in the virtual vertical plane is $D_0$, and transition density in a region of the first compound semiconductor layer 21 from an edge of the selective growth mask layer 43 to a distance $L_0$ in the virtual vertical plane is $D_1$.

Hereinafter, a method of manufacturing the light emitting element of the eighth embodiment will be described with reference to FIGS. 17A, 17B, 17C, 18A, and 18B, which are schematic partial end views of the substrate and the like.

[Process-800]

Figure 17A:
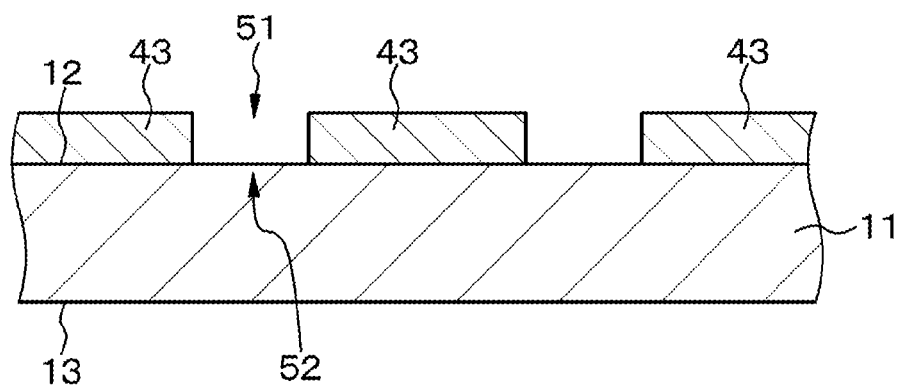
FIGS. 17A to 17C are schematic partial end views of a substrate and the like for describing a method of manufacturing the light emitting element of the eighth embodiment.
Figure 17B:
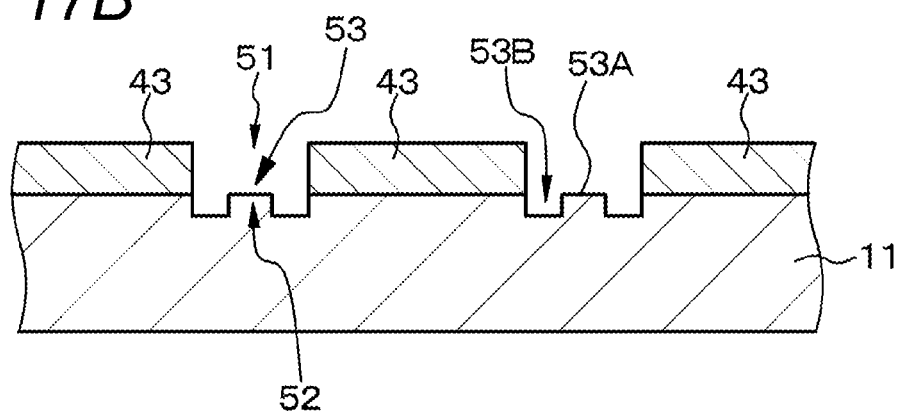
Figure 17C:
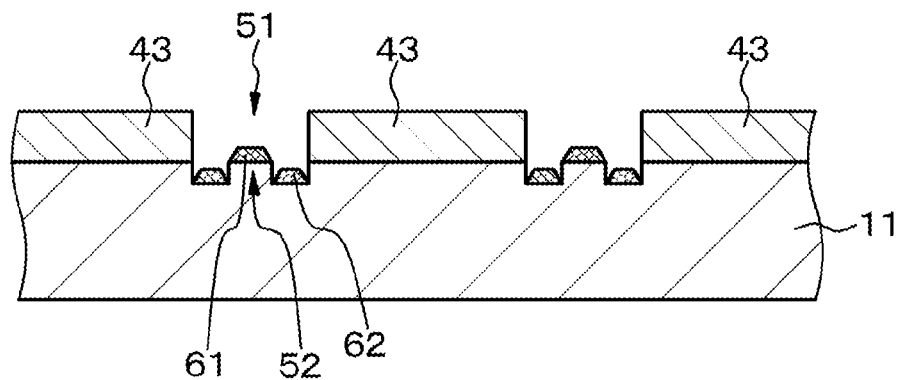

First, by executing processes similar to [Process-100] and [Process-110] of the first embodiment, the plurality of selective growth mask layers 43 that is provided on the GaN substrate 11 separately from one another, and one of which functions as the first light reflecting layer 41, is formed, and the seed crystal layer growing area 52 is formed on apart of the surface of the portion of the GaN substrate 11, the portion being exposed to the bottom portion of the selective growth mask layer opening area 51 positioned between the selective growth mask layer 43 and the selective growth mask layer 43 (see FIG. 17A).

[Process-810]

Following that, an etching mask is formed on the selective growth mask layer opening area 51 on the basis of a known method, and the portion in the selective growth mask layer opening area 51, on which the protruding portion 53A is to be formed, is coated with the etching mask. The portion of the GaN substrate 11, on which the recessed portions 53B are to be formed, remains exposed. Then, the portion of the GaN substrate 11, on which the recessed portions 53B are to be formed, is etched, and the etching mask is removed, on the basis of a known method. Accordingly, the state illustrated in FIG. 17B can be obtained. That is, the uneven portion 53 is formed in the exposed surface of the GaN substrate 11, the exposed surface being positioned in the bottom portion of the selective growth mask layer opening area 51, and the seed crystal layer growing area 52 is configured from the protruding portion 53A. After the uneven portion 53 is formed, the selective growth mask layer 43 may be formed.

[Process-820]

Next, the seed crystal layer 61, which is thinner than the selective growth mask layer 43, is formed on the seed crystal layer growing area 52. To be specific, the seed crystal layer 61 is formed on the seed crystal layer growing area 52, using an MOCVD device on the basis of an MOCVD method using a TMG gas and an $SiH_4$ gas. The section shape of the seed crystal layer 61 in the virtual vertical plane is an isosceles trapezoid [the inclined angle of the leg portion (inclined surface): 58 degrees], although depending on a film forming condition in the MOCVD method. Accordingly, the state illustrated in FIG. 17C can be obtained. Note that the seed crystal 62 having the isosceles trapezoid section shape is also generated on bottom surfaces of the recessed portions 53B. Further, in [Process-810], after the portion of the GaN substrate 11 is etched and the recessed portions 53B are formed, if a fine uneven portion is formed in the bottom surfaces of the recessed portions 53B by roughing the bottom surfaces of the recessed portions 53B, the seed crystal is less easily generated on such bottom surfaces of the recessed portions 53B.

[Process-830]

Figure 18A:
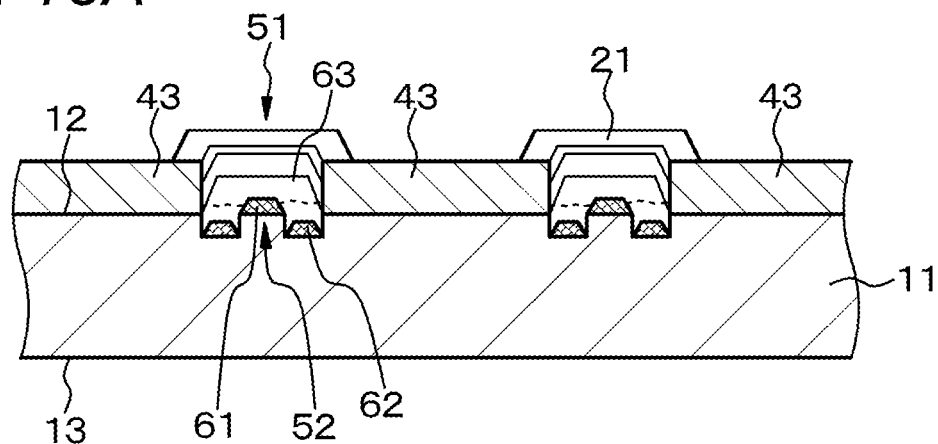
FIGS. 18A and 18B are schematic partial end views of a substrate and the like for describing the method of manufacturing the light emitting element of the eighth embodiment, following FIG. 17C.
Figure 18B:
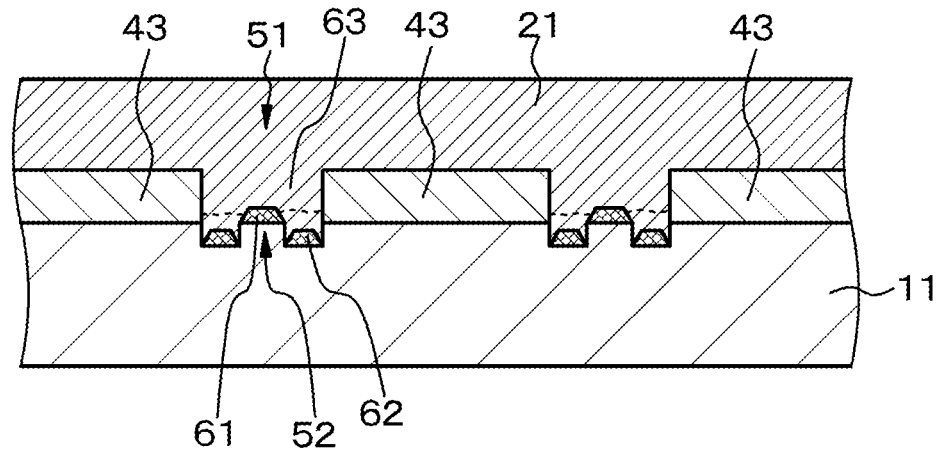

Then, the film forming condition in the MOCVD method is changed, and the first compound semiconductor layer 21 is formed from the seed crystal layer 61 on the basis of lateral direction epitaxial growth. A state in the middle of formation of the first compound semiconductor layer 21 is illustrated in FIG. 18A, and a state after completion of the formation of the first compound semiconductor layer 21 is illustrated in FIG. 18B. In FIG. 18A, shading of the first compound semiconductor layer 21 is omitted. The reference number 63 indicates transition extending from the seed crystal layer 61 in an approximately horizontal direction. Since the thickness of the seed crystal layer 61 is thinner than the thickness of the selective growth mask layer 43, the transition 63 roughly extends to a side wall of the selective growth mask layer 43 and stops there, and does not extend to a portion of the first compound semiconductor layer 21 formed on the selective growth mask layer 43.

[Process-840]

Following that, by executing processes similar to [Process-140] to [Process-150] of the first embodiment, the light emitting element of the eighth embodiment can be obtained.

Figure 19:
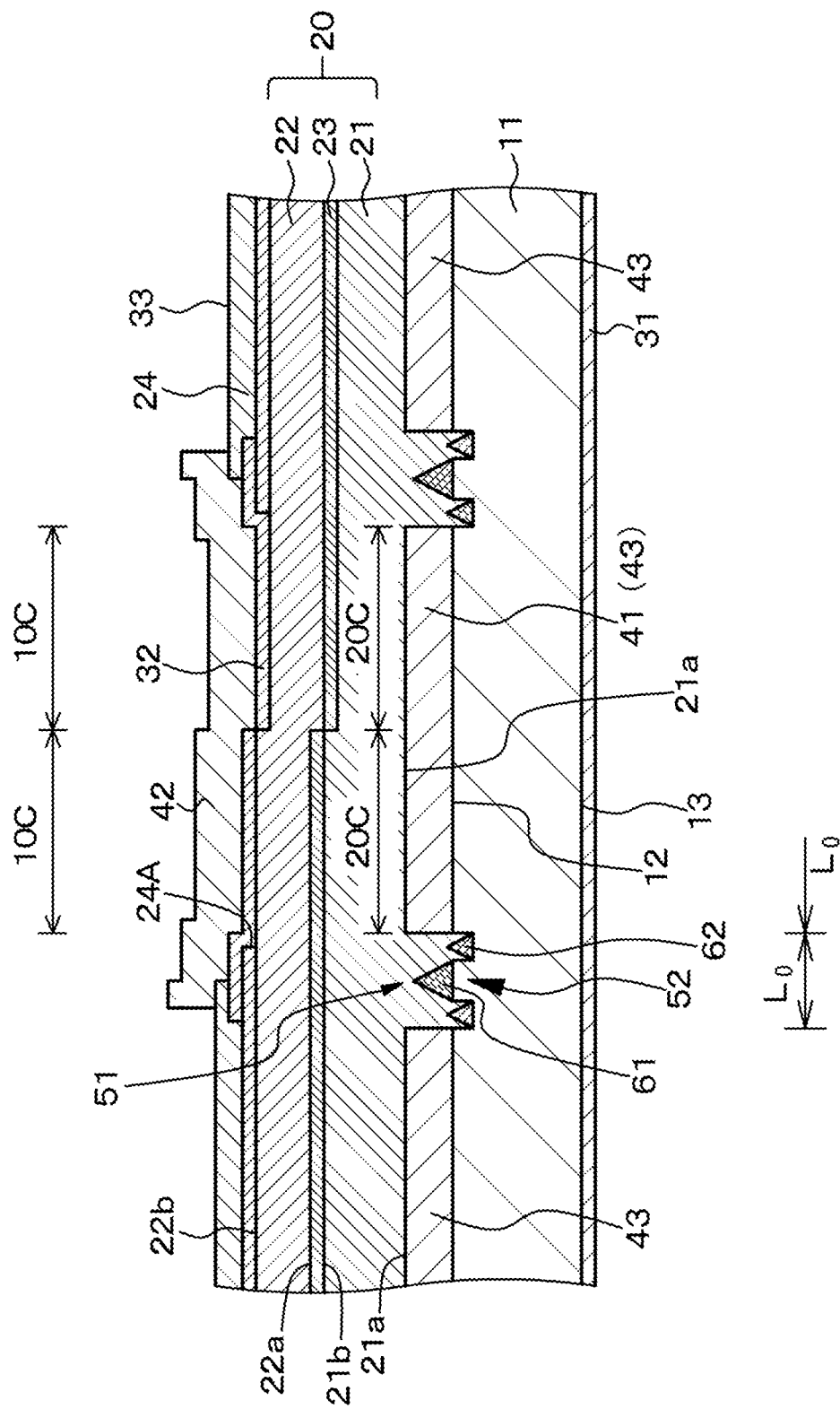
FIG. 19 is a schematic partial sectional view of a modification of the light emitting element of the eighth embodiment.
Figure 20:
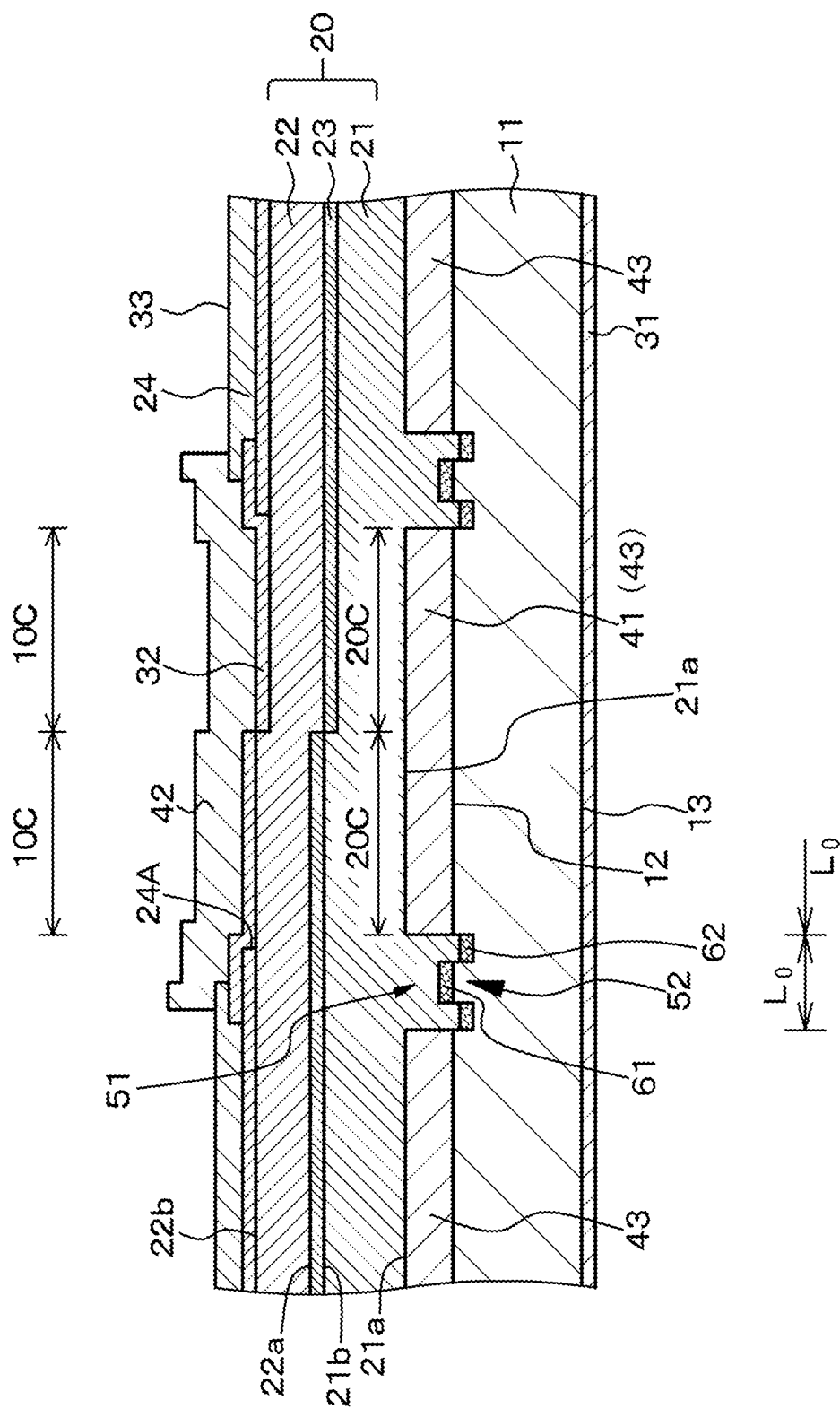
FIG. 20 is a schematic partial sectional view of another modification of the light emitting element of the eighth embodiment.

The section shape of the seed crystal layer 61 is not limited to the isosceles trapezoid, and the schematic partial end view can be formed into an isosceles triangle or into a square, as illustrated in FIGS. 19 and 20. In a case where the section shape of the seed crystal layer 61 is the isosceles triangle, crystal growth of the seed crystal layer 61 may just be caused to further proceed beyond the section shape being the isosceles trapezoid. In a case where the section shape of the seed crystal layer 61 is the square, a forming condition of the seed crystal layer 61 may just be made different from a forming condition for forming the section shape of the seed crystal layer 61 into the isosceles trapezoid.

Ninth Embodiment

Figure 21:
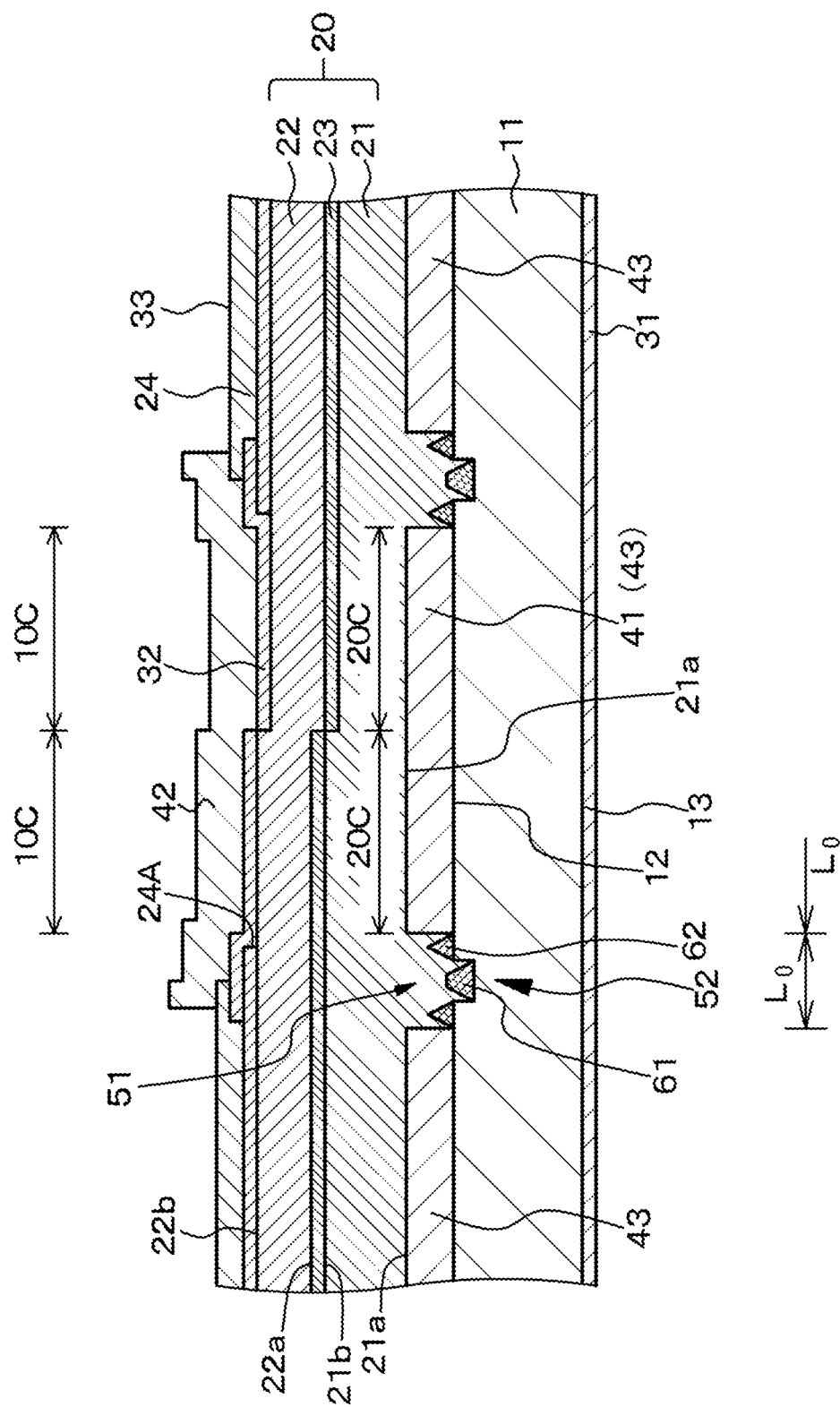
FIG. 21 is a schematic partial sectional view of a light emitting element of a ninth embodiment.
Figure 22:
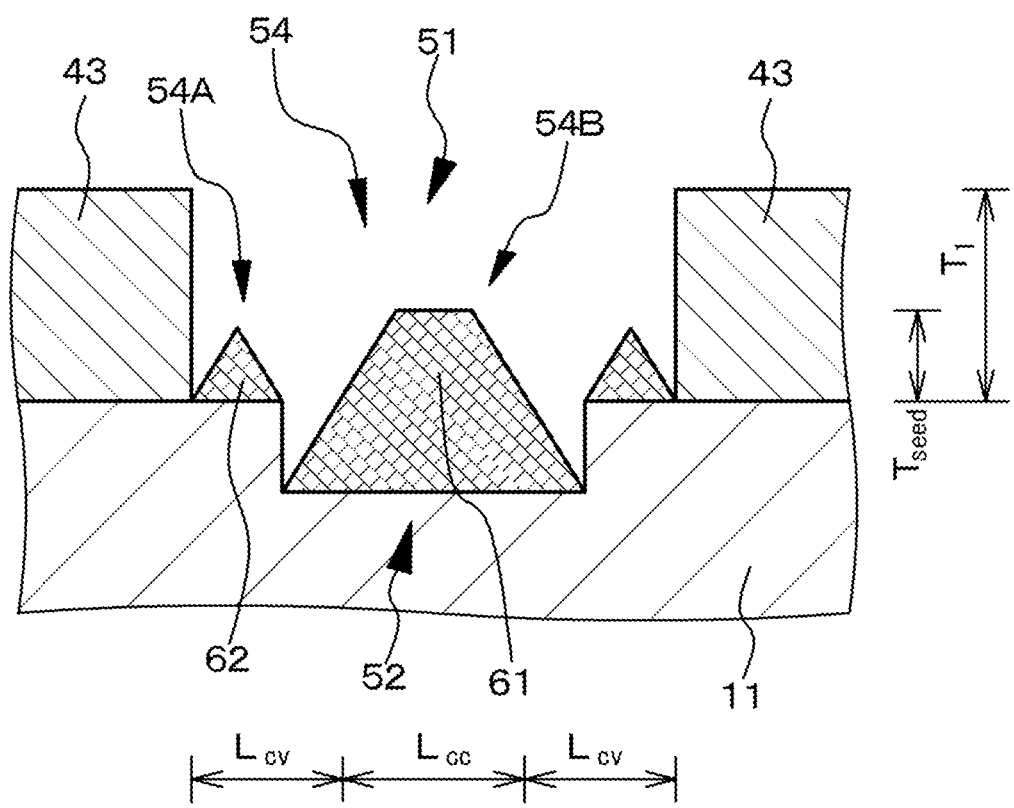
FIG. 22 is a schematic enlarged partial end view of a selective growth mask layer opening area and the like in the light emitting element of the ninth embodiment.

A ninth embodiment is a modification of the eighth embodiment. As illustrated in a schematic partial sectional view in FIG. 21, and in a schematic enlarged partial end view of a selective growth mask layer opening area and the like in FIG. 22, in a light emitting element of the ninth embodiment, an uneven portion 54 is formed in an exposed surface of a GaN substrate 11, the exposed surface being positioned in a bottom portion of a selective growth mask layer opening area 51 positioned between a selective growth mask layer 43 and a selective growth mask layer 43, and a seed crystal layer growing area 52 is configured from a recessed portion 54B. That is, the recessed portion 54B corresponds to a part of the exposed surface of the GaN substrate 11. Then, a section shape of the exposed surface of the GaN substrate 11, the exposed surface being positioned in the bottom portion of the selective growth mask layer opening area 51 when the light emitting element is cut in a virtual vertical plane, is a shape in which a protruding portion 54A, the recessed portion 54B, and a protruding portion 54A are arranged side by side in that order. Further, the seed crystal layer growing area 52 is configured from a bottom surface of the recessed portion 54B, and $$0.2 \leq L_{cc}/(L_{cv}+L_{cc}) \leq 0.9$$

is satisfied, where the length of the recessed portion 54B in the virtual vertical plane is $L_{cc}$ and the total length of the protruding portions 54A is $L_{cv}$. To be specific, $$L_{cc}/(L_{cv}+L_{cc})=0.7$$

is satisfied. The number of the recessed portions 54B formed in the exposed surface portion of the GaN substrate, the exposed surface portion being positioned in the bottom portion of the selective growth mask layer opening area 51, may be two or more. Examples of a shape of a top face of the protruding portion 54A when the protruding portion 54A is cut in the virtual vertical plane include a flat shape, a shape curving upward, a shape curving downward, and a fine uneven shape. As the depth of the recessed portion 54B, 0.1 µm or more, and favorably, 0.5 µm or more can be exemplified.

The configuration and structure of the light emitting element of the ninth embodiment can be similar to the configuration and structure of the light emitting element of the eighth embodiment, except the above points, and a method of manufacturing the light emitting element of the ninth embodiment can be substantially similar to the method of manufacturing the light emitting element of the eighth embodiment and thus detailed description is omitted.

Note that, after the selective growth mask layer 43 is patterned and the GaN substrate 11 is exposed, a fine uneven portion is formed in the exposed surface of the GaN substrate 11, and following that, if the recessed portion 54B is formed, seed crystal is less easily generated on top faces of the protruding portions 54A, where the uneven portion is formed.

Tenth Embodiment

Figure 23:
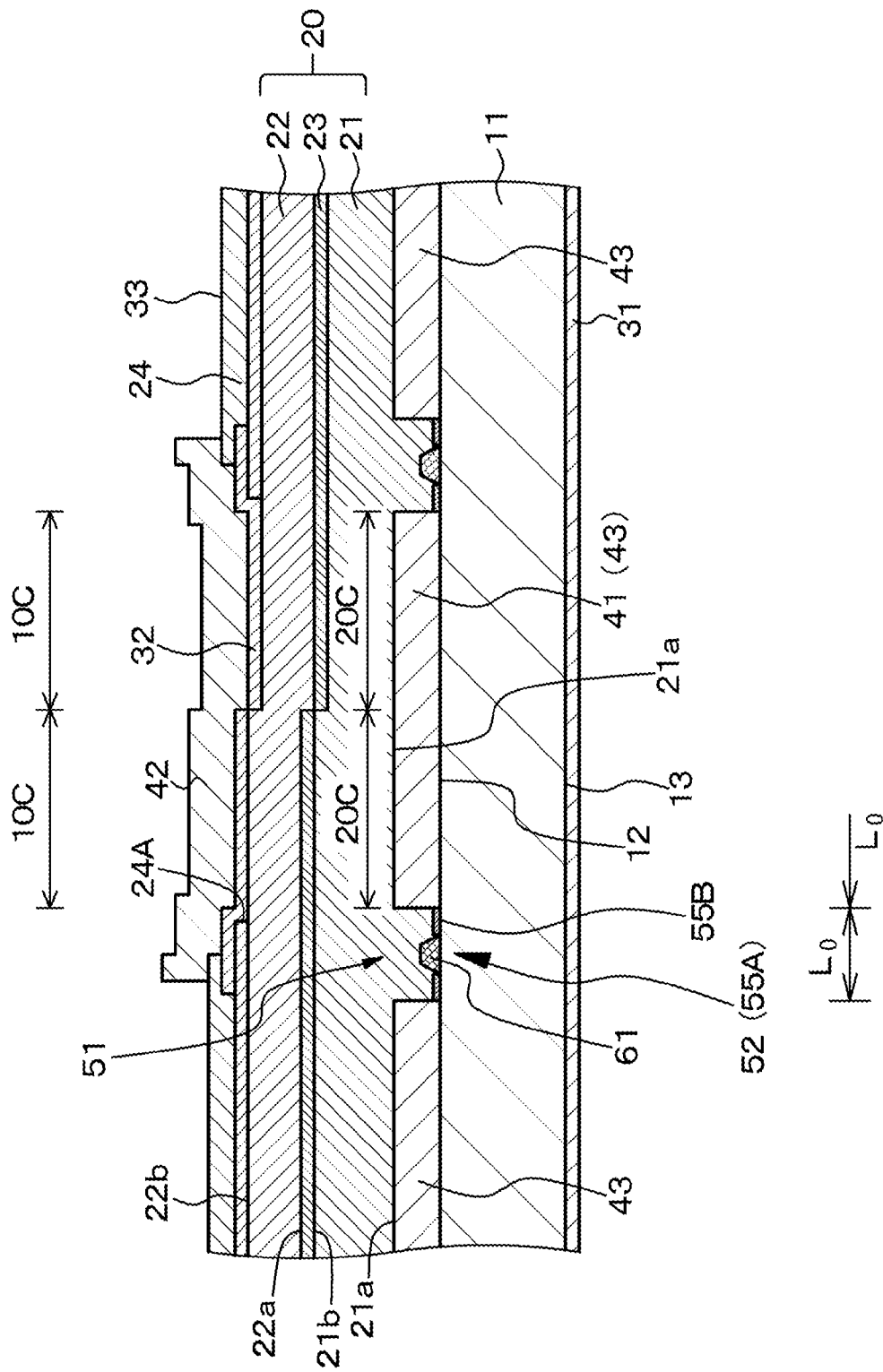
FIG. 23 is a schematic partial sectional view of a light emitting element of a tenth embodiment.
Figure 24:
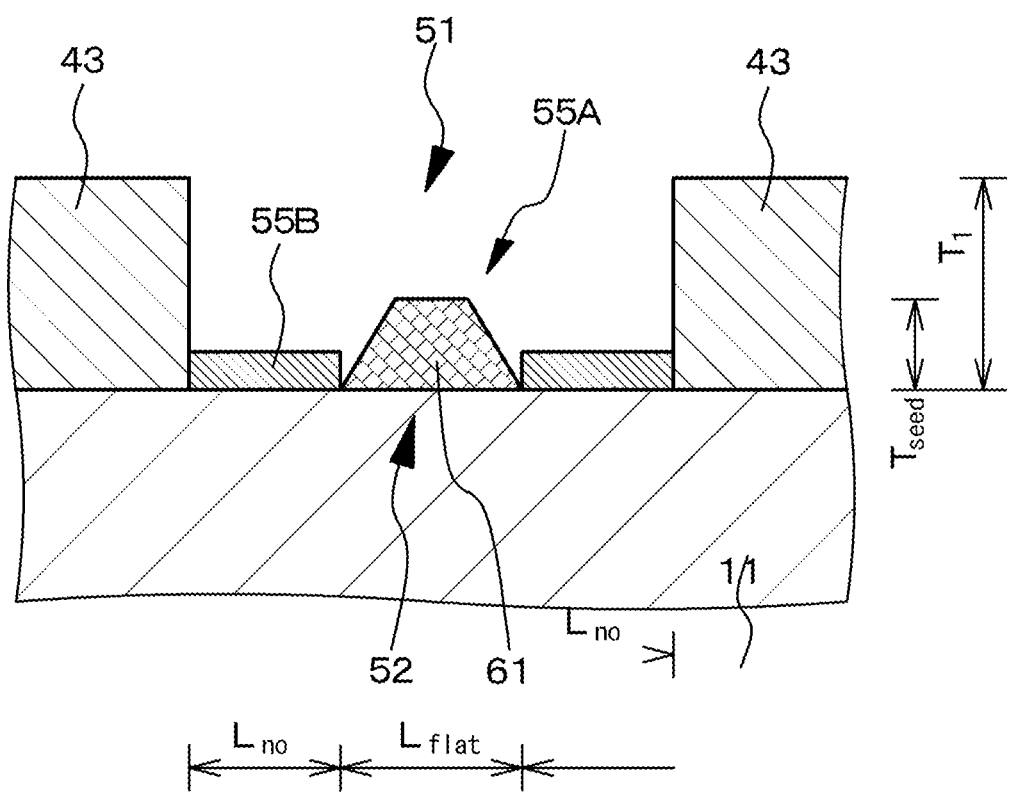
FIG. 24 is a schematic enlarged partial end view of a selective growth mask layer opening area and the like in the light emitting element of the tenth embodiment.

A tenth embodiment is also a modification of the eighth embodiment. As illustrated in a schematic partial sectional view in FIG. 23, and in a schematic enlarged end view of a selective growth mask layer opening area in FIG. 24, in a light emitting element of the tenth embodiment, a section shape of an exposed surface of an GaN substrate 11, the exposed surface being positioned in a bottom portion of a selective growth mask layer opening area 51 when the light emitting element is cut in a virtual vertical plane, is a shape in which a non-crystal growth layer 55B, a flat portion 55A, and a non-crystal growth layer 55B are arranged side by side in that order, and a seed crystal layer growing area 52 is configured from the flat portion 55A. That is, the flat portion 55A corresponds to a part of the exposed surface of the GaN substrate. Then, $$0.2 \leq L_{flat}/(L_{flat}+L_{no}) \leq 0.9$$

is satisfied, where the length of the flat portion 55A in the virtual vertical plane is $L_{flat}$ and the total length of the non-crystal growth layers 55B is $L_{nov}$. To be specific, $$L_{flat}/(L_{flat}+L_{no})=0.7$$

is satisfied. Further, the non-crystal growth layers 55B are configured from silicon nitride ($SiN_X$). The number of the flat portions 55A in the exposed surface portion of the GaN substrate, the exposed surface portion being positioned in the bottom portion of the selective growth mask layer opening area 51, may be two or more. In a case where the non-crystal growth layer 55B is formed on an uppermost layer of the selective growth mask layer 43 (a layer being in contact with a first compound semiconductor layer 21), $$t_2=\lambda_0/(4n_2)$$

is favorably satisfied, and further, $$t_2=\lambda_0/(2n_2)$$

is desirably satisfied, where the thickness of the non-crystal growth layer 55B (the uppermost layer of the selective growth mask layer 43) is $t_2$, and a refractive index of the non-crystal growth layer 55B is $n_2$.

To be specific, in the tenth embodiment, a lift-off mask is formed on the selective growth mask layer opening area 51 on the basis of a known method, and the portion in the selective growth mask layer opening area 51, where the flat portion 55A is to be formed, is coated with the lift-off mask. The portion of the GaN substrate 11, where the non-crystal growth layers 55B are to be formed, remains exposed. Then, after the non-crystal growth layer 55B is formed on the entire surface on the basis of a known method, the lift-off mask and the non-crystal growth layer 55B formed thereon are removed.

The configuration and structure of the light emitting element of the tenth embodiment can be similar to the configuration and structure of the light emitting element of the eighth embodiment, except the above points, and a method of manufacturing the light emitting element of the tenth embodiment can be substantially similar to the method of manufacturing the light emitting element of the eighth embodiment and thus detailed description is omitted.

Note that the non-crystal growth layers 55B and the flat portion 55A extending from the lowermost layer or a lower layer of the selective growth mask layer may be formed by forming the lowermost layer or the lower layer of the selective growth mask layer on the GaN substrate 11, and performing patterning. Then, following that, a residual portion of the selective growth mask layer may just be formed on the lowermost layer or the lower layer of the selective growth mask layer. Alternatively, in the seventh embodiment, the non-crystal growth layers 55B and the flat portion 55A made of an extending portion of a thermal expansion mitigating film 44 may be formed by forming the thermal expansion mitigating film 44 that configures a lowermost layer of the selective growth mask layer 43 on the GaN substrate 11, and performing patterning. Then, following that, the residual portion of the selective growth mask layer may just be formed on the thermal expansion mitigating film 44.

Eleventh Embodiment

Figure 25:
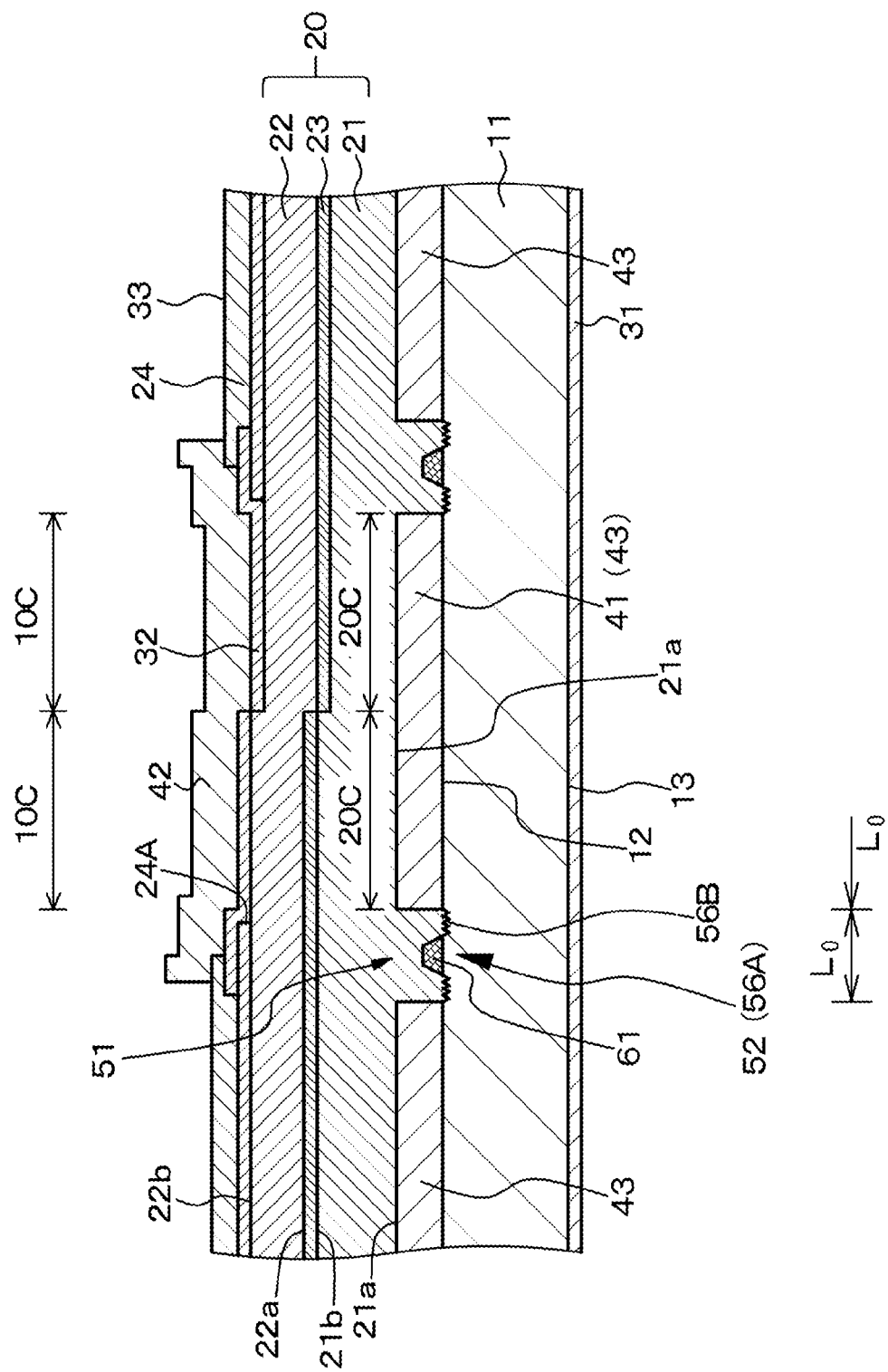
FIG. 25 is a schematic partial sectional view of a light emitting element of an eleventh embodiment.
Figure 26:
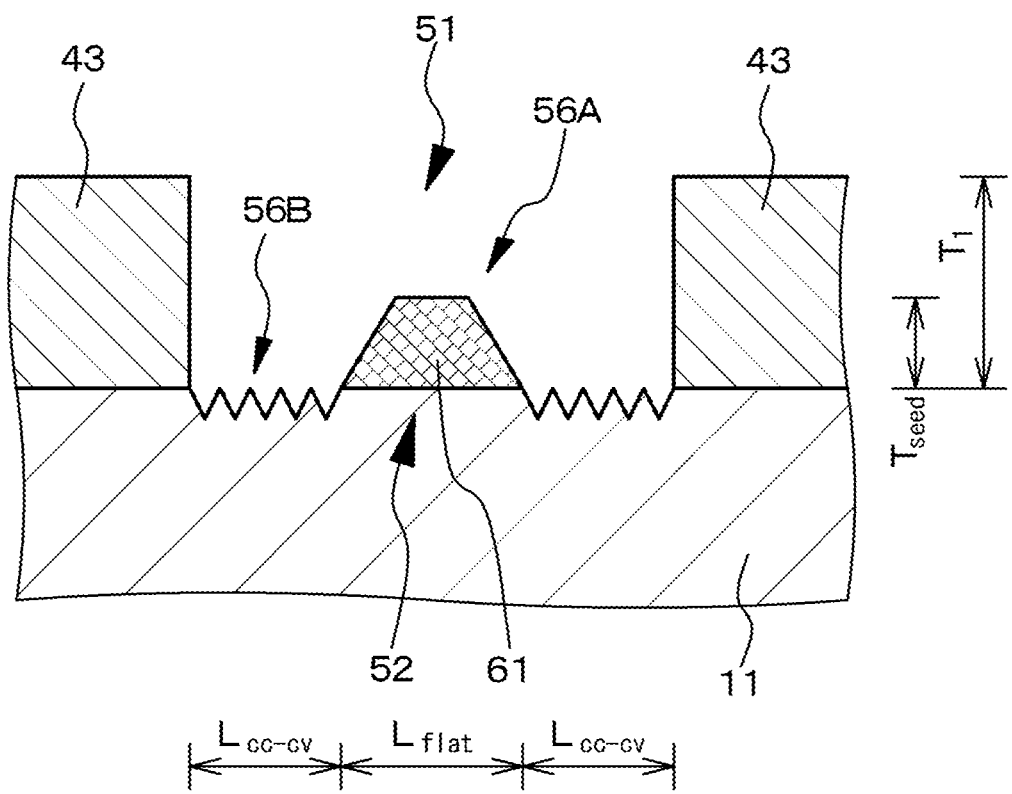
FIG. 26 is a schematic enlarged partial end view of a selective growth mask layer opening area and the like in the light emitting element of the eleventh embodiment.

An eleventh embodiment is also a modification of the eighth embodiment. As illustrated in a schematic partial sectional view in FIG. 25, and in a schematic enlarged partial end view of a selective growth mask layer opening area and the like in FIG. 26, in a light emitting element of the eleventh embodiment, a section shape of an exposed surface of a GaN substrate 11, the exposed surface being positioned in a bottom portion of a selective growth mask layer opening area 51 when the light emitting element is cut in a virtual vertical plane, is a shape in which an uneven portion 56B, a flat portion 56A, and an uneven portion 56B are arranged side by side in that order, and a seed crystal layer growing area 52 is configured from the flat portion 56A. That is, this flat portion 56A corresponds to a part of the exposed surface of the GaN substrate 11. A seed crystal is less easily generated on the uneven portions 56B. Then, $$0.2 \leq L_{flat}/(L_{flat}+L_{cc-cv}) \leq 0.9$$

is satisfied, where the length of the flat portion 56A in the virtual vertical plane is $L_{flat}$, and the total length of the uneven portions 56B is $L_{cc-cv}$. To be specific, $$L_{flat}/(L_{flat}+L_{cc-cv})=0.7$$

is satisfied. The number of the flat portions 56A in the exposed surface portion of the GaN substrate, the exposed surface portion being positioned in the bottom portion of the selective growth mask layer opening area 51, may be two or more.

To be specific, in the eleventh embodiment, an etching mask is formed on the selective growth mask layer opening area 51 is formed on the basis of a known method, and the flat portion 56A in the selective growth mask layer opening area 51 is coated with the etching mask. The portion of the GaN substrate 11, where the uneven portions 56B are to be formed, remains exposed. Then, after the portion of the GaN substrate 11, where the uneven portions 56B are to be formed, is etched on the basis of a known method, and the etching mask is removed.

The configuration and structure of the light emitting element of the eleventh embodiment can be similar to the configuration and structure of the light emitting element of the eighth embodiment, except the above points, and a method of manufacturing the light emitting element of the eleventh embodiment can be substantially similar to the method of manufacturing the light emitting element of the eighth embodiment and thus detailed description is omitted.

As described above, the present disclosure has been described on the basis of the favorable embodiments. However, the present disclosure is not limited to these embodiments. The configurations and structures of the light emitting elements described in the embodiments are examples, and can be appropriately changed, and the methods of manufacturing the light emitting element can also appropriately changed. In some cases, a substrate (for example, a sapphire substrate) other than the GaN substrate can be used, and a compound semiconductor other than the GaN-based compound semiconductor can be used. To make the resonator lengths in the light emitting element units different for each of the light emitting element units, the configuration of the resonator length may be changed according to each of the light emitting element units.

The first, second, or fifth embodiment, and the third or fourth embodiment can be combined. To be specific, the resonator length in the light emitting element unit can be made different in every light emitting element unit, or the resonator length can be smoothly changed in the light emitting element, on the basis of a combination of the substrate with the surface formed in the step-like shape by forming the first compound semiconductor layer in the first, second, or fifth embodiment, then dry-etching or wet-etching the first compound semiconductor layer, to change the thickness of the first compound semiconductor layer to the step-like shape, and the first compound semiconductor layer having the level difference in the top face. Note that the light emitting element having such a configuration can be applied to other embodiments.

Figure 27:
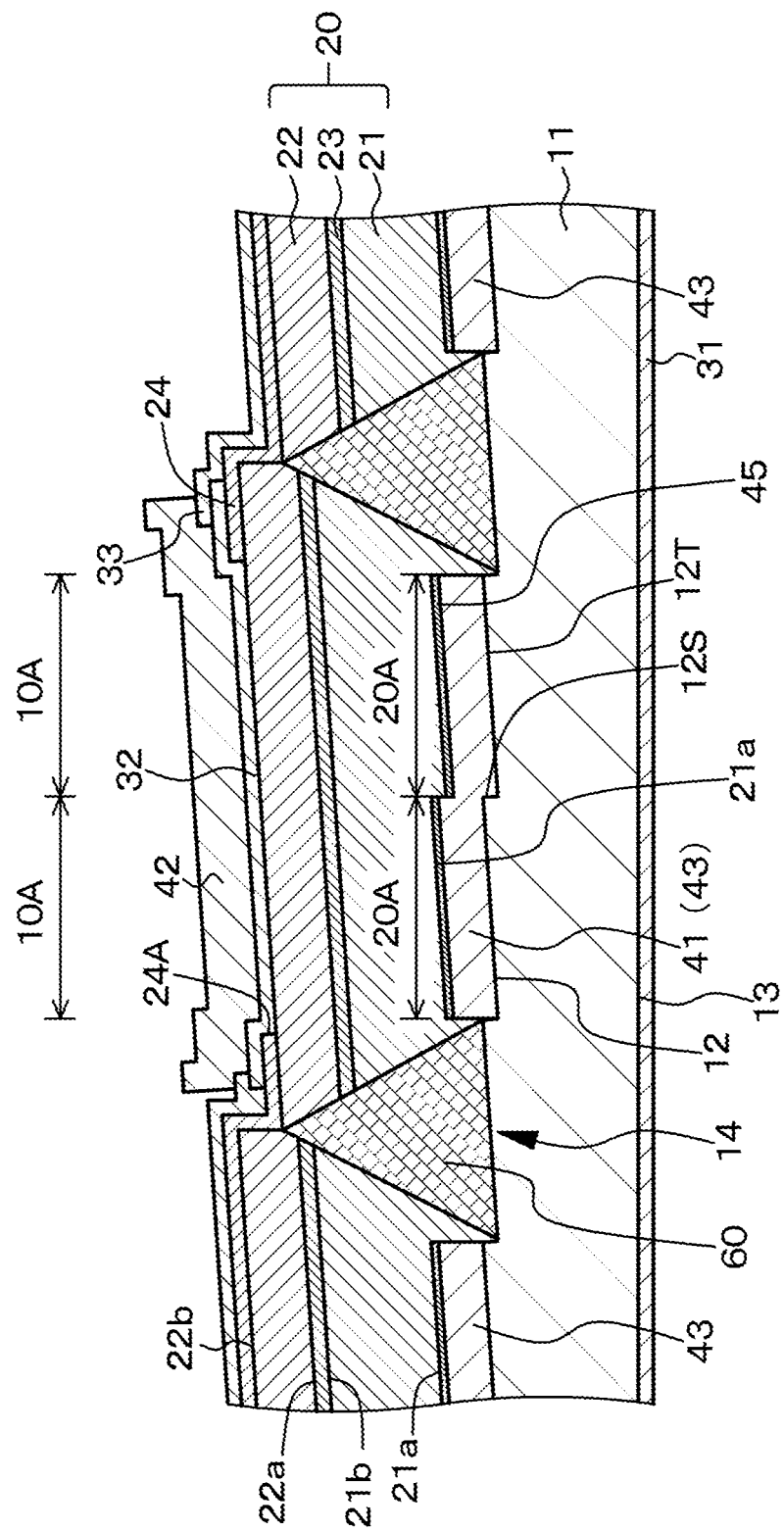
FIG. 27 is a schematic partial sectional view of a modification of the light emitting element of the first embodiment.

In the embodiments, the section shape of the selective growth mask layer 43 has been a square. However, the section shape is not limited to the square, and can be a trapezoid. Further, as a modification example of the light emitting element of the first embodiment, an uppermost layer 45 (the layer being in contact with the first compound semiconductor layer 21) of the first light reflecting layer 41 (selective growth mask layer 43) may be configured from a silicon nitride film, as illustrated in FIG. 27. Then, in this case, it is favorable to satisfy:

$$t_2 = \lambda_0/(4n_2),$$

where the thickness of the uppermost layer 45 of the first light reflecting layer 41 is $t_2$, and a refractive index of the uppermost layer 45 of the first light reflecting layer 41 is $n_2$, and further, if $$t_2 = \lambda_0/(2n_2)$$

is satisfied, the uppermost layer 45 of the first light reflecting layer 41 becomes an absence layer for the light with the wavelength $\lambda_0$.

In a case where the first compound semiconductor layer is formed on the GaN substrate on which the selective growth mask layer has been formed, by lateral direction growth, using a method of epitaxially growing the layer in the lateral direction, such as an epitaxial lateral overgrowth (ELO) method, when the first compound semiconductor layers epitaxially growing from edge portions of the selective growth mask layer toward a central portion of the selective growth mask layer are met, many crystal effects may occur in a met portion. If the met portion where the many crystal defects exist is positioned in a central portion of an element region (described below), the characteristics of the light emitting element may be negatively affected. By employing a configuration in which no area centroid point of the second light reflecting layer exists on a normal line with respect to the first light reflecting layer, the normal line passing through an area centroid point of the first light reflecting layer, or a configuration in which no area centroid point of the active layer exists on the normal line with respect to the first light reflecting layer, the normal line passing through an area centroid point of the first light reflecting layer, occurrence of negative effect to the characteristics of the light emitting element can be reliably suppressed.

Further, in the embodiments, the selective growth mask layer 43 (or the first light reflecting layer 41) is fully coated with the first compound semiconductor layer 21. However, a part of the selective growth mask layer 43 (or the first light reflecting layer 41) may be exposed in a region where the first compound semiconductor layers 21 would be met, or the first compound semiconductor layer 21 on the selective growth mask layer 43 (or the first light reflecting layer 41) may not be fully flat in the region where the first compound semiconductor layers 21 would be met. The light emitting element unit may just be manufactured in a region except the region where the selective growth mask layer 43 (or the first light reflecting layer 41) is exposed, or the region where the first compound semiconductor layer 21 is not fully flat.

Note that the present disclosure can employ configurations below.

[A01]<<Light Emitting Element: First Aspect>>

A light emitting element including at least:

a first light reflecting layer formed on a surface of a substrate;

a laminated structural body made of a first compound semiconductor layer, an active layer, and a second compound semiconductor layer formed on the first light reflecting layer; and a second electrode and a second light reflecting layer formed on the second compound semiconductor layer, wherein the laminated structural body is configured from a plurality of laminated structural body units, a light emitting element unit is configured from each of the laminated structural body units, and a resonator length in the light emitting element unit is different in every light emitting element unit.

[A02]<<Light Emitting Element According to First Configuration>>

The light emitting element according to [A01] or [A02], wherein the surface of the substrate has a step-like shape, and one laminated structural body unit is formed above a portion of the substrate, the portion being equivalent to one tread.

[A03] The light emitting element according to [A02], wherein
a total value of portions of the substrate, the portion being equivalent to a rise, is 40 nm or less.

[A04]<<Light Emitting Element According to Second Configuration>>
The light emitting element according to [A01] or [A02], wherein
a top face of the first compound semiconductor layer has a step-like shape, and
one laminated structural body unit is configured from a portion of the laminated structural body including the top face of the first compound semiconductor layer, the top face being equivalent to one tread.

[A05] The light emitting element according to [A04], wherein
a total value of portions of the first compound semiconductor layer, the portion being equivalent to arise, is 40 nm or less.

[A06]<<Light Emitting Element According to Third Configuration>>
The light emitting element according to any one of [A01] to [A05], wherein
the second electrode and the second light reflecting layer are common in the light emitting element units.

[A07]<<Light Emitting Element According to Fourth Configuration>>
The light emitting element according to any one of [A01] to [A05], wherein
the second electrode and the second light reflecting layer are independently provided in each of the light emitting element units.

[A08] The light emitting element according to [A07], the light emitting element units that output a plurality of types of desired wavelengths, or the light emitting element units having desired characteristics are caused to emit light.

[B01]<<Light Emitting Element: Second Aspect>>
A light emitting element including at least:
a first light reflecting layer formed on a surface of a substrate;
a laminated structural body made of a first compound semiconductor layer, an active layer, and a second compound semiconductor layer formed on the first light reflecting layer; and
a second electrode and a second light reflecting layer formed on the second compound semiconductor layer, wherein
a resonator length is smoothly changed in the light emitting element.

[B02] The light emitting element according to [B01] or [B02], wherein
a difference between a maximum value and a minimum value of the resonator length is 40 nm or less.

[C01] The light emitting element according to any one of [A01] to [B02], wherein
thicknesses of the active layer and the second compound semiconductor layer are constant.

[C02] The light emitting element according to any one of [A01] to [C01], wherein
the first light reflecting layer functions as a selective growth mask layer.

[C03] The light emitting element according to any one of [A01] to [C02], wherein
a top face of the first light reflecting layer has a shape following the surface of the substrate as a whole.

[C04] The light emitting element according to any one of [A01] to [C03], wherein the laminated structural body is made of a GaN-based compound semiconductor.

[C05] The light emitting element according to any one of [A01] to [C04], wherein
a wavelength of emitted light is from 360 to 600 nm, both inclusive.

[C06] The light emitting element according to any one of [A01] to [C05], wherein
a spectral width of output light is further widened as the light emitting element is caused to perform a modulation operation.

"C07" A method of manufacturing a light emitting element according to any one of [A01] to [C06], wherein a plane shape of the first light reflecting layer is a regular hexagon, a circle, a grid shape, or a stripe shape.

[D01]<<Light Emitting Element According to Fifth Configuration>>
The light emitting element according to any one of [A01] to "C07", wherein a thermal expansion mitigating film is formed on the substrate as a lowermost layer of the first compound semiconductor layer.

[D02] The light emitting element according to [D01], wherein the thermal expansion mitigating film is made of at least one type of material selected from a group consisting of silicon nitride, aluminum oxide, niobium oxide, tantalum oxide, titanium oxide, magnesium oxide, zirconium oxide, and aluminum nitride.

[D03] The light emitting element according to [D01] or [D02], wherein $t_1 = \lambda_0/(2n_1)$ is satisfied, where the thickness of the thermal expansion mitigating film is $t_1$, a peak emission wavelength of the light emitting element is $\lambda_0$, and a refractive index of the thermal expansion mitigating film is $n_1$.

[D04] The light emitting element according to any one of [A01] to "C07", wherein a linear thermal expansion coefficient CTE of the lowermost layer of the first compound semiconductor layer, the lowermost layer being in contact with the substrate, satisfies:

$1 \times 10^{-6}/K \leq CTE \leq 1 \times 10^{-5}/K$ favorably, $1 \times 10^{-6}/K < CTE \leq 1 \times 10^{-5}/K$.

[D05] The light emitting element according to [D04], wherein the lowermost layer of the first light reflecting layer is made of at least one type of material selected from a group consisting of silicon nitride, aluminum oxide, niobium oxide, tantalum oxide, titanium oxide, magnesium oxide, zirconium oxide, and aluminum nitride.

[D06] The light emitting element according to [D04] or [D05], wherein $t_1 = \lambda_0/(2n_1)$ is satisfied, where the thickness of the lowermost layer of the first light reflecting layer is $t_1$, a peak emission wavelength of the light emitting element is $\lambda_0$, and a refractive index of the lowermost layer of the first light reflecting layer is $n_1$.

[E01]<<Light Emitting Element According to Sixth Configuration>>
The light emitting element according to any one of [A01] to [D06], wherein
a plurality of the selective growth mask layers is included,
the first light reflecting layer is made of one of the plurality of selective growth mask layers, a seed crystal layer growing area configured from a part of an exposed surface of the substrate is provided in a bottom portion of a selective growth mask layer opening area positioned between the selective growth mask layer and the selective growth mask layer, a seed crystal layer is formed on the seed crystal layer growing area, the first compound semiconductor layer is formed from the seed crystal layer on the basis of lateral direction epitaxial growth, and the thickness of the seed crystal layer is thinner than the thickness of the selective growth mask layer.

[E02] The light emitting element according to [E01], wherein $$0.1 \le T_{seed}/T_1 < 1$$

is satisfied, where the thickness of the seed crystal layer is $T_{seed}$, and the thickness of the selective growth mask layer is $T_1$.

[E03] The light emitting element according to [E01] or [E02], wherein an uneven portion is formed in the exposed surface of the substrate, the exposed surface being positioned in the bottom portion of the selective growth mask layer opening area positioned between the selective growth mask layer and the selective growth mask layer, and the seed crystal layer growing area is configured from a protruding portion.

[E04] The light emitting element according to [E03], wherein a section shape of the exposed surface of the substrate, the exposed surface being positioned in the bottom portion of the selective growth mask layer opening area, when the light emitting element is cut in a virtual vertical plane including two normal lines passing through a central point of two adjacent selective growth mask layers, is a shape in which a recessed portion, the protruding portion, and a recessed portion are arranged side by side in this order, and the seed crystal layer growing area is configured from a top face of the protruding portion.

[E05] The light emitting element according to [E04], wherein $$0.2 \le L_{cv}/(L_{cv}+L_{cc}) \le 0.9$$

is satisfied, where the length of the protruding portion in the virtual vertical plane is $L_{cv}$, and the total length of the recessed portions is $L_{cc}$.

[E06] The light emitting element according to [E01] or [E02], wherein an uneven portion is formed in the exposed surface of the substrate, the exposed surface being positioned in the bottom portion of the selective growth mask layer opening area positioned between the selective growth mask layer and the selective growth mask layer, and the seed crystal layer growing area is configured from the recessed portion.

[E07] The light emitting element according to [E06], wherein a section shape of the exposed surface of the substrate, the exposed surface being positioned in the bottom portion of the selective growth mask layer opening area, when the light emitting element is cut in a virtual vertical plane including two normal lines passing through a central point of two adjacent selective growth mask layers, is a shape in which a protruding portion, the recessed portion, and a protruding portion are arranged side by side in this order, and the seed crystal layer growing area is configured from a bottom surface of the recessed portion.

[E08] The light emitting element according to [E07], wherein $$0.2 \le L_{cc}/(L_{cv}+L_{cc}) \le 0.9$$

is satisfied, where the length of the recessed portion in the virtual vertical plane is $L_{cc}$, and the total length of the protruding portions is $L_{cv}$.

[E09] The Light emitting element according to [E01] or [E02], wherein a section shape of the exposed surface of the substrate, the exposed surface being positioned in the bottom portion of the selective growth mask layer opening area, when the light emitting element is cut in a virtual vertical plane including two normal lines passing through a central point of two adjacent selective growth mask layers, is a shape in which a non-crystal growth layer, a flat portion, and a non-crystal growth layer are arranged side by side in this order, and the seed crystal layer growing area is configured from the flat portion.

[E10] The light emitting element according to [E09], wherein $$0.2 \le L_{flat}/(L_{flat}+L_{no}) \le 0.9$$

is satisfied, where the length of the flat portion in the virtual vertical plane is $L_{flat}$, and the total length of the non-crystal growth layers is $L_{nov}$.

[E11] The light emitting element according to [E01] or [E02], wherein a section shape of the exposed surface of the substrate, the exposed surface being positioned in the bottom portion of the selective growth mask layer opening area, when the light emitting element is cut in a virtual vertical plane including two normal lines passing through a central point of two adjacent selective growth mask layers, is a shape in which an uneven portion, a flat portion, and an uneven portion are arranged side by side in this order, and the seed crystal layer growing area is configured from the flat portion.

[E12] The light emitting element according to [E11], wherein $$0.2 \le L_{flat}/(L_{flat}+L_{cc\text{-}cv}) \le 0.9$$

is satisfied, where the length of the flat portion in the virtual vertical plane is $L_{flat}$, and the total length of the uneven portions is $L_{cc\text{-}cv}$.

[E13] The light emitting element according to any one of [E01] to [E12], wherein a section shape of the seed crystal layer is an isosceles triangle, an isosceles trapezoid, or a square.

[E14] The light emitting element according to any one of [E01] to [E13], wherein $$D_1/D_0 \le 0.2$$

is satisfied, where the length of the selective growth mask layer opening area of when the light emitting element is cut in the virtual vertical plane including two normal lines passing through a central point of adjacent two selective growth mask layers is $L_0$, transition density in a region of the first compound semiconductor layer positioned above the selective growth mask layer opening area in the virtual vertical plane is $D_0$, and transition density in a region of the first compound semiconductor layer from an edge of the selective growth mask layer to a distance $L_0$ in the virtual vertical plane is $D_1$.

[F01]<<Method of Manufacturing Semiconductor Device: First Aspect>>

A method of manufacturing a light emitting element including at least the processes:

forming, on a substrate, a first light reflecting layer made of a multilayer film, and adapted to function as a selective growth mask layer, then selectively growing a first compound semiconductor layer from a surface of the substrate, the surface being not coated with the first light reflecting layer, and coating the substrate and the first light reflecting layer with the first compound semiconductor layer, and then sequentially forming an active layer, a second compound semiconductor layer, a second electrode, and a second light reflecting layer on the first compound semiconductor layer, wherein a laminated structural body made of the first compound semiconductor layer, the active layer, and the second compound semiconductor layer is configured from a plurality of laminated structural body units, and a light emitting element unit is configured from each of the laminated structural body units, a resonator length in the light emitting element unit is different in every light emitting element unit, the surface of the substrate has a step-like shape, and one laminated structural body unit is formed above a portion of the substrate, the portion being equivalent to one tread.

[F02] The method of manufacturing a light emitting element according to [F01] or [F02], wherein a total value of portions of the substrate, the portion being equivalent to a rise, is 40 nm or less.

[G01]<<Method of Manufacturing Semiconductor Device: Second Aspect>>

A method of manufacturing a light emitting element including at least the processes:

forming, on a substrate, a first light reflecting layer made of a multilayer film, and adapted to function as a selective growth mask layer, then selectively growing a first compound semiconductor layer from a surface of the substrate, the surface being not coated with the first light reflecting layer, and coating the substrate and the first light reflecting layer with the first compound semiconductor layer, and then sequentially forming an active layer, a second compound semiconductor layer, a second electrode, and a second light reflecting layer on the first compound semiconductor layer, wherein a laminated structural body made of the first compound semiconductor layer, the active layer, and the second compound semiconductor layer is configured from a plurality of laminated structural body units, and a light emitting element unit is configured from each of the laminated structural body units, a resonator length in the light emitting element unit is different in every light emitting element unit, a top face of the first compound semiconductor layer has a step-like shape, and one laminated structural body unit is configured from a portion of the laminated structural body including a top face of the first compound semiconductor layer, the fop face being equivalent to one tread.

[G02] The method of manufacturing a light emitting element according to [G01], wherein a total value of portions of the first compound semiconductor layer, the portion being equivalent to a rise, is 40 nm or less.

[H01] The method of manufacturing a light emitting element according to any one of [F01] to [G02], wherein the second electrode and the second light reflecting layer are common in the light emitting element units.

[H02] The method of manufacturing a light emitting element according to any one of [F01] to [G02], wherein the second electrode and the second light reflecting layer are independently provided in the light emitting element units.

[H03] The method of manufacturing a light emitting element according to [H02], wherein the light emitting element units that output a plurality of types of desired wavelengths or the light emitting element units that have desired characteristics are caused to emit light.

[J01]<<Method of Manufacturing Light Emitting Element: Third Aspect>>

A method of manufacturing a light emitting element including at least the processes:

forming, on a substrate, a first light reflecting layer made of a multilayer film, and adapted to function as a selective growth mask layer, then selectively growing a first compound semiconductor layer from a surface of the substrate, the surface being not coated with the first light reflecting layer, and coating the substrate and the first light reflecting layer with the first compound semiconductor layer, and then sequentially forming an active layer, a second compound semiconductor layer, a second electrode, and a second light reflecting layer on the first compound semiconductor layer, wherein the thickness of a laminated structural body made of the first compound semiconductor layer, the active layer, and the second compound semiconductor layer is smoothly changed by etching the surface of the substrate or a top face of the first compound semiconductor layer.

[J02] The method of manufacturing a light emitting element according to [J01] or [J02], wherein a difference between a maximum value and a minimum value of the thickness of the laminated structural body is 40 nm or less.

[K01] The method of manufacturing a light emitting element according to any one of [F01] to [J02], wherein the thicknesses of the active layer and the second compound semiconductor layer are constant.

[K02] The method of manufacturing a light emitting element according to any one of [F01] to [K01], wherein a top face of the first light reflecting layer has a shape following the surface of the substrate as a whole.

[K03] The method of manufacturing a light emitting element according to any one of [F01] to [K02], wherein the laminated structural body is made of a GaN-based compound semiconductor.

[K04] The method of manufacturing a light emitting element according to any one of [F01] to [K03], wherein a wavelength of emitted light is from 360 to 600 nm, both inclusive.

[K05] The method of manufacturing a light emitting element according to any one of [F01] to [K04], wherein a spectral width of output light is further widened as the light emitting element is caused to perform a modulation operation.

"K06] The method of manufacturing a light emitting element according to anyone of [F01] to [K05], wherein a planar shape of the first light reflecting layer is a regular hexagon, a circle, a grid shape, or a stripe shape.

[L01] The method of manufacturing a light emitting element according to any one of [F01] to [K06], wherein a thermal expansion mitigating film is formed on the substrate as a lowermost layer of the first light reflecting layer.

[L02] The method of manufacturing a light emitting element according to [L01], wherein the thermal expansion mitigating film is made of at least one type of material selected from a group consisting of silicon nitride, aluminum oxide, niobium oxide, tantalum oxide, titanium oxide, magnesium oxide, zirconium oxide, and aluminum nitride.

[L03] The method of manufacturing a light emitting element according to [L01] or [L02], wherein $$t_1 = \lambda_0/(2n_1)$$

is satisfied, where the thickness of the thermal expansion mitigating film is $t_1$, a peak emission wavelength of the light emitting element is $\lambda_0$, and a refractive index of the thermal expansion mitigating film is $n_1$.

[L04] The method of manufacturing a light emitting element according to any one of [F01] to [K06], wherein a linear thermal expansion coefficient CTE of a lowermost layer of the first light reflecting layer, the lowermost layer being in contact with the substrate, satisfies:

$$1 \times 10^{-6}/K \leq CTE \leq 1 \times 10^{-5}/K,$$

and favorably, $$1 \times 10^{-6}/K < CTE \leq 1 \times 10^{-5}/K.$$

[L05] The method of manufacturing a light emitting element according to [L04], wherein the lowermost layer of the first light reflecting layer is made of at least one type of material selected from a group consisting of silicon nitride, aluminum oxide, niobium oxide, tantalum oxide, titanium oxide, magnesium oxide, zirconium oxide, and aluminum nitride.

[L06] The method of manufacturing a light emitting element according to [L04] or [L05], wherein $$t_1 = \lambda_0/(2n_1)$$

is satisfied, where the thickness of the lowermost layer of the first light reflecting layer is $t_1$, the peak emission wavelength of the light emitting element is $\lambda_0$, and the refractive index of a lowermost layer of the selective growth mask layer is $n_1$.

[L07] The method of manufacturing a light emitting element according to any one of [F01] to [L06], wherein after an active layer, a second compound semiconductor layer, a second electrode, and a second light reflecting layer are sequentially formed on a first compound semiconductor layer, the substrate is removed using the first light reflecting layer as a stopper layer.

[M01] The method of manufacturing a light emitting element according to any one of [F01] to [L07], forming a plurality of selective growth mask layers provided on the substrate separately from one another, and one of the selective growth mask layers functioning as the first light reflecting layer, and forming a seed crystal layer growing area in a part of a surface of a portion of the substrate, the portion being exposed to a bottom portion of a selective growth mask layer opening area positioned between the selective growth mask layer and the selective growth mask layer, then forming, on the seed crystal layer growing area, a seed crystal layer thinner than the selective growth mask layer, and then selectively growing the first compound semiconductor layer from the seed crystal layer on the basis of lateral direction epitaxial growth to coat the substrate and the first light reflecting layer with the first compound semiconductor layer.

[M02] The method of manufacturing a light emitting element according to [M01], wherein $$0.1 \leq T_{seed}/T_1 < 1$$

is satisfied, where the thickness of the seed crystal layer is $T_{seed}$, and the thickness of the selective growth mask layer is $T_1$.

[M03] The method of manufacturing a light emitting element according to [M01] or [M02], wherein an uneven portion is formed in the exposed surface of the substrate, the exposed surface being positioned in the bottom portion of the selective growth mask layer opening area positioned between the selective growth mask layer and the selective growth mask layer, and the seed crystal layer growing area is configured from a protruding portion.

[M04] The method of manufacturing a light emitting element according to [M03], wherein a section shape of the exposed surface of the substrate, the exposed surface being positioned in the bottom portion of the selective growth mask layer opening area, when the light emitting element is cut in a virtual vertical plane including two normal lines passing through a central point of two adjacent selective growth mask layers, is a shape in which a recessed portion, the protruding portion, and a recessed portion are arranged side by side in this order, and the seed crystal layer growing area is configured from a top face of the protruding portion.

[M05] The method of manufacturing a light emitting element according to [M04], wherein $$0.2 \leq L_{cv}/(L_{cv}+L_{cc}) \leq 0.9$$

is satisfied, where the length of the protruding portion in the virtual vertical plane is $L_{cv}$, and the total length of the recessed portions is $L_{cc}$.

[M06] The method of manufacturing a light emitting element according to [M01] or [M02], wherein an uneven portion is formed in the exposed surface of the substrate, the exposed surface being positioned in the bottom portion of the selective growth mask layer opening area positioned between the selective growth mask layer and the selective growth mask layer, and the seed crystal layer growing area is configured from a recessed portion.

[M07] The method of manufacturing a light emitting element according to [M06], wherein a section shape of the exposed surface of the substrate, the exposed surface being positioned in the bottom portion of the selective growth mask layer opening area, when the light emitting element is cut in a virtual vertical plane including two normal lines passing through a central point of two adjacent selective growth mask layers, is a shape in which a protruding portion, the recessed portion, and a protruding portion are arranged side by side in this order, and the seed crystal layer growing area is configured from a bottom surface of the recessed portion.

[M08] The method of manufacturing a light emitting element according to [M07], wherein $$0.2 \leq L_{cc}/(L_{cv}+L_{cc}) \leq 0.9$$

is satisfied, where the length of the recessed portion in the virtual vertical plane is $L_{cc}$, and the total length of the protruding portions is $L_{cv}$.

[M09] The method of manufacturing the light emitting element according to [M01] or [M02], wherein a section shape of the exposed surface of the substrate, the exposed surface being positioned in the bottom portion of the selective growth mask layer opening area, when the light emitting element is cut in a virtual vertical plane including two normal lines passing through a central point of two adjacent selective growth mask layers, is a shape in which a non-crystal growth layer, a flat portion, and a non-crystal growth layer are arranged side by side in this order, and the seed crystal layer growing area is configured from the flat portion.

[M10] The method of manufacturing a light emitting element according to [M09], wherein $$0.2 \le L_{flat}/(L_{flat}+L_{no}) \le 0.9$$

is satisfied, where the length of the flat portion in the virtual vertical plane is $L_{flat}$, and the total length of the non-crystal growth layers is $L_{nov}$.

[M11] The a method of manufacturing a light emitting element according to [M01] or [M02], wherein a section shape of the exposed surface of the substrate, the exposed surface being positioned in the bottom portion of the selective growth mask layer opening area, when the light emitting element is cut in a virtual vertical plane including two normal lines passing through a central point of two adjacent selective growth mask layers, is a shape in which an uneven portion, a flat portion, and an uneven portion are arranged side by side in this order, and the seed crystal layer growing area is configured from the flat portion.

[M12] The a method of manufacturing a light emitting element according to [M11], wherein $$0.2 \le L_{flat}/(L_{flat}+L_{cc-cv}) \le 0.9$$

is satisfied, where the length of the flat portion in the virtual vertical plane is $L_{flat}$, and the total length of the uneven portions is $L_{cc-cv}$.

[M13] The method of manufacturing a light emitting element according to any one of [M01] to [M12], wherein a section shape of the seed crystal layer is an isosceles triangle, an isosceles trapezoid, or a square.

[M14] The method of manufacturing a light emitting element according to any one of [M01] to [M13], wherein $$D_1/D_0 \le 0.2$$

is satisfied, where the length of the selective growth mask layer opening area of when the light emitting element is cut in the virtual vertical plane including two normal lines passing through a central point of adjacent two selective growth mask layers is $L_0$, transition density in a region of the first compound semiconductor layer positioned above the selective growth mask layer opening area in the virtual vertical plane is $D_0$, and transition density in a region of the first compound semiconductor layer from an edge of the selective growth mask layer to a distance $L_0$ in the virtual vertical plane is $D_1$.

REFERENCE SIGNS LIST 10A, 10B, 10C, and 10D Light emitting element unit
11 GaN substrate
12 Surface of GaN substrate
12T Portion (terrace) equivalent to tread, of GaN substrate
12S Portion (step) equivalent to rise, of GaN substrate
13 Back surface opposing to surface of GaN substrate
14 Crystal growth start region
20 Laminated structural body
20A, 20B, 20C, and 20D Laminated structural body unit
21 First compound semiconductor layer
21S Portion equivalent to rise, of first compound semiconductor layer
21a First plane of first compound semiconductor layer
21b Second plane of first compound semiconductor layer
22 Second compound semiconductor layer
22a First plane of second compound semiconductor layer
22b Second plane of second compound semiconductor layer
23 Active layer (light emitting layer)
24 Current constricting layer
24A Opening provided in current constricting layer
25 Bonding layer
26 Support substrate
31 First electrode
32 Second electrode
33 Pad electrode
41 First light reflecting layer
42 Second light reflecting layer
43 Selective growth mask layer
44 Thermal expansion mitigating film
45 Uppermost layer of first light reflecting layer (selective growth mask layer)
51 Selective growth mask layer opening area
52 Seed crystal layer growing area
53 and 54 Uneven portion
53A and 54A Protruding portion
53B and 54B Recessed portion
55A Flat portion
55B Non-crystal growth layer
56A Flat portion
56B Uneven portion
60 and 61 Seed crystal layer
62 Seed crystal
63 Transition

The invention claimed is:

1. A light emitting element comprising at least:
a first light reflecting layer formed on a surface of a substrate;
a laminated structural body made of a first compound semiconductor layer, an active layer, and a second compound semiconductor layer formed on the first light reflecting layer; and
a second electrode and a second light reflecting layer formed on the second compound semiconductor layer, wherein
the laminated structural body is configured from a plurality of laminated structural body units,
a light emitting element unit is configured from each of the laminated structural body units,
the surface of the substrate has a step-like shape,
one laminated structural body unit is formed above a portion of the substrate, the portion being equivalent to one tread, and
a resonator length in the light emitting element unit is different in every light emitting element unit.

2. The light emitting element according to claim 1, wherein
a total value of portions of the substrate, the portion being equivalent to a rise, is 40 nm or less.

3. The light emitting element according to claim 1, wherein
the second electrode and the second light reflecting layer are common in the light emitting element units.

4. The light emitting element according to claim 1, wherein
the second electrode and the second light reflecting layer are independently provided in each of the light emitting element units.

5. The light emitting element according to claim 4, wherein
the light emitting element units that emit a plurality of types of desired wavelengths are caused to emit light.

6. The light emitting element according to claim 1, wherein
thicknesses of the active layer and the second compound semiconductor layer are constant.

7. The light emitting element according to claim 1, wherein
a top face of the first light reflecting layer has a shape following the surface of the substrate as a whole.

8. The light emitting element according to claim 1, wherein
the laminated structural body is made of a GaN-based compound semiconductor.

9. The light emitting element according to claim 1, wherein
a wavelength of emitted light is from 360 to 600 nm, both inclusive.

10. The light emitting element according to claim 1, wherein
a spectral width of output light is further widened as the light emitting element is caused to perform a modulation operation.

11. A light emitting element comprising at least:
a first light reflecting layer formed on a surface of a substrate;
a laminated structural body made of a first compound semiconductor layer, an active layer, and a second compound semiconductor layer formed on the first light reflecting layer; and
a second electrode and a second light reflecting layer formed on the second compound semiconductor layer, wherein
the laminated structural body is configured from a plurality of laminated structural body units,
a light emitting element unit is configured from each of the laminated structural body units,
a top face of the first compound semiconductor layer has a step-like shape,
one laminated structural body unit is configured from a portion of the laminated structural body including the top face of the first compound semiconductor layer, the top face being equivalent to one tread, and
a resonator length in the light emitting element unit is different in every light emitting element unit.

12. The light emitting element according to claim 11, wherein
a total value of portions of the first compound semiconductor layer, the portion being equivalent to a rise, is 40 nm or less.

13. A light emitting element comprising at least:
a first light reflecting layer formed on a smooth surface of a substrate having an off angle with respect to a crystal plane of the substrate;
a laminated structural body made of a first compound semiconductor layer, an active layer, and a second compound semiconductor layer formed on the first light reflecting layer; and
a second electrode and a second light reflecting layer formed on the second compound semiconductor layer, wherein
a thickness of the first compound semiconductor layer is smoothly increased in the light emitting element in a direction parallel with a surface of the substrate.

14. The light emitting element according to claim 13, wherein
a difference between a maximum value and a minimum value of a thickness of the laminated structural body is 40 nm or less.

* * * * *